(12) United States Patent
Ikeda et al.

(10) Patent No.: US 8,067,772 B2
(45) Date of Patent: *Nov. 29, 2011

(54) SEMICONDUCTOR DEVICE AND MANUFACTURING METHOD THEREOF

(75) Inventors: Kazuko Ikeda, Kanagawa (JP); Shinya Sasagawa, Kanagawa (JP); Hideomi Suzawa, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 259 days.

This patent is subject to a terminal disclaimer.

(21) Appl. No.: 11/949,186

(22) Filed: Dec. 3, 2007

(65) Prior Publication Data
US 2008/0128703 A1    Jun. 5, 2008

(30) Foreign Application Priority Data
Dec. 5, 2006 (JP) ................................. 2006-327833

(51) Int. Cl.
*H01L 29/04* (2006.01)
(52) U.S. Cl. ............... 257/59; 257/66; 257/69; 257/72; 257/350; 257/E27.111; 257/E29.278
(58) Field of Classification Search .............. 257/59, 257/66, 69, 72, 350, E29.278, E27.111
See application file for complete search history.

(56) References Cited

U.S. PATENT DOCUMENTS

| | | | |
|---|---|---|---|
| 5,650,339 A | 7/1997 | Saito et al. | |
| 5,652,453 A | 7/1997 | Iwamatsu et al. | |
| 5,773,330 A | 6/1998 | Park | |
| 5,989,998 A | 11/1999 | Sugahara et al. | |
| 6,030,873 A | 2/2000 | Iwamatsu et al. | |
| 6,087,698 A | 7/2000 | Saito et al. | |
| 6,100,558 A * | 8/2000 | Krivokapic et al. | 257/310 |
| 6,104,065 A | 8/2000 | Park | |
| 6,388,291 B1 | 5/2002 | Zhang et al. | |
| 6,433,361 B1 | 8/2002 | Zhang et al. | |
| 6,555,843 B1 | 4/2003 | Yamazaki et al. | |

(Continued)

FOREIGN PATENT DOCUMENTS

EP     0 532 314 A1    3/1993

(Continued)

OTHER PUBLICATIONS

Office Action re Chinese application No. CN 200710196482.2, dated Mar. 9, 2011 (with English translation).

*Primary Examiner* — Long Tran
(74) *Attorney, Agent, or Firm* — Husch Blackwell LLP

(57) ABSTRACT

An object is to provide a semiconductor device with improved reliability and for which a defect due to an end portion of a semiconductor layer provided in an island-shape is prevented, and a manufacturing method thereof. A structure includes an island-shaped semiconductor layer provided over a substrate, an insulating layer provided over a top surface and a side surface of the island-shaped semiconductor layer, and a gate electrode provided over the island-shaped semiconductor layer with the insulating layer interposed therebetween. In the insulating layer provided to be in contact with the island-shaped semiconductor layer, a region that is in contact with the side surface of the island-shaped semiconductor layer is made to have a lower dielectric constant than a region over the top surface of the island-shaped semiconductor layer.

24 Claims, 27 Drawing Sheets

U.S. PATENT DOCUMENTS

| | | |
|---|---|---|
| 6,558,756 B2 | 5/2003 | Sugahara et al. |
| 6,559,548 B1 | 5/2003 | Matsunaga et al. |
| 6,864,583 B2 | 3/2005 | Matsunaga et al. |
| 6,876,039 B2 | 4/2005 | Okihara |
| 7,060,323 B2 | 6/2006 | Sugahara et al. |
| 7,115,903 B2 * | 10/2006 | Isobe et al. ............ 257/59 |
| 7,183,211 B2 | 2/2007 | Konno et al. |
| 2003/0096462 A1 | 5/2003 | Tanabe |
| 2004/0026696 A1 | 2/2004 | Yamazaki et al. |
| 2004/0206956 A1 * | 10/2004 | Yanai et al. ............ 257/59 |
| 2005/0116305 A1 | 6/2005 | Hwang et al. |
| 2007/0034871 A1 | 2/2007 | Itoh et al. |
| 2007/0123035 A1 * | 5/2007 | Sugimoto et al. ........ 438/636 |
| 2007/0252179 A1 | 11/2007 | Isobe et al. |
| 2007/0281400 A1 | 12/2007 | Yamazaki et al. |
| 2008/0128808 A1 | 6/2008 | Yamazaki et al. |
| 2008/0132066 A1 * | 6/2008 | Phan et al. ............ 438/672 |

FOREIGN PATENT DOCUMENTS

| | | | |
|---|---|---|---|
| EP | 0 826 791 | A2 | 3/1998 |
| EP | 1 050 599 | A2 | 11/2000 |
| EP | 1 182 275 | A2 | 2/2002 |
| EP | 0 826 791 | B1 | 4/2002 |
| EP | 1 207 217 | A1 | 5/2002 |
| EP | 1 333 476 | A2 | 8/2003 |
| EP | 1 182 275 | B1 | 2/2004 |
| EP | 1 050 599 | B1 | 6/2004 |
| EP | 1 207 217 | B1 | 11/2004 |
| EP | 1 536 482 | A1 | 6/2005 |
| JP | 59-150469 | | 8/1984 |
| JP | 7-176753 | | 7/1995 |
| JP | 8-18055 | | 1/1996 |
| JP | 8-335702 | | 12/1996 |
| JP | 9-23010 | | 1/1997 |
| JP | 11-258636 | | 9/1999 |
| JP | 2005-19859 | | 1/2005 |
| JP | 2005-167207 | | 6/2005 |

* cited by examiner

PRIOR ART

2180

2180

2180

2180

2180

2180

2180

2180

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

In recent years, manufacturing of semiconductor devices, in which thin film transistors are formed over substrates of glass or the like having insulating surfaces and these thin film transistors are utilized as switching elements or the like, has been actively pursued. For these thin film transistors, island-shaped semiconductor layers are formed over a substrate having an insulating surface, and a part of the island-shaped semiconductor layers are utilized as channel forming regions (for example, see Patent Document 1: Japanese Published Patent Application No. H11-258636).

Pattern diagrams of a general thin film transistor are FIGS. 12A to 12C. FIG. 12A is a top diagram of the thin film transistor, FIG. 12B is a cross-sectional diagram along a dashed line O-P, and FIG. 12C is a cross-sectional diagram along a dashed line Q-R. Note that in FIG. 12A, a thin film and the like included in the thin film transistor are partially omitted.

In a thin film transistor, an island-shaped semiconductor layer 9006 is provided over a substrate 9000 with a base insulating layer 9002 therebetween. Over the semiconductor layer 9006, a conductive layer 9012 that functions as a gate electrode is formed, with a gate insulating layer 9004 interposed therebetween. Further, the semiconductor layer 9006 includes a channel formation region 9008 which is formed in a region overlapping with the conductive layer 9012 with the gate insulating layer 9004 interposed therebetween, and a source or drain region 9010.

However, in a thin film transistor including an island-shaped semiconductor layer, there is concern for various defects occurring due to an end portion of the semiconductor layer. For example, in the case of forming the semiconductor layer into an island shape, the end portion of the semiconductor layer forms a step; consequently, coverage of the end portion of the semiconductor layer with a gate insulating layer tends to be poor. For example, as shown by a dashed line 9007 in FIG. 12B, at the end portion of the semiconductor layer 9006, there is a case where the gate insulating layer 9004 becomes thin locally. In a case where sufficient coverage with the gate insulating layer cannot be performed at the end portion of the semiconductor layer, there is concern for a short circuit occurring between a conductive layer forming a gate electrode and the semiconductor layer, or a leakage current occurring. Particularly in recent years, in order to lower power consumption and to improve operation speed of thin film transistors, reduction in thickness of the gate insulating layer is desired. Consequently, when the gate insulating layer is provided to be thin, coverage defect at an end portion of a semiconductor layer becomes a pronounced problem.

Further, due to an effect of an etching process, a washing process using hydrofluoric acid (HF) or the like, or the like in forming the semiconductor layer into an island shape, an insulating layer provided under the semiconductor layer may become removed. In particular, in the case where the semiconductor layer is made into a thin film, that effect becomes prominent. In this case, as shown by a dashed line 9009 in FIG. 12C, coverage with the gate insulating layer tends to decrease near the end portion of the semiconductor layer 9006.

Further, at the end portion of the island-shape semiconductor layer, particularly at a region where the conductive layer forming the gate electrode overlaps with the semiconductor layer, electric field tends to concentrate at a corner portion (a corner). When an electric field is concentrated, there is a problem that a leaked current occurs due to dielectric breakdown or the like of the gate insulating layer, which is formed between the conductive layer forming the gate electrode and the semiconductor layer. In addition, a coverage defect of the gate insulating layer also leads to electrostatic discharge (ESD) of an element or the gate insulating layer, which becomes a factor in yield reduction in manufacturing semiconductor devices.

SUMMARY OF THE INVENTION

Because of such a problem due to the end portion of the island-shaped semiconductor layer, operating characteristics of a thin film transistor are deteriorated and the reliability is also reduced. Further, yield is also reduced in manufacturing semiconductor devices. The present invention is made in view of the foregoing problems, and an object of the present invention is to provide a semiconductor device having a novel structure with which the reliability is increased, as well as a manufacturing method thereof.

A structure of a semiconductor device of the present invention includes an island-shaped semiconductor layer provided over a substrate; an insulating layer provided over one surface and a side surface of the island-shaped semiconductor layer; and a gate electrode provided over the island-shaped semiconductor layer with the insulating layer interposed therebetween and to cross over the island-shaped semiconductor layer. The insulating layer has a lower dielectric constant in a region that is in contact with the side surface of the island-shaped semiconductor layer than in a region over the one surface of the island-shaped semiconductor layer.

Another structure of a semiconductor device of the present invention includes an island-shaped semiconductor layer provided over a substrate; an insulating layer provided over one surface and a side surface of the island-shaped semiconductor layer; and a gate electrode provided over the island-shaped semiconductor layer with the insulating layer interposed therebetween and to cross over the island-shaped semiconductor layer, and the insulating layer has a lower dielectric constant in a region that is in contact with the side surface of the island-shaped semiconductor layer than in a region over the one surface of the island-shaped semiconductor layer, at least in a region where the insulating layer overlaps with the gate electrode.

Yet another structure of a semiconductor device of the present invention includes an island-shaped semiconductor layer provided over a substrate; an insulating layer provided over one surface and a side surface of the island-shaped semiconductor layer; and a gate electrode provided over the island-shaped semiconductor layer with the insulating layer interposed therebetween and to cross over the island-shaped semiconductor layer, and the insulating layer is thicker in a region that is in contact with the side surface of the island-shaped semiconductor layer than in a region that is in contact with the one surface of the island-shaped semiconductor layer. Further, the insulating layer has a lower dielectric constant in the region that is in contact with the side surface of the island-shaped semiconductor layer than in the region that is in contact with the one surface of the island-shaped semiconductor layer.

Still another structure of a semiconductor device of the present invention includes an island-shaped semiconductor layer provided over a substrate; an insulating layer provided over one surface and a side surface of the island-shaped semiconductor layer; and a gate electrode provided over the island-shaped semiconductor layer with the insulating layer interposed therebetween and to cross over the island-shaped semiconductor layer. Further, at least in a region where the insulating layer overlaps with the gate electrode, the insulating layer is thicker in a region that is in contact with the side surface of the island-shaped semiconductor layer than in a region that is in contact with the one surface of the island-shaped semiconductor layer, and the insulating layer has a lower dielectric constant in the region that is in contact with the side surface of the island-shaped semiconductor layer than in the region that is in contact with the one surface of the island-shaped semiconductor layer.

In the above-described structure, given that the thickness over the one surface of the island-shaped semiconductor layer is t1 and the thickness in the region which is in contact with the side surface of the island-shaped semiconductor layer is t2, it is preferable to satisfy $t1 < t2 \leqq 3t1$.

Further, in the above-described structure, the gate insulating layer provided over the one surface and the side surface of the island-shaped semiconductor layer may be formed of a first insulating layer provided over the one surface of the island-shaped semiconductor layer and a second insulating layer provided over the side surface.

Further, in the above-described structure, the gate insulating layer provided over the one surface and the side surface of the island-shaped semiconductor layer may be formed of a first insulating layer provided over the one surface of the island-shaped semiconductor layer, and a second insulating layer and a third insulating layer provided over the side surface and another side surface of the island-shaped semiconductor layer, respectively.

Further, in the above-described structure, the taper angle of the end portion of the island-shaped semiconductor layer is preferably 45° or more and less than 95°.

One feature of the present invention is a manufacturing method of a semiconductor device in which an island-shaped semiconductor layer is formed over a substrate; a first insulating layer is formed in contact with one surface and a side surface of the island-shaped semiconductor layer; the first insulating layer is selectively removed until the one surface of the island-shaped semiconductor layer is exposed, to form a second insulating layer that is in contact with the side surface of the island-shaped semiconductor layer; a third insulating layer is formed in contact with the one surface of the island-shaped semiconductor layer and the second insulating layer; and a gate electrode layer is formed over the one surface of the island-shaped semiconductor layer with the third insulating layer interposed therebetween and to cross over the island-shaped semiconductor layer.

Another feature of the present invention is a manufacturing method of a semiconductor device in which a first semiconductor layer that is island-shaped is formed over a substrate; a first insulating layer is formed in contact with one surface and a side surface of the first semiconductor layer; the first insulating layer is selectively removed until the one surface of the first semiconductor layer is exposed, to form a second insulating layer that is in contact with the side surface of the first semiconductor layer along with forming an amorphous region in a upper layer of the first semiconductor layer; the amorphous region formed in the first semiconductor layer is removed to form a second semiconductor layer; a third insulating layer is formed in contact with the second semiconductor layer and the second insulating layer; and a gate electrode layer is formed over the one surface of the second semiconductor layer with the third insulating layer interposed therebetween and to cross over the second semiconductor layer.

In addition, in the above-described manufacturing method, after forming the first semiconductor layer with a thickness in the range of 60 nm to 70 nm, the amorphous region may be removed from the first semiconductor layer and the second semiconductor layer may be formed with a thickness in the rage of 20 nm to 30 nm.

Another feature of the present invention is a manufacturing method of a semiconductor device in which a first semiconductor layer that is island-shaped is formed over a substrate; a first insulating layer is formed in contact with one surface and a side surface of the first semiconductor layer; the first semiconductor layer and the first insulating layer are thinned by etching mainly in a vertical direction, to form a second semiconductor layer and a second insulating layer that is in contact with the second semiconductor layer and a side surface thereof; a third insulating layer is formed in contact with the second semiconductor layer and the second insulating layer; and a gate electrode layer is formed over the one surface of the second semiconductor layer with the third insulating layer interposed therebetween and to cross over the second semiconductor layer.

In addition, in the above-described manufacturing method, after the first semiconductor layer is formed with a thickness in the range of 60 nm to 70 nm, the first semiconductor layer may be thinned to form the second semiconductor layer with a thickness in the range of 20 nm to 30 nm.

Further, in the above-described manufacturing method, the island-shaped semiconductor layer is preferably formed such that the taper angle of the end portion is 45° or more and less than 95°.

Furthermore, in the manufacturing method of a semiconductor device of the present invention, a layer with a lower dielectric constant than the third insulating layer is preferably formed for the second insulating layer.

Still further, in the manufacturing method of a semiconductor device of the present invention, the second insulating layer and the third insulating layer are formed as a gate insulating layer.

In addition, in the manufacturing method of a semiconductor device of the present invention, after the gate electrode layer is formed, a heat treatment is preferably performed.

By employing the present invention, defects due to an end portion of a semiconductor layer can be reduced. Therefore, an adverse effect on a semiconductor device due to characteristics of the end portion of the semiconductor layer can be reduced, whereby a semiconductor device in which the reliability is improved can be provided. Further, in manufacturing a semiconductor device, the yield can be improved.

DETAILED DESCRIPTION OF THE INVENTION

Embodiment Mode

Figure 1A:
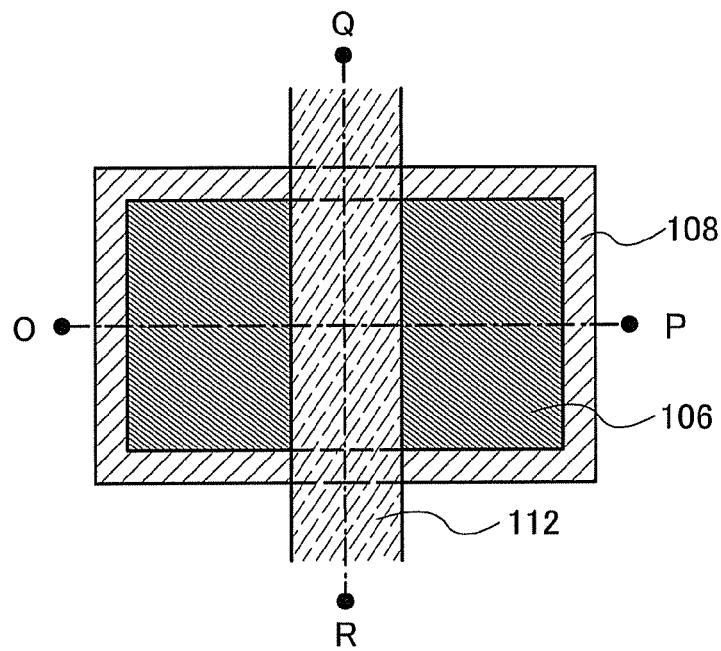
FIGS. 1A to 1C show an example of a main structure of a semiconductor device according to the present invention.

Although the present invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that in structures of the present invention described below, reference numerals denoting the same ones may be used in common throughout the drawings.

Embodiment Mode 1

Figure 1B:
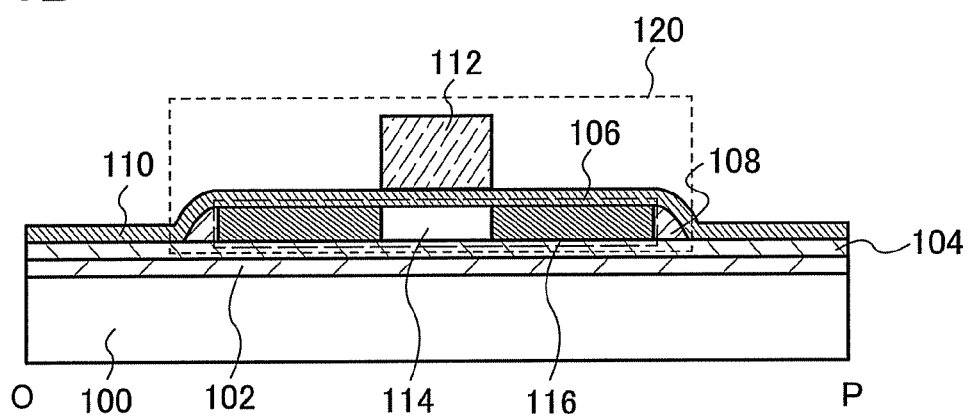
Figure 1C:
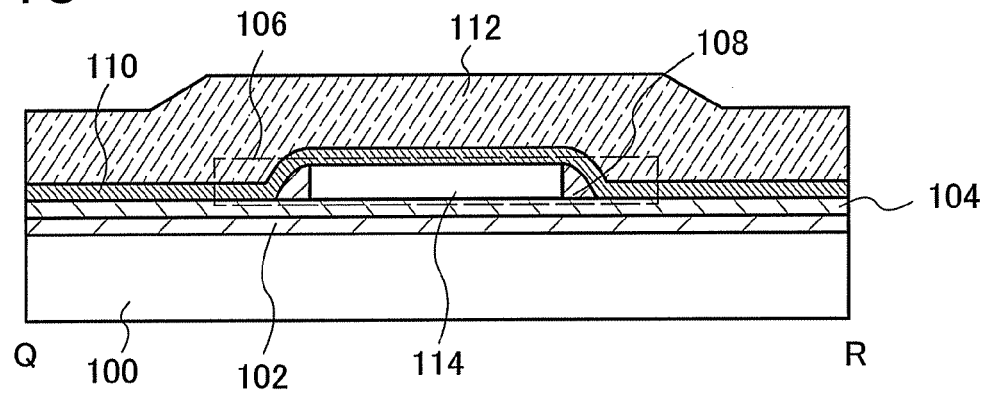

FIG. 1A is a top diagram and FIGS. 1B and 1C are cross-sectional diagrams for describing a main structure of a semiconductor device of the present invention. FIGS. 1A to 1C particularly show a structure of a thin film transistor; FIG. 1A is a top diagram, FIG. 1B is a cross-sectional diagram along a dashed line O-P in FIG. 1A, and FIG. 1C is a cross-sectional diagram along a dashed line Q-R in FIG. 1A. Note that a thin film and the like are partially omitted in FIG. 1A.

A thin film transistor 120 shown in FIG. 1A is provided over a substrate 100 having an insulating surface. The thin film transistor 120 includes a semiconductor layer 106, an insulating layer 108 which is provided so as to be in contact with a side surface of the semiconductor layer 106, an insulating layer 110 which is provided over one surface of the semiconductor layer 106, and a conductive layer 112 which is provided over the semiconductor layer 106 with the insulating layer 110 interposed therebetween.

As the substrate 100, a glass substrate, a quartz substrate, a sapphire substrate, a ceramic substrate, a metal substrate with an insulating layer formed over a surface, or the like can be used.

The semiconductor layer 106 is formed over the substrate 100. Between the substrate 100 and the semiconductor layer 106, an insulating layer 102 and an insulating layer 104 that function as a base insulating layer may be provided. A base insulating layer is a layer that prevents contamination due to diffusion of an impurity such as an alkali metal from the substrate 100 to the semiconductor layer 106, and may be provided appropriately as a blocking layer. In addition, when a surface of the substrate 100 is uneven, the base insulating layer may be provided as a layer for planarization.

Each of the insulating layers 102 and 104 is formed using silicon oxide (SiOx), silicon nitride (SiNx), silicon oxynitride (SiOxNy), silicon nitride oxide (SiNxOy), or the like. In this embodiment mode, although the base insulating layer is a stacked-layer structure of the insulating layers 102 and 104, it is needless to say that the base insulating layer may have a single-layer structure or a stacked-layer structure with three or more layers. For example, when the base insulating layer is to have a stacked-layer structure with two layers, a silicon nitride oxide layer and a silicon oxynitride layer can be formed for the first layer and the second layer, respectively. Alternatively, a silicon nitride layer may be formed for the first layer and a silicon oxide layer may be formed for the second layer.

The semiconductor layer 106 is formed into an island shape. The semiconductor layer 106 is preferably formed of a single-crystalline semiconductor or a polycrystalline semiconductor, and the semiconductor layer 106 can be formed using a variety of semiconductor materials, such as silicon, germanium, or silicon germanium. The semiconductor layer 106 may be formed to a thickness in the range of 10 to 150 nm, preferably a thickness in the range of 30 to 100 nm, or in the range of 10 to 30 nm.

Further, it is preferable to form such that an end portion of the semiconductor layer 106 has an almost vertical shape. Specifically, the taper angle may be 45° or more and less than 95°, and preferably 60° or more and less than 95°. By forming such that the end portion of the semiconductor layer 106 has an almost vertical shape, in the region where the conductive layer 112 that functions as a gate electrode overlaps with the end portion of the semiconductor layer 106, a parasitic channel which is formed through the gate insulating layer which is in contact with the side surface of the semiconductor layer 106, by the end portion of the semiconductor layer 106 and the conductive layer 112 can be reduced. This is because with the almost vertical shape of the end portion of the semiconductor layer 106, an area occupied by the end portion of the semiconductor layer in an area of the whole of the semiconductor layer can be reduced than in the case where the end portion of the semiconductor layer 106 has a gentle taper angle (e.g., an taper angle of 45° or less). Note that a parasitic channel means a channel in a channel formation region that is formed at an end portion of the channel formation region in a direction which is perpendicular to or diagonally crossed with a channel that is formed basically parallel to a direction connecting a source region and a drain region. The parasitic channel leads to occurrence of a leakage current; therefore, preventing a parasitic channel by processing the end portion of the semiconductor layer into an almost vertical shape is very effective for reducing variation in characteristics of a semiconductor device and improving the reliability thereof.

Note that a taper angle means an inclination angle in a layer having a tapered shape, formed by a side surface of the layer and a bottom surface of the layer. The tapered shape may also be gentle such that the end portion of the semiconductor layer 106 has a taper angle of 30° or more and less than 85°, or 45° or more and less than 60°. With a corner portion made gentle by making the end portion of the semiconductor layer 106 a tapered shape, concentration of electric field at the corner portion can be relaxed.

Note that in this specification, an "end portion" of a semiconductor layer means a marginal portion (an edge portion) of an island-shaped semiconductor layer. A "side surface" of a semiconductor layer means a surface of the marginal portion of the semiconductor layer.

The semiconductor layer 106 includes a channel formation region 114 and impurity regions 116 that functions as source and drain regions. In the impurity regions 116, an impurity element which imparts one conductivity type is added. Further, in the channel formation region 114, an impurity element which imparts one conductivity type may be added to control the threshold voltage of a transistor. The channel formation region 114 is formed in the region which almost agrees with the conductive layer 112 with the insulating layer 110 interposed therebetween, and is disposed between the impurity regions 116.

Further, a low-concentration impurity region that functions as an LDD (Lightly Doped Drain) region may be formed in the semiconductor layer 106. The low-concentration impurity region can be formed between the channel formation region and each impurity region that functions as a source or drain region. Further, in the low-concentration impurity region, the impurity concentration is lower than that in the impurity region that functions as a source or drain region.

The insulating layer 108 is formed so as to be in contact with the side surface of the semiconductor layer 106. Over the one surface of the semiconductor layer 106 and over the insulating layer 108, the insulating layer 110 is formed. The insulating layer 108 and the insulating layer 110 function as a gate insulating layer of the thin film transistor 120. That is, the gate insulating layer of the present invention is formed of not a single body but a compound body including a plurality of insulating layers. Note that each boundary in the plurality of insulating layers is not necessarily clear.

By forming the gate insulating layer out of the insulating layer 108 which is in contact with the side surface of the semiconductor layer 106 and the insulating layer 110 which is in contact with the one surface of the semiconductor layer 106 and the insulating layer 108, coverage with the gate insulating layer at the end portion of the semiconductor layer 106 can be improved. Therefore, a defect due to insufficiency of coverage with the gate insulating layer at the end portion of the semiconductor layer 106, for example, a short circuit between the semiconductor layer and the gate electrode layer, occurrence of leakage current, electrostatic discharge, or the like, can be prevented.

Further, as for the gate insulating layer formed of the insulating layer 108 and the insulating layer 110, the thickness in the region which is in contact with the side surface of the semiconductor layer 106 is preferably larger than that over the one surface of the semiconductor layer 106. The thickness in the region which is in contact with the side surface of the semiconductor layer 106 is preferably more than or equal to 1 times and less than or equal to 3 times that of the one surface of the semiconductor layer 106. For example, given that a perpendicular distance between the one surface of the semiconductor layer 106 and the top surface of the gate insulating layer is a thickness $t1$, and a perpendicular distance between the side surface of the semiconductor layer 106 and the top surface of the gate insulating layer is a thickness $t2$, it is preferable for the gate insulating layer to satisfy $t1<t2$. For example, $t1<t2 \leq 3t1$ can be satisfied. Note that the thickness of the gate insulating layer in the region which is in contact with the side surface of the semiconductor layer 106, which is for example, the thickness $t2$ that is the perpendicular distance between the side surface of the semiconductor layer 106 and the top surface of the gate insulating layer, is not necessarily a constant value. In this case, the minimum value of the thickness $t2$ is preferably equal to or larger than the thickness $t1$. By covering the end portion of the semiconductor layer 106 with the gate insulating layer enough, and preferably, by increasing the thickness of the gate insulating layer in the region which is in contact with the side surface of the semiconductor layer 106, an electric field applied to the end portion of the semiconductor layer 106 can be relaxed, and occurrence of a leakage current or the like can be prevented.

Further, as for the gate insulating layer formed of the insulating layer 108 and the insulating layer 110, the dielectric constant in the region which is in contact with the side surface of the semiconductor layer 106 is preferably lower than that in the region over the one surface of the semiconductor layer 106. For example, by decreasing the dielectric constant of the insulating layer 108 as compared to that of the insulating layer 110, the dielectric constant of the gate insulating layer in the region which is in contact with the side surface of the semiconductor layer 106 can be low. Preferably, a low-dielectric constant material in which the dielectric constant is 4 or less is used for forming the insulating layer 108. In the gate insulating layer, by decreasing the dielectric constant in the region which is in contact with the side surface of the semiconductor layer 106 as compared to that over the one surface of the semiconductor layer 106, concentration of electric field at the end portion, particularly at the corner portion of the semiconductor layer 106 can be prevented. Accordingly, local application of excessive electric field to the gate insulating layer can be prevented, and insufficient insulation of the gate insulating layer can be prevented. Thus, high-yield manufacturing of semiconductor devices can be realized, and the reliability of a semiconductor device can be improved.

Here, that the insulating layer 108 is formed to be in contact with the side surface of the semiconductor layer 106 so as to surround the island-shaped semiconductor layer 106. It can also be said that the insulating layer 108 has an opening so as to expose the upper surface of the semiconductor layer 106.

Figure 8A:
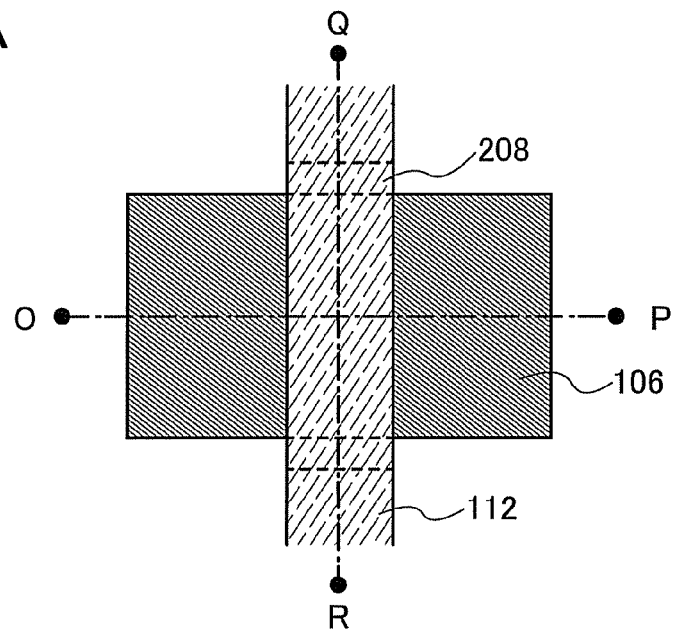
FIGS. 8A to 8C sow an example of a main structure of a semiconductor device according to the present invention.
Figure 8B:
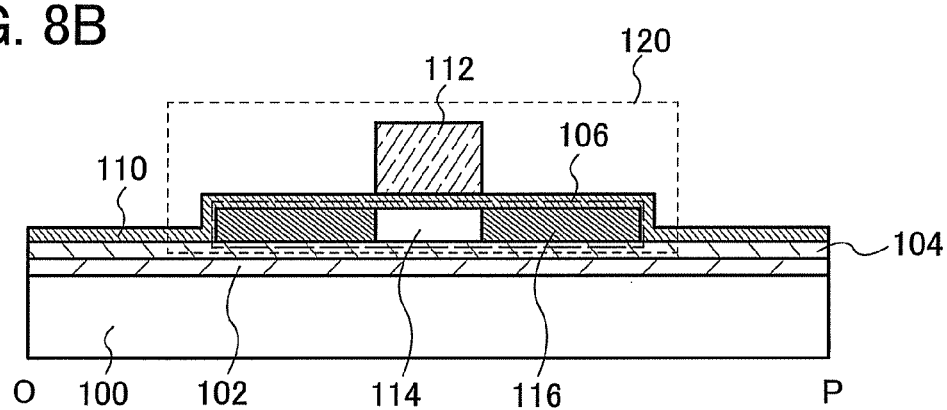
Figure 8C:
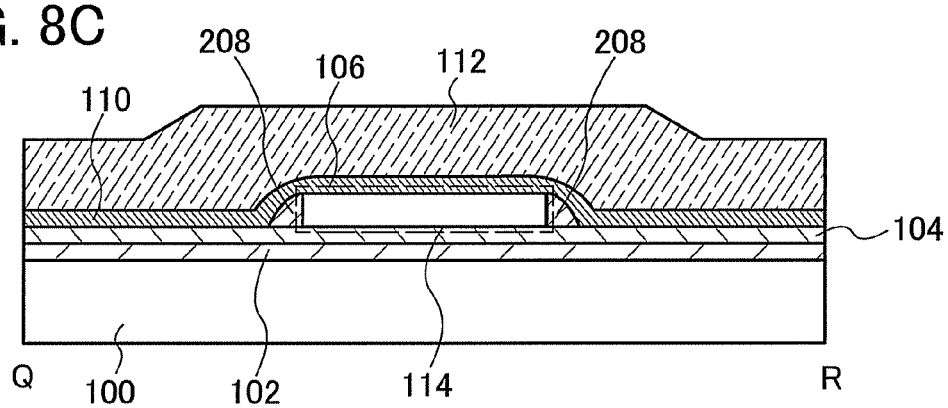

Note that as described above, when the semiconductor layer is formed into an island shape, various defects due to the end portion of the semiconductor layer tend to occur. In particular, at the end portion of the semiconductor layer overlapped with the gate electrode, and further, in a channel formation region end portion (the periphery of a boundary between the channel formation region and the impurity region that functions as a source or drain region) which is formed at the end portion of the semiconductor layer overlapped with the gate electrode, a defect tends to occur and damage by electrostatic discharge or the like tends to be received. As factors thereof, the following can be given: the channel formation region end portion and the gate electrode tend to form a parasitic channel through the gate insulating layer which is in contact with the side surface of the channel formation region end portion (the end portion of the semiconductor layer) in the region where the channel formation region end portion and the gate electrode overlap each other; a higher voltage is applied to the end portion of the channel formation region (the periphery of the boundary between the channel formation region and the impurity region that functions as a source or drain region) as compared to the periphery of the center of the channel formation region; etching or the like in processing the gate electrode layer (the conductive layer) which is formed over the channel formation region end portion adversely affects the channel formation region end portion; the gate insulating layer is locally thin at the end portion of the semiconductor layer; and the like. Therefore, at least in the region where the gate electrode layer and the end portion of the semiconductor layer overlap each other, by forming the insulating layer so as to be in contact with the side surface of the semiconductor layer, a defect such as dielectric breakdown, electrostatic discharge, or a leakage current can be reduced. For example, as shown in FIGS. 8A to 8C, in the region where the end portion of the island-shaped semiconductor layer 106 and the conductive layer 112 that functions as a gate electrode overlap each other, an insulating layer 208 which is in contact with the side surface of the semiconductor layer 106 may be formed. FIG. 8A is a top diagram, FIG. 8B is a cross-sectional diagram along a dashed line O-P in FIG. 8A, and FIG. 8C is a cross-sectional diagram along a dashed line Q-R in FIG. 8A. Here, the insulating layer 208 is formed just in the region where the conductive layer 112 and the end portion of the semiconductor layer 106 overlap each other and the periphery thereof. Therefore, the insulating layer 208 is not formed in the side surface of the semiconductor layer 106 in FIG. 8B, whereas the insulating layer 208 is formed so as to be in contact with the side surface of the semiconductor layer 106 in FIG. 8C.

As shown in FIGS. 8A to 8C, by forming the insulating layer which is in contact with the side surface of the semiconductor layer at least in the region where the conductive layer that functions as a gate electrode and the end portion of the semiconductor layer overlap each other, short-circuiting between the end portion of the semiconductor layer and the conductive layer that functions as a gate electrode can be prevented. In addition, even when the insulating layer 104 under the semiconductor layer 106 is removed in the periphery of the end portion of the semiconductor layer 106, the end portion of the semiconductor layer 106 can be covered enough by forming an insulating layer 208 which is in contact with the side surface of the semiconductor layer 106. In particular, improvement of coverage with the gate insulating layer by applying the present invention is effective for the case where the thickness of the gate insulating layer is in the range of several nm to several tens of nm and smaller than that of the semiconductor layer. Further, concentration of electric field at the end portion of the semiconductor layer can be relaxed by applying the present invention, and a leakage current can be prevented or reduced. In particular, in the gate insulating layer, decreasing the dielectric constant in the region which is in contact with the side surface of the semiconductor layer as compared to that over the one surface of the semiconductor layer is effective in that local application of electric field can be relaxed. As described above, by forming the insulating layer so as to be in contact with the side surface of the semiconductor layer, particularly, with the side surface of the semiconductor layer in the region where the conductive layer that functions as a gate electrode and the end portion of the semiconductor layer overlap each other, the reliability and operating characteristics of a semiconductor device can be improved.

Each of the insulating layers 108 and 110 can be formed to have a single layer structure or a stacked-layer structure, of a material such as silicon oxide, silicon nitride, silicon oxynitride, silicon nitride oxide, aluminum nitride, SiOF (silicon oxide containing fluorine), SiOC (silicon oxide containing carbon), DLC (Diamond-Like Carbon), porous silica, or the like. Further, either the same material or different materials may be used for forming the insulating layers 108 and 110. In this embodiment mode, the insulating layer 108 is formed of a silicon oxide layer and the insulating layer 110 is formed of a silicon nitride layer.

Note that the insulating layer 108 is preferably formed of a material of which dielectric constant is lower than that of the insulating layer 110. Further, the insulating layer 108 is preferably formed of a low-dielectric constant material in which the dielectric constant is about 4 or less, such as SiOF, SiOC, DLC, porous silica, or the like. Such a low-dielectric constant material in which the dielectric constant is 4 or less is also called a low-k material, and a film manufactured using a low-k material is called a low-k film. By thus forming the insulating layer 108 of the material of which the dielectric constant is lower than that of the insulating layer 110, the dielectric constant of the gate insulating layer in the region which is in contact with the side surface of the semiconductor layer can be made lower than that over the one surface of the semiconductor layer.

The conductive layer 112 that functions as a gate electrode is formed over the semiconductor layer 106 with the insulating layer 110 interposed therebetween. The conductive layer 112 can be formed of a metal element such as tantalum (Ta), tungsten (W), titanium (Ti), molybdenum (Mo), chromium (Cr), aluminum (Al), copper (Cu), or niobium (Nb), or an alloy material or a compound material containing the metal element. As the compound material, a nitrogen compound, an oxygen compound, a carbon compound, a halogen compound, or the like can be used; specifically, tungsten nitride, titanium nitride, aluminum nitride, and the like can be given. The conductive layer 112 is formed to have a single layer structure or a stacked-layer structure, of one or a plurality of the above-mentioned materials. Further, the conductive layer 112 may also be formed of polycrystalline silicon to which an impurity element which imparts one conductivity type, such as phosphorus is added.

Next, a manufacturing method of the thin film transistor shown in FIGS. 1A to 1C is described in detail with reference to FIGS. 2A1 and 2A2, 2B1 and 2B2, and 2C1 and 2C2.

Figure 2A:
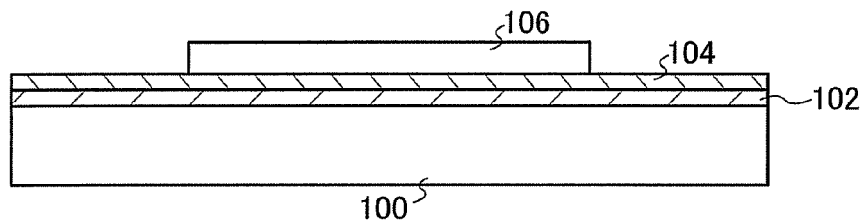
FIGS. 2A to 2E show an example of a manufacturing method of a semiconductor device according to the present invention.

First, the semiconductor layer 106 is formed over the substrate 100 with the insulating layers 102 and 104 that function as a base insulating layer therebetween (see FIG. 2A).

For the substrate 100, a substrate having an insulating surface such as a glass substrate or a quartz substrate is used. Each of the insulating layers 102 and 104 is formed by a CVD method or a sputtering method, using a material such as silicon oxide, silicon nitride, silicon oxynitride, or silicon nitride oxide. The insulating layers 102 and 104 function as a blocking layer that prevents contamination of the semiconductor layer 106 due to diffusion of an alkali metal or the like from the substrate 100 to the semiconductor layer 106. In addition, when a surface of the substrate 100 is uneven, the insulating layers 102 and 104 can function as a layer for planarization. Note that the insulating layers 102 and 104 are not necessary to be formed if impurity diffusion from the substrate 100 or unevenness of the surface of the substrate 100 is not a problem. Further, although the base insulating layer is a stacked-layer structure with two layers, it may have a single-layer structure or a stacked-layer structure of three or more layers.

The semiconductor layer 106 is preferably formed by a CVD method or a sputtering method, using a material mainly containing silicon. Specifically, silicon, silicon germanium, or the like can be used. In addition, germanium may be used. For example, as the semiconductor layer 106, an island-shaped semiconductor layer can be formed by forming an amorphous semiconductor layer using a material mainly containing silicon, crystallizing the amorphous semiconductor layer, and then performing selective etching. In a case of crystallizing the amorphous semiconductor layer, crystallization can be performed by a laser crystallization method, a thermal crystallization method using RTA or an annealing furnace, a thermal crystallization method using a metal element that promotes crystallization, a method combining these methods, or the like. The semiconductor layer 106 is formed to a thickness in the range of 10 to 150 nm, preferably a thickness in the range of 30 to 100 nm or in the range of 10 to 30 nm.

The semiconductor layer 106 may be formed such that the end portion has a vertical shape or a tapered shape. The shape of the end portion of the semiconductor layer 106 can be selected as appropriate by changing the etching condition or the like. It is preferable to form such that the taper angle of the end portion of the semiconductor layer 106 is 45° or more and less than 95°, and more preferably 60° or more and less than 95°. By making the end portion of the semiconductor layer 106 a shape almost vertical, a parasitic channel can be reduced.

Figure 2B:
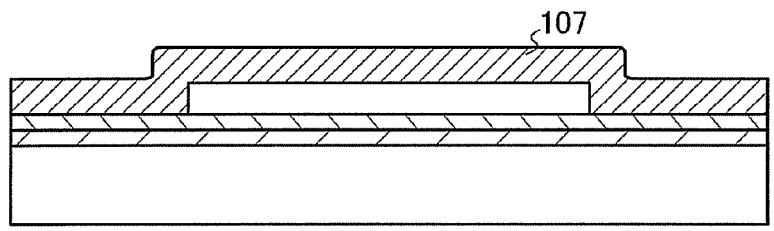

Next, an insulating layer 107 (hereinafter also called a first insulating layer 107) is formed to cover the semiconductor layer 106 (see FIG. 2B). The first insulating layer 107 is formed by a CVD method or a sputtering method, using a material such as silicon oxide, silicon nitride, silicon oxynitride, silicon nitride oxide, SiOF, SiOC, DLC, porous silica, or the like.

Further, the first insulating layer 107 is formed to a thickness so that the end portion of the semiconductor layer 106 can be sufficiently covered. The thickness of the first insulating layer 107 is preferably in the range of 1.5 to 3 times thicker than that of the semiconductor layer 106 formed under the first insulating layer 107.

Next, the first insulating layer 107 is selectively etched by anisotropic etching mainly in a vertical direction to form the insulating layer 108 (hereinafter also called the second insulating layer 108) which is in contact with the side surface of the semiconductor layer 106 (see FIG. 1C).

According to the anisotropic etching mainly in a vertical direction of the first insulating layer 107, the etching progresses gradually from the first insulating layer 107 formed in the region over the one surface of the semiconductor layer 106 and over the insulating layer 104. Note that the first insulating layer 107 with an almost uniform thickness is formed over the one surface of the semiconductor layer 106 and over the insulating layer 104. Therefore, by stopping the etching when the one surface of the semiconductor layer 106 is exposed, the first insulating layer 107 can be left just in the region which is in contact with the side surface of the semiconductor layer 106 and the periphery thereof. The left first insulating layer 107 corresponds to the second insulating layer 108. Note that by making the end portion of the semiconductor layer 106 an almost vertical shape, the first insulating layer 107 can be easily left just in the region which is in contact with the side surface of the semiconductor layer 106 and in the periphery thereof. That is, the second insulating layer 108 can be easily formed.

The etching method of the first insulating layer 107 is not particularly limited as long as anisotropic etching mainly in a vertical direction can be performed. For example, reactive ion etching (RIE) can be used. The reactive ion etching is classified depending on a plasma generation method into a parallel-plate type, a magnetron type, a dual-frequency type, an ECR type, a helicon type, an ICP type, or the like. As an etching gas used at this time, a gas which can provide high etching selection ratio of the first insulating layer 107 with respect to another layer (the semiconductor layer 106) is preferably selected. In the case of selectively etching an insulating film, a fluorine-based gas such as $CHF_3$, $CF_4$, $C_4F_8$, $C_2F_6$, $NF_3$, or the like can be used, for example. Further, an inert gas such as helium (He), argon (Ar), or xenon (Xe); an $O_2$ gas; or an $H_2$ gas may be added as needed.

The shape of the second insulating layer 108 can be changed by selecting the material for forming the thin film, the etching condition, or the like as appropriate. In this embodiment mode, the second insulating layer 108 is formed such that the vertical height from the bottom surface (the surface which is in contact with the insulating layer 104) is almost the same as that of the semiconductor layer 106. Further, the second insulating layer 108 is formed such that the surface thereof on the side which is not in contact with the side surface of the semiconductor layer 106 is curved. Specifically, it is formed such that an appropriate curvature is provided and the surface is curved convexly with respect to the side surface of the semiconductor layer 106 being in contact with. It is needless to say that the present invention is not limited particularly thereto, and the second insulating layer 108 may have a shape having a corner instead of a rounded shape. Preferably, the corner portion of the second insulating layer 108 is made a gentle shape so that the coverage with a layer formed thereover (here, the insulating layer 110) can be improved. Note that the etching condition means an amount of electric power which is applied to an electrode provided with an substrate, the temperature of the same, the pressure in a chamber, and the like in addition to the kind of etching gas and a gas flow rate.

Next, the insulating layer 110 (hereinafter also called the third insulating layer 110) is formed over the semiconductor layer 106 and the second insulating layer 108 (see FIG. 2D). The third insulating layer 110 is formed by a CVD method or a sputtering method, using silicon oxide, silicon nitride, silicon oxynitride, silicon nitride oxide, aluminum nitride, or the like. Further, the third insulating layer 110 is formed to have a single layer structure or a stacked-layer structure of at least one of the above materials. The third insulating layer 110 is formed to have a thickness in the range of 1 to 50 nm, preferably 1 to 20 nm, and more preferably 1 to 10 nm. In this embodiment mode, a silicon oxynitride layer is formed with a thickness in the range of 20 nm as the third insulating layer 110.

Further, the third insulating layer 110 can also be formed by solid phase oxidation or solid phase nitridation with a plasma treatment. For example, the semiconductor layer 106 and the second insulating layer 108 are oxidized or nitrided by a plasma treatment to form the third insulating layer 110.

In the solid phase oxidation treatment or solid phase nitridation treatment by a plasma treatment, plasma which is excited by high-frequency waves such as microwaves (typically, 2.45 GHz) and has an electron density of $1\times10^{11}$ cm$^{-3}$ and more and $1\times10^{13}$ cm$^{-3}$ or less and an electron temperature of 0.5 eV or more and 1.5 eV or less is preferably used. This is because in the solid phase oxidation treatment or solid phase nitridation treatment at a temperature of 500° C. or less, a dense insulating layer is formed and a practical reaction speed is obtained.

When the surfaces of the semiconductor layer 106 and the second insulating layer 108 are oxidized by a plasma treatment, the plasma treatment is performed in a oxygen atmosphere (e.g., an atmosphere containing oxygen ($O_2$), ozone ($O_3$), dinitrogen monoxide ($N_2O$), nitric monoxide (NO), or nitrogen dioxide ($NO_2$), and a rare gas (at least one of helium (He), neon (Ne), argon (Ar), krypton (Kr), and xenon (Xe)), or an atmosphere containing ($O_2$), ozone ($O_3$), dinitrogen monoxide ($N_2O$), nitric monoxide (NO), or nitrogen dioxide ($NO_2$), hydrogen ($H_2$), and a rare gas). Further, when the surfaces of the semiconductor layer 106 and the insulating layer 108 are nitrided by a plasma treatment, the plasma treatment is performed in a nitrogen atmosphere (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may also be used.

Figure 9:
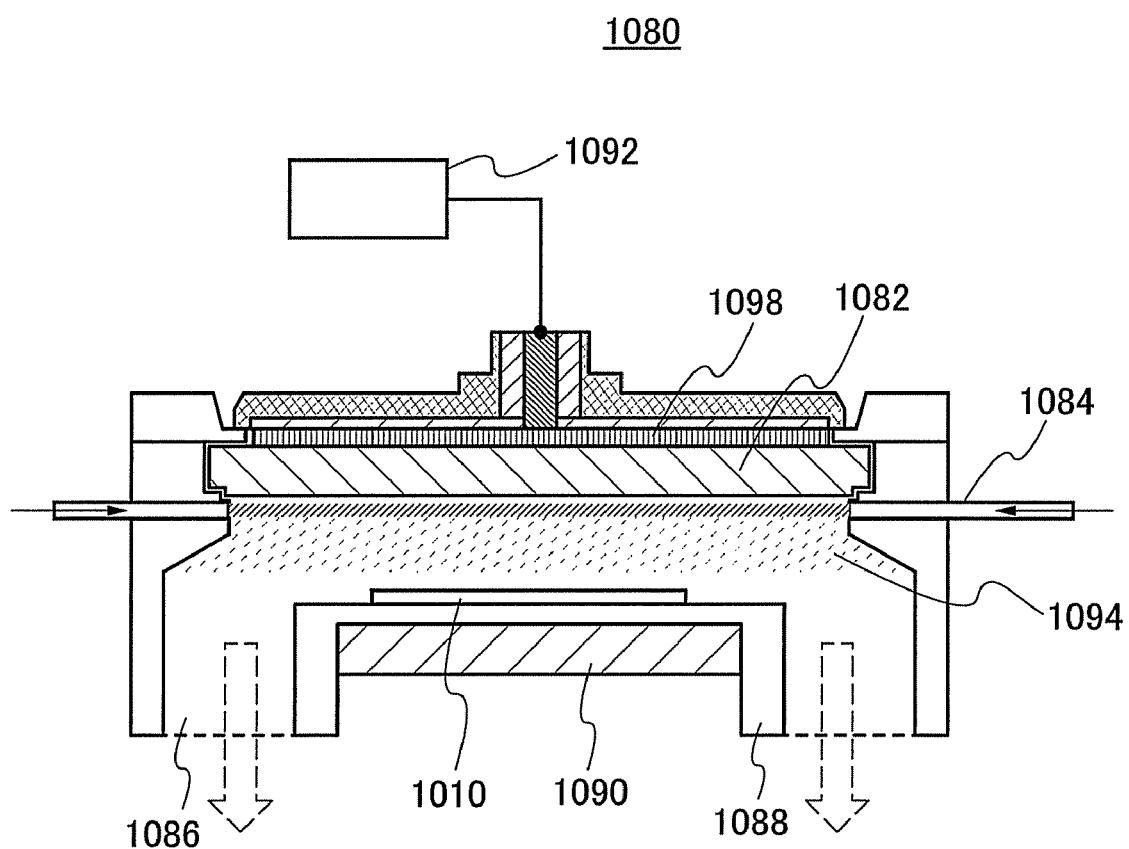
FIG. 9 shows an example of a structure of a plasma processing equipment.

FIG. 9 shows a structural example of a plasma processing equipment 1080 for performing a plasma process. The plasma processing equipment 1080 includes a support 1088, a gas supplying portion 1084 for supplying a gas, an exhaust port 1086 connected to a vacuum pump for exhausting a gas, an antenna 1098, a dielectric plate 1082, and a high-frequency wave supplying portion 1092 for supplying high-frequency waves for plasma generation. An object to be processed 1010 is held by the support 1088. In addition, by providing a temperature controlling portion 1090 for the support 1088, the temperature of the temperature of the object to be processed 1010 can also be controlled. The object to be processed 1010 is a body to which a plasma treatment is performed, and corresponds to an object in which the insulating layers 102 and 104, and the island-shaped semiconductor layer 106 are stacked in order over the substrate 100.

Hereinafter, a specific example in which an insulating layer is formed on the surface of the semiconductor layer with the plasma processing equipment 1080 shown in FIG. 9 is described. It is to be noted that the plasma treatment includes an oxidation treatment, a nitridation treatment, an oxynitridation treatment, a hydrogenation treatment, and a surface modification treatment performed to a substrate, a semiconductor layer, an insulating layer, and a conductive layer. For these treatments, a gas supplied from the gas supplying portion 1084 may be selected in accordance with an intended purpose.

First, a processing chamber of the plasma processing equipment 1080 shown in FIG. 9 is made in vacuum and a gas containing a rare gas and oxygen or nitrogen is supplied from the gas supplying portion 1084. The object to be processed 1010 is heated at room temperature or at a temperature of 100° C. or more to 550° C. or less by the temperature controlling portion 1090. The distance between the object to be processed 1010 and the dielectric plate 1082 (hereinafter also called an electrode interval) is approximately 20 mm or more and 200 mm or less (preferably 20 mm or more and 60 mm or less).

Next, high-frequency waves are supplied from the high-frequency wave supplying portion 1092 to the antenna 1098. Here, microwaves (frequency: 2.45 GHz) are input as the high-frequency waves. Then, the microwaves are introduced from the antenna 1098 into the processing chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated by the gas supplied.

When the plasma 1094 is generated by introducing microwaves, plasma which has the low electron temperature (3 eV or lower, preferably 1.5 eV or lower) and the high electron density ($1\times10^{11}$ cm$^{-3}$ or more) can be generated. Specifically, plasma which has an electron temperature of 0.5 eV or more and 1.5 eV or less and an electron density of $1\times10^{11}$ cm$^{-3}$ or more and $1\times10^{13}$ cm or less is preferably generated. Note that in this specification, plasma which has the low electron temperature and the high electron density generated by introducing microwaves is also called high-density plasma. Further, a plasma treatment utilizing high-density plasma is also called a high-density plasma treatment.

With the oxygen radicals (containing an OH radical in some cases) and/or nitrogen radicals (containing an NH radical in some cases) generated by the plasma 1094, the surface of the semiconductor layer formed in the object to be processed 1010 is oxidized or nitrided, whereby an insulating layer is formed. In this case, if the rare gas such as argon is mixed in the gas supplied, oxygen radicals or nitrogen radicals can be generated efficiently by excited species of the rare gas. Note that in the case where the rare gas is used in the gas supplied, the rare gas may be contained in the insulating layer formed. In this method, by effective use of active radicals excited by plasma, oxidation or nitridation by a solid phase reaction can be performed at a low temperature of 500° C. or less.

As one preferable example of the third insulating layer 110 formed by the high-density plasma treatment using the equipment shown in FIG. 9, a silicon oxide layer is formed on one surface of the semiconductor layer 106 to have a thickness of 3 nm to 6 nm by a plasma treatment in an atmosphere containing oxygen, and the surface of the silicon oxide layer is treated with a nitridation plasma in an atmosphere containing nitrogen to form a nitrogen-plasma-treated layer. Specifically, first, the silicon oxide layer is formed on one surface of the semiconductor layer 106 by a plasma treatment in an atmosphere containing oxygen to have a thickness of 3 nm to 6 nm. Then continuously, the plasma treatment in an atmosphere containing nitrogen is performed, whereby the nitrogen-plasma-treated layer with high nitrogen concentration is provided on the one surface of the silicon oxide layer or in the periphery of the surface. Note that the "periphery of the surface" refers to a region in a depth of approximately 0.5 nm to 1.5 nm from the surface of the silicon oxide layer. For example, by performing the plasma treatment in an atmosphere containing nitrogen, a structure in which nitrogen is contained at a rate of 20 atomic % to 50 atomic % in a region of the silicon oxide layer in a depth of approximately 1 nm in a vertical direction from the surface thereof is obtained. Further, the high-density plasma treatment can also oxidize or nitride the surface of the insulating layer 108.

For example, by forming a silicon layer as the semiconductor layer 106 and oxidizing a surface of the silicon layer with a plasma treatment, an oxide layer which is not distorted at an interface and is dense can be formed. Further, by nitriding the oxide layer with a plasma treatment, by which oxygen is substituted for nitrogen in the top most surface layer portion to form a nitride layer, further densification can be performed. In this manner, an insulating layer with a high withstand voltage can be formed.

In either case, by the solid phase oxidation or solid phase nitridation with a plasma treatment as described above, even if a glass substrate with an upper temperature limit of 700° C. or lower is used, an insulating layer which is equivalent to a thermally-oxidized film which is formed at a temperature of 950° C. to 1050° C. can be obtained. That is, a highly reliable insulating layer can be formed as an insulating layer that functions as a gate insulating film in a semiconductor element, in particular, a thin film transistor or a nonvolatile memory element.

Figure 2C:
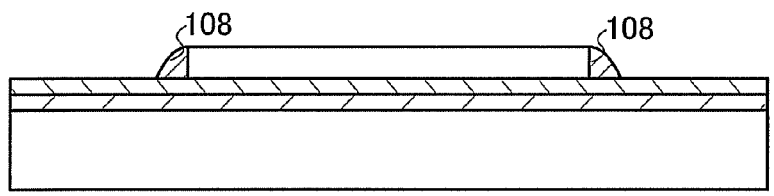
Figure 2D:
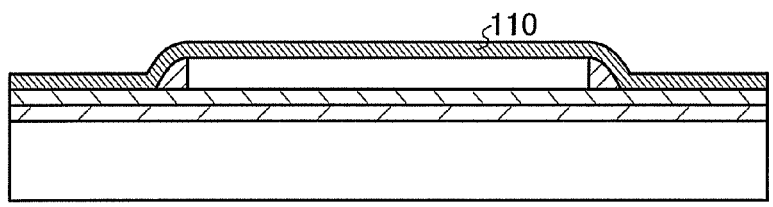
Figure 2E:
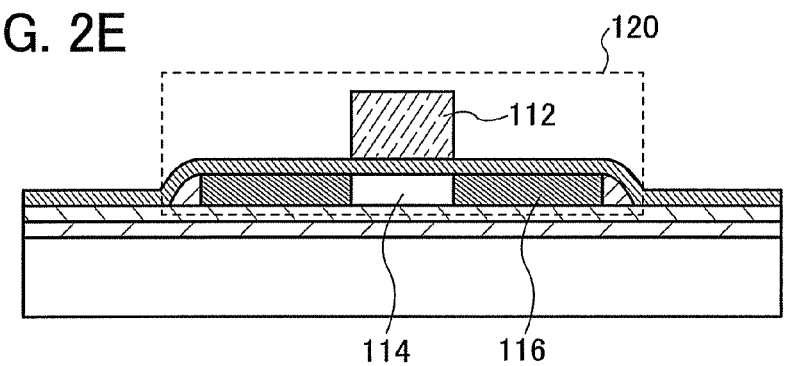

Next, the conductive layer 112 that functions as a gate electrode is formed over the semiconductor layer 106 with the third insulating layer 110 interposed therebetween (see FIG. 2C). The conductive layer 112 can be formed using a metal element such as tantalum (Ta), tungsten (W), titanium (Ti), molybdenum (Mo), chromium (Cr), aluminum (Al), copper (Cu), or niobium (Nb); or an alloy material or a compound material containing the metal element. Further, a semiconductor material typified by polycrystalline silicon to which an impurity element which imparts one conductivity type, such as phosphorus is added can also be used. The conductive layer 112 can be processed into a desired shape by selective etching after being formed over the entire surface by a CVD method or a sputtering method. Further, the conductive layer 112 has either a single layer structure or a stacked-layer structure. The conductive layer 112 is formed to have a thickness in the range of 100 to 1000 nm, preferably 200 to 800 nm, and more preferably 300 to 500 nm.

Next, an impurity element which imparts one conductivity type is selectively added to the semiconductor layer 106, whereby the channel formation region 114 and the impurity regions 116 which function as source and drain regions are formed. Here, the impurity element which imparts one conductivity type is added with the conductive layer 112 as a mask. As the impurity element which imparts one conductivity type, an element which imparts a p-type conductivity such as boron (B), aluminum (Al), or gallium (Ga) or an element which imparts an n-type conductivity such as phosphorus (P) or arsenic (As) can be used.

Note that after the impurity element which imparts one conductivity type is added into the semiconductor layer 106, a heat treatment is preferably performed to activate the impurity element added. The heat treatment can be performed by laser beam irradiation, RTA, or using an annealing furnace. Specifically, the heat treatment may be performed at a temperature of 400° C. to 700° C., and preferably 500° C. to 550° C. Further, the heat treatment is preferably performed in a nitrogen atmosphere. For example, activation can be performed by heating at 550° C. for 4 hours. Further, when the first insulating layer 107 is selectively etched to form the second insulating layer 108, the semiconductor layer 106 becomes amorphous partially in some cases depending on the etching condition or the material, the thickness, or the like of each thin film. In this case, by performing heat treatment, recrystallization of the semiconductor layer can be performed together with the activation.

Accordingly, the thin film transistor 120 to which the present invention is applied can be formed. Note that the structure of the TFT described in this embodiment mode is just an example, and the present invention is not limited to the structure shown. For example, a multi-gate structure, which includes a semiconductor layer including two or more channel formation regions connected in series and two or more gate electrode layers by which an electric field is applied to the channel formation regions, may be employed. Further, an LDD region may be formed in the semiconductor layer of the TFT.

Although the example in which a conductive layer is formed of a single layer as a gate electrode is described in this embodiment mode, the present invention is not particularly limited. The side surface of the gate electrode may be tapered, and the gate electrode may employ a stacked-layer structure including two or more conductive layers. Further, when the gate electrode has a stacked-layer structure including two or more conductive layers, the taper angle may be different in the layers. Further, an insulating layer, which is also called a sidewall, may also be formed so as to be in contact with the side surface of the conductive layer that functions as a gate electrode.

In a thin film transistor manufactured by applying the present invention, defects due to an end portion of a semiconductor layer can be reduced. Therefore, a highly reliable semiconductor device can be manufactured. Further, high-yield manufacturing of semiconductor devices can also be realized.

This embodiment mode can be combined with any other embodiment mode in this specification as appropriate.

Embodiment Mode 2

In this embodiment mode, an example of manufacturing a semiconductor device by a manufacturing method which is different from that in Embodiment Mode 1 is described with reference to FIGS. 3A to 3E.

Figure 3A:
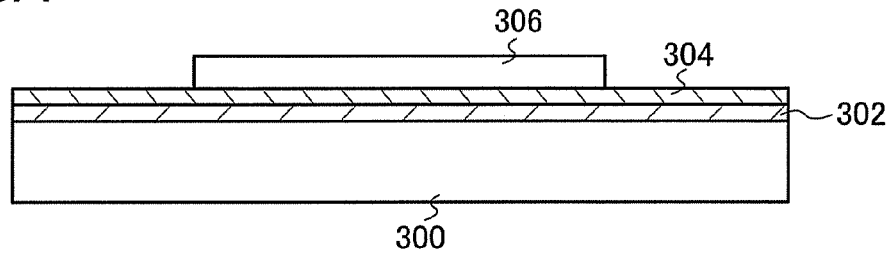
FIGS. 3A to 3E show an example of a manufacturing method of a semiconductor device according to the present invention.
Figure 3B:
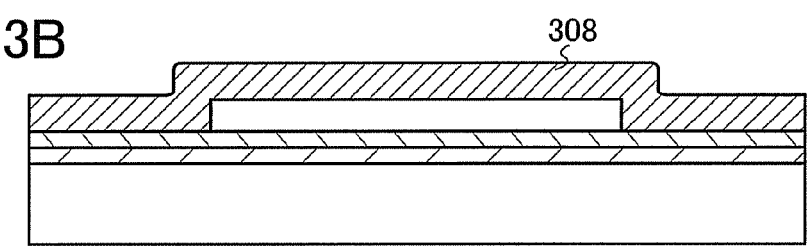
Figure 3C:
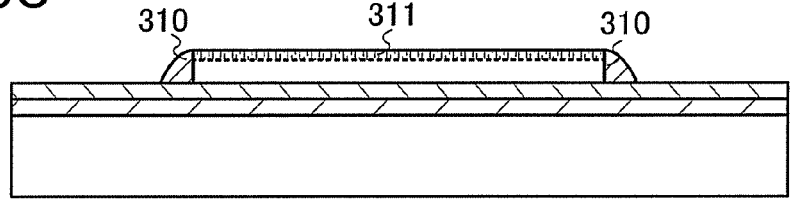
Figure 3D:
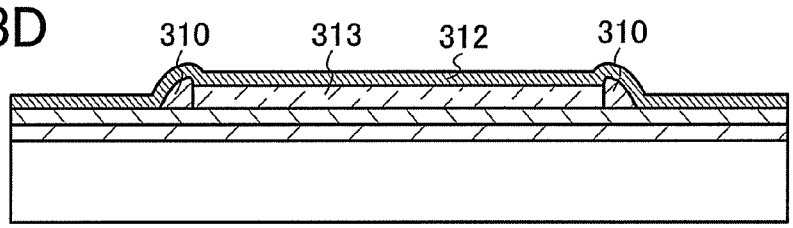
Figure 3E:
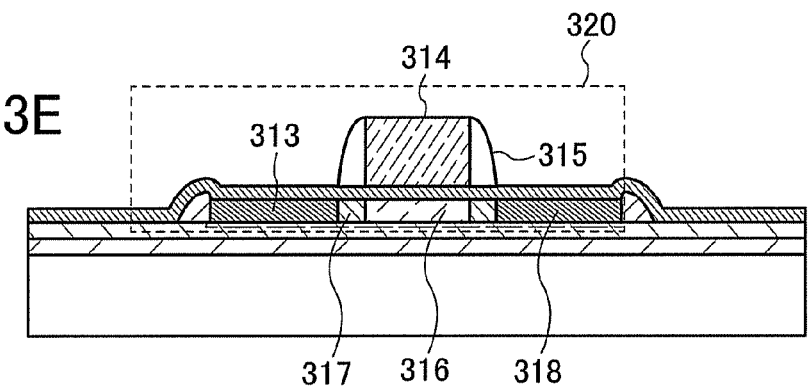

First, a first semiconductor layer 306 is formed over a substrate 300, with an insulating layer 302 and an insulating layer 304 that function as a base insulating layer interposed therebetween (see FIG. 3A). Next, a first insulating layer 308 is formed to cover the first semiconductor layer 306 (see FIG. 3B). Note that up to and including the formation of the first insulating layer 308, the description made on the substrate 100, the insulating layer 102, the insulating layer 104, the semiconductor layer 106, and the first insulating layer 107 in Embodiment Mode 1 can be referred to, and therefore, a rough description thereof is made below.

As the substrate 300, a substrate having an insulating surface such as a glass substrate or a quartz substrate can be used. Each of the insulating layers 302 and 304 is formed by a CVD method or a sputtering method, using silicon oxide, silicon nitride, silicon oxynitride, silicon nitride oxide, or the like. The first semiconductor layer 306 is formed by a CVD method or a sputtering method, using a semiconductor material such as silicon, germanium, or silicon germanium. Here, the semiconductor layer 306 of an island shape is formed by forming an amorphous semiconductor layer using a material mainly containing silicon, crystallizing the amorphous semiconductor layer, and then performing etching selectively. The thickness of the semiconductor layer 306 may be 10 to 150 nm, and preferably 30 to 100 nm or 10 to 30 nm. Further, the first semiconductor layer 306 may be formed such that the end portion has a vertical shape or a tapered shape. In this embodiment mode, the first semiconductor layer 306 is formed such that the taper angle is preferably 45° or more and less than 95°, and more preferably 60° or more and less than 95° which is almost vertical. By making the tapered shape of the end portion of the first semiconductor layer 306 steep, a parasitic channel of a semiconductor device can be reduced. Note that the present invention is not particularly limited, and the end portion of the first semiconductor layer 306 may be tapered at a taper angle of 30° or more and less than 85° or may be gently tapered at a taper angle of 45° or more and less than 60°.

The first insulating layer 308 is formed using a material such as silicon oxide, silicon nitride, silicon oxynitride, silicon nitride oxide, aluminum nitride, SiOF, SiOC, DLC, porous silica, or the like by a CVD method or a sputtering method. Further, the first insulating layer 308 is formed to have a thickness that can sufficiently cover at least the end portion of the first semiconductor layer 306. The first insulating layer 308 is preferably formed to have a thickness that is 1.5 to 3 times thicker than that of the first semiconductor layer 306.

Further, the first insulating layer 308 is preferably formed of a material having the dielectric constant which is lower than that of an insulating layer 312 formed later over one surface of the semiconductor layer. The first insulating layer 308 forms a gate insulating layer in the region which is in contact with the side surface of the semiconductor layer in a semiconductor device. With an island-shaped semiconductor layer, concentration of electric field tends to occur at the end portion, in particular, the corner portion of the semiconductor layer. If the concentration of electric field occurs at the end portion of the semiconductor layer, dielectric breakdown of the gate insulating layer or insufficient insulation such as occurrence of a leakage current tends to occur. Therefore, by forming the first insulating layer 308 which is in contact with the side surface of the semiconductor layer with the use of a low-dielectric constant material as compared to the insulating layer formed over the one surface of the semiconductor layer, the gate insulating layer can be prevented from receiving a locally excessive stress such as an electric field, which is preferable.

Next, the first insulating layer 308 is selectively etched by anisotropic etching mainly in a vertical direction to form the second insulating layer 310 which is in contact with the side surface of the first semiconductor layer 306. At this time, a top-layer portion of the first semiconductor layer 306 is made amorphous to form an amorphous region 311 (see FIG. 3C).

For example, a silicon oxynitride layer is formed as the insulating layer 304, a crystalline silicon layer is formed as the first semiconductor layer 306, and a silicon nitride oxide layer is formed as the first insulating layer 308. Then, the first insulating layer 308 is etched by anisotropic dry-etching mainly in a vertical direction. The etching progresses from the first insulating layer 308 formed over the one surface of the first semiconductor layer 306 and over one surface of the insulating layer 304. Note that the thickness of the first insulating layer 308 is almost the same over the one surface of the first semiconductor layer 306 and over the one surface of the insulating layer 304. Thus, by stopping etching when the one surface of the first semiconductor layer 306 is exposed, the first insulating layer 308 can be left just in the region which is in contact with the side surface of the first semiconductor layer 306 and the periphery thereof. The first insulating layer 308 that is left corresponds to the second insulating layer 310. If the end portion of the first semiconductor layer 306 has a shape close to a vertical shape, the second insulating layer 310 can be easily formed just in the region which is in contact with the side surface of the first semiconductor layer 306 and the periphery thereof. Further, in this embodiment mode, the second insulating layer 310 is formed such that the vertical height from the bottom surface (the surface which is in contact with the insulating layer 304) is almost the same as that of the first semiconductor layer 306. Further, the second insulating layer 310 is formed such that the surface thereof on the side which is not in contact with the side surface of the first semiconductor layer 306 is curved convexly. It is needless to say that the present invention is not limited particularly thereto, and the second insulating layer 310 may have a shape having a corner instead of a rounded shape. Preferably, the corner portion of the second insulating layer 310 is made a gentle shape so that the coverage with a layer formed thereover (here, the insulating layer 312) can be improved.

The etching method of the first insulating layer 308 is not particularly limited as long as anisotropic etching mainly in a vertical direction can be performed. For example, reactive ion etching of a parallel-plate type, a magnetron type, a dual-frequency type, an ECR type, a helicon type, an ICP type, or the like can be used. As an etching gas, a gas which can provide high etching selection ratio of the first insulating layer 308 with respect to another layer (the first semiconductor layer 306) is preferably selected. For example, by using a fluorine-based gas such as $CHF_3$, $CF_4$, $C_4F_8$, $C_2F_6$, $NF_3$, or the like, the insulating layer can be selectively etched. Further, an inert gas such as He, Ar, or Xe, an $O_2$ gas, or an $H_2$ gas may be added as needed. Note that by changing the etching condition as appropriate, the shape of the second insulating layer 310 can be controlled. In this embodiment mode, etching of the first insulating layer 308 is performed by ICP reactive ion etching using a $CHF_3$ gas and a He gas as an etching gas.

The amorphous region 311 is formed by making the top-layer portion of the first semiconductor layer 306 amorphous due to energy of plasma or the like at the time of anisotropic dry-etching of the first insulating layer 308. The amorphous region 311 can be formed by controlling the thickness of the first semiconductor layer 306, the material of the first insulating layer 308, the etching condition of the first insulating layer 308, or the like. The amorphous region 311 is formed to have a thickness of 0.2 to 0.6 times, and preferably about 0.3 to 0.5 times thicker than that of the first semiconductor layer 306. Note that the amorphous region 311 is formed from the top surface of the first semiconductor layer 306 toward the bottom surface thereof (the surface which is in contact with the insulating layer 304).

Next, the amorphous region 311 formed in the top layer portion of the first semiconductor layer 306 is selectively etched, whereby a second semiconductor layer 313 is formed. Next, the third insulating layer 312 is formed to cover the second insulating layer 310 and the second semiconductor layer 313 (see FIG. 3D).

The second semiconductor layer 313 is formed by selectively etching the amorphous region 311 formed in the top layer portion of the first semiconductor 306. For example, a crystalline silicon layer is formed as the first semiconductor layer 306. In the first semiconductor 306 formed of a crystalline silicon layer, the top layer portion of the first semiconductor 306 is made amorphous to form an amorphous silicon layer when the second insulating layer 310 that is in contact with the side surface of the first semiconductor layer 306 is formed by etching. The amorphous silicon layer formed at this time corresponds to the amorphous region 311 in this embodiment mode. Therefore, by selectively etching the amorphous silicon layer that is the amorphous region 311, a crystalline silicon layer is left as the second semiconductor layer 313. Note that the second semiconductor layer 313 is formed such that the taper angle of the end portion is preferably 45° or more and less than 95°, and more preferably 60° or more and less than 95° which is almost vertical. The second insulating layer 310 which is in contact with the side surface of the first semiconductor 306 is left as it is even after etching of the amorphous region 311, and it is stuck up convexly with respect to the second semiconductor layer 313.

The etching method of the amorphous region 311 is not particularly limited as long as it can provide high etching selection ratio of the amorphous region 311 with respect to the other insulating layers (the second insulating layer 310 and the insulating layer 304). Note that the etching selection ratio of an amorphous silicon layer with respect to a crystalline silicon layer is low; therefore, the amorphous region 311 is formed while controlling the thickness in advance, and the first semiconductor 306 is etched in a vertical direction until the depth which is assumed as the depth of the amorphous region 311. As the etching method, for example, reactive ion etching of a parallel-plate type, a magnetron type, a dual-frequency type, an ECR type, a helicon type, an ICP type, or the like can be used. As an etching gas, any gas can be used as long as it can provide high etching selection ratio of the amorphous region 311 with respect to the other insulating layers (the second insulating layer 310 and the insulating layer 304). For example, a chlorine-based gas such as $Cl_2$ or an HBr gas can be used. Further, a mixed gas of a HBr gas and a $Cl_2$ gas may also be used. Further, an inert gas such as He or Ar may be added as needed. In this embodiment mode, the amorphous region 311 is selectively etched by using a $Cl_2$ gas as an etching gas.

The third insulating layer 312 is formed by a CVD method or a sputtering method using a material such as silicon oxide, silicon nitride, silicon oxynitride, silicon nitride oxide, or aluminum nitride. The third insulating layer 312 is formed of at least one of the above-described materials to have a single layer structure or a stacked-layer structure. Further, the third insulating layer 312 can also be formed by solid phase oxidation or solid phase nitridation of the second semiconductor layer 313 or the second semiconductor layer 313 and the second insulating layer 310 with a high-density plasma treatment as described in Embodiment Mode 1. The third insulating layer 312 is formed to have a thickness in the range of 1 to 50 nm, preferably 1 to 20 nm, and more preferably 1 to 10 nm.

The second insulating layer 310 and the third insulating layer 312 formed as above function as a gate insulating layer. That is, the gate insulating layer of the present invention is formed of not a single body but a compound body including a plurality of insulating layers. By thus forming the second insulating layer 310 which is in contact with the side surface of the semiconductor layer, coverage with the gate insulating layer at the end portion of the semiconductor layer can be improved. In addition, even in the case where the insulating layer under the end portion of the semiconductor layer and in the periphery thereof (a base insulating layer) is removed by washing using fluorinated acid or the like accompanied with etching or various steps for processing the semiconductor layer into an island shape, the semiconductor layer can be sufficiently covered. Accordingly, short-circuiting between the semiconductor layer and the gate electrode layer, occurrence of a leakage current, electrostatic discharge, or the like due to insufficient coverage with the gate insulating layer at the end portion of the semiconductor layer can be prevented.

Note that, as for the gate insulating layer formed of the second insulating layer 310 and the third insulating layer 312, the thickness in the region which is in contact with the side surface of the second semiconductor layer 313 is preferably larger than that over the one surface of the second semiconductor layer 313. The thickness in the region which is in contact with the side surface of the second semiconductor layer 313 is preferably more than or equal to 1 times and less than or equal to 3 times the thickness of the one surface of the second semiconductor layer 313. For example, given that a perpendicular distance between the one surface of the second semiconductor layer 313 and the top surface of the gate insulating layer is a thickness t1, and a perpendicular distance between the side surface of the second semiconductor layer 313 and the top surface of the gate insulating layer is a thickness t2, it is preferable for the gate insulating layer to satisfy t1<t2. Note that the thickness of the gate insulating layer in the region which is in contact with the side surface of the second semiconductor layer 313 is not necessarily a constant value. In this case, the minimum value of the thickness t2 is preferably equal to or larger than the thickness t1. As a result of this, the end portion of the semiconductor layer can be covered with the gate insulating layer enough.

Further, as for the gate insulating layer formed of the second insulating layer 310 and the third insulating layer 312, the dielectric constant in the region which is in contact with the side surface of the second semiconductor layer 313 is preferably lower than that in the region over the one surface of the second semiconductor layer 313. For example, by decreasing the dielectric constant of the second insulating layer 310 as compared to that of the third insulating layer 312, the dielectric constant of the gate insulating layer in the region which is in contact with the side surface of the second semiconductor layer 313 can be low. Preferably, a low-dielectric constant material in which the dielectric constant is 4 or less is used for forming the second insulating layer 310. In the gate insulating layer, by decreasing the dielectric constant in the region which is in contact with the side surface of the semiconductor layer as compared to that over the one surface of the semiconductor layer, concentration of electric field at the end portion of the semiconductor layer can be prevented and insufficient insulation of the gate insulating layer can be reduced, which is preferable.

Next, the conductive layer 314 that functions as a gate electrode is formed over the second semiconductor layer 313 with the third insulating layer 312 interposed therebetween. Then, an impurity element which imparts one conductivity type is added into the second semiconductor layer 313 with the conductive layer 314 as a mask. An impurity region formed in the second semiconductor layer 313 at this time forms a part of an LDD region.

Next, an insulating layer 315 which is in contact with the side surface of the conductive layer 314 is formed. Then, with the insulating layer 315 and the conductive layer 314 as a mask, an impurity element which imparts one conductivity type is added, whereby a channel formation region 316, the low-concentration impurity regions 317 which function as LDD regions, and the high-concentration impurity regions 318 which function as source and drain regions are formed (see FIG. 3E).

The conductive layer 314 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer 314 can be processed into a desired shape by selective etching after being formed over the entire surface by a CVD method or a sputtering method. Further, the conductive layer 314 has either a single layer structure or a stacked-layer structure. The conductive layer 314 is formed to have a thickness in the range of 100 nm to 1000 nm, preferably 200 nm to 800 nm, and more preferably 300 nm to 500 nm.

The insulating layer 315 is formed of an insulating layer having a single layer structure or a stacked-layer structure by a CVD method or a sputtering method using an inorganic material such as silicon oxide, silicon nitride, silicon oxynitride, or silicon nitride oxide, or an organic material such as an organic resin. The insulating layer is selectively etched by anisotropic etching mainly in a vertical direction, so that the insulating layer 315 which is in contact with the side surface of the conductive layer 314 can be formed. The insulating layer 315 is also called a sidewall. Here, the surface of the insulating layer 315, on the side which is not in contact with the side surface of the conductive layer 314 is curved. Specifically, the insulating layer 315 is formed such that an appropriate curvature is provided to curve convexly with respect to the side surface of the conductive layer 314 which is in contact with the insulating layer 315. It is needless to say that the present invention is not limited particularly thereto, and the insulating layer 315 may have a shape having a corner instead of a rounded shape. Note that the insulating layer 315 also functions as a doping mask for forming the LDD region.

The second semiconductor layer 313 includes the channel formation region 316, the low-concentration impurity regions 317, and the high-concentration impurity regions 318. The channel formation region 316 is formed in the region which almost agrees with the conductive layer 314 with the third insulating layer 312 interposed therebetween. Each low-concentration impurity region 317 is formed in the region which almost agrees with the insulating layer 315 with the third insulating layer 312 interposed therebetween, and is formed between each high-concentration impurity region 318 and the channel formation region 316. Note that the low-concentration impurity regions 317 are not necessarily formed.

As compared to the low-concentration impurity regions 317, the concentration of the impurity element in each high-concentration impurity region 318 is high. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 320 to which the present invention is applied can be formed.

Note that after the impurity element which imparts one conductivity type is added into the second semiconductor layer 313, a heat treatment may be performed to activate the impurity element added. The heat treatment can be performed by laser beam irradiation, RTA, or using an annealing furnace. Specifically, the heat treatment may be performed at a temperature of 400° C. to 700° C., and preferably 500° C. to 550° C. Further, the heat treatment is preferably performed in a nitrogen atmosphere. For example, activation can be performed by heating at 550° C. for 4 hours. Further, when the second semiconductor layer 313 includes an amorphous region, recrystallization of the semiconductor layer can also be performed together with the activation of the impurity element by performing heat treatment.

Further, a TFT can also be manufactured by using a manufacturing method shown in FIGS. 4A to 4C or FIGS. 4D to 4F. Each method is the same as that shown in FIGS. 3A and 3B up to and including forming the island-shaped semiconductor layer 306 over the substrate 300 with the insulating layers 302 and 304 that function as a base insulating layer interposed therebetween and then forming the first insulating layer 308 over the semiconductor layer 306; therefore, description thereof is omitted.

Figure 4A:
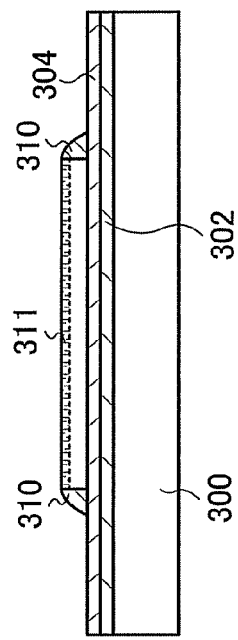
FIGS. 4A to 4F show an example of a manufacturing method of a semiconductor device according to the present invention.
Figure 4B:
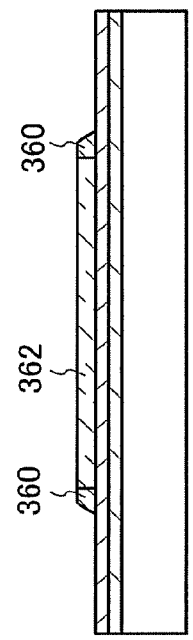
Figure 4C:
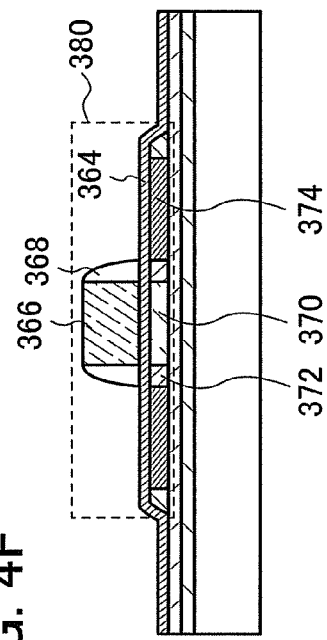

First, the manufacturing method shown in FIGS. 4A to 4C is described. After the first insulating layer 308 is formed over the first semiconductor layer 306 (see FIG. 3B), the first insulating layer 308 is selectively etched by anisotropic etching mainly in a vertical direction to form a second insulating layer 330 which is in contact with the side surface of the semiconductor layer 306. The top-layer portion of the first semiconductor layer 306 is made amorphous to form an amorphous region 331 (see FIG. 4A). At this time, the etching condition is controlled such that the second insulating layer 330 which is in contact with the side surface of the first semiconductor layer 306 has a vertical height from the bottom surface (the surface which is in contact with the insulating layer 304), which is lower than that of the first semiconductor layer 306. Preferably, the vertical height from the bottom surface of the second insulating layer 330 is almost equal to the height from the bottom surface to the amorphous region 331 in the first semiconductor layer 306.

The second insulating layer 330 can be processed into a desired shape by changing the etching condition such as a gas sort, a gas flow ratio, or the like of an etching gas. For example, by increasing the etching selection ratio of the first insulating layer 308 with respect to another layer (the first semiconductor layer 306), the vertical height from the bottom surface of the second insulating layer 330 can be made lower than the first semiconductor layer 306. That is, the amorphous region 331 and the second insulating layer 330 can also be prevented from being in contact with each other.

Next, the amorphous region 331 formed in the top-layer portion of the first semiconductor layer 306 is selectively etched, whereby a second semiconductor layer 332 is formed (see FIG. 4B). Note that the etching selection ratio of the amorphous region 331 cannot be obtained when the first semiconductor layer 306 is made from crystalline silicon; therefore, thickness of the amorphous region 331 is controlled to some extent in advance, and the first semiconductor layer 306 is etched in a vertical direction to the depth which is assumed as the depth where the amorphous region 331 is formed. Here, the second insulating layer 330 is formed so as not to be in contact with the amorphous region 331. Accordingly, after etching of the amorphous region 331, the second insulating layer 330 can be made so as not to stick out convexly.

Next, a third insulating layer 334 is formed over the second semiconductor layer 332 and the second insulating layer 330. The second insulating layer 330 and the third insulating layer 334 function as a gate insulating layer. Next, a conductive layer 336 that functions as a gate electrode is formed over the second semiconductor layer 332 with the third insulating layer 334 interposed therebetween. An impurity element which imparts one conductivity type is added into the second semiconductor layer 332 with the conductive layer 336 as a mask. An impurity region formed in the second semiconductor layer 332 at this time forms a part of an LDD region. Next, an insulating layer 338 which is in contact with the side surface of the conductive layer 336 is formed. Then, with the insulating layer 338 and the conductive layer 336 as a mask, an impurity element which imparts one conductivity type is added, whereby a channel formation region 340, low-concentration impurity regions 342 which function as LDD regions, and high-concentration impurity regions 344 which function as source and drain regions are formed. Through the above, a TFT 350 can be formed (see FIG. 4C). Note that the method by which the third insulating layer 334 is formed, the conductive layer 336 and the insulating layer 338 are formed, and the channel formation region 340, the low-concentration impurity regions 342, and the high-concentration impurity regions 344 are formed in the second semiconductor layer is similar to that shown in FIGS. 3D and 3E, and therefore, the description thereof is omitted.

Figure 4D:
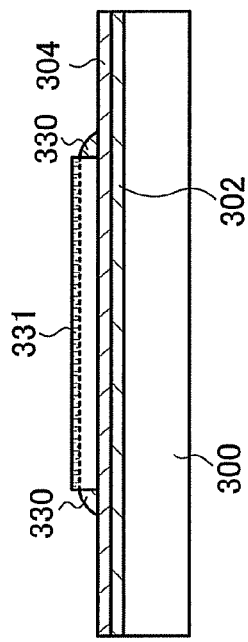
Figure 4E:
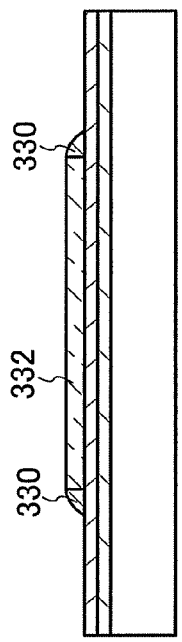
Figure 4F:
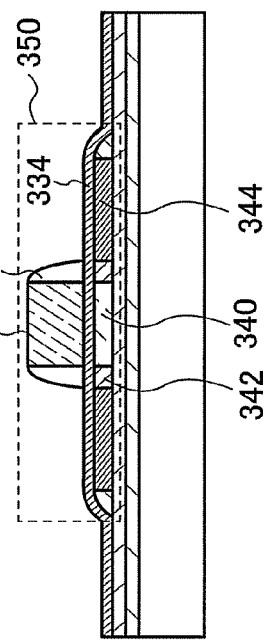

Next, the manufacturing method shown in FIGS. 4D to 4F is described. After the first insulating layer 308 is formed over the first semiconductor layer 306 (see FIG. 3B), the first insulating layer 308 is selectively etched by anisotropic etching mainly in a vertical direction to form the second insulating layer 310 which is in contact with the side surface of the semiconductor layer 306. The top-layer portion of the first semiconductor layer 306 is made amorphous to form the amorphous region 311 (see FIGS. 3C and 4D).

Next, the amorphous region 311 formed in the top-layer portion of the first semiconductor layer 306 and the second insulating layer 310 are selectively etched by anisotropic etching mainly in a vertical direction, whereby a second semiconductor layer 362 and a third insulating layer 360 are formed (see FIG. 4E). The amorphous region 311 and the second insulating layer 310 are etched under the etching condition in which the etching selection ratio is extremely small, that is, the etching selection ratio is near 1. By thus doing, the vertical height from the bottom surface (the surface which is in contact with the insulating layer 304) can be almost the same in the second semiconductor layer 362 and the third insulating layer 360 formed by the etching.

Next, a fourth insulating layer 364 is formed so as to cover the second semiconductor layer 362 and the third insulating layer 360. The third insulating layer 360 and the fourth insulating layer 364 function as a gate insulating layer. Next, a conductive layer 366 that functions as a gate electrode is formed over the second semiconductor layer 362 with the fourth insulating layer 364 interposed therebetween. An impurity element which imparts one conductivity type is added into the second semiconductor layer 362 with the conductive layer 366 as a mask. An impurity region formed in the second semiconductor layer 362 at this time forms a part of an LDD region. Next, an insulating layer 368 which is in contact with the side surface of the conductive layer 366 is formed. Then, with the insulating layer 368 and the conductive layer 366 as a mask, an impurity element which imparts one conductivity type is added, whereby a channel formation region 370, low-concentration impurity regions 372 which function as LDD regions, and high-concentration impurity regions 374 which function as source and drain regions are formed. Through the above, a TFT 380 can be formed (see FIG. 4F). Note that the method by which the fourth insulating layer 364 is formed, the conductive layer 366 and the insulating layer 368 are formed, and the channel formation region 370, the low-concentration impurity regions 372, and the high-concentration impurity regions 374 are formed in the second semiconductor layer is similar to that shown in FIGS. 3D and 3E, and therefore, the description thereof is omitted. Note that the fourth insulating layer 364 corresponds to the third insulating layer 312.

Through the above, the thin film transistors 320, 350, and 380 to which the present invention is applied can be formed. Note that each structure of the TFT described in this embodiment mode is just an example, and the present invention is not limited to the structures shown. For example, a multi-gate structure, which includes a semiconductor layer including two or more channel formation regions connected in series and two or more gate electrode layers by which an electric field is applied to the channel formation regions, may be employed. Further, an LDD region may be formed in the semiconductor layer of the TFT.

Although the example in which an insulating layer is formed so as to be in contact with the side surface of a conductive layer that functions as a gate electrode and LDD regions are formed in a semiconductor layer is described in this embodiment mode, the present invention is not particularly limited. The structure as described in Embodiment Mode 1 may be employed, and the side surface of the gate electrode may be tapered. Further, the gate electrode may employ a stacked-layer structure including two conductive layers, and the taper angle may be different in the layers.

In a semiconductor device manufactured by applying the present invention, a defect due to an end portion of a semiconductor layer can be prevented. In particular, a defect such as insufficient coverage with the gate insulating layer at the end portion of the semiconductor layer, dielectric breakdown, electrostatic discharge, or a leakage current of the gate insulating layer due to concentration of electric field at the end portion of the semiconductor layer can be prevented or reduced. Therefore, a highly reliable semiconductor device can be manufactured. Further, high-yield manufacturing of semiconductor devices can also be realized by applying the present invention.

Note that this embodiment mode can be combined with any other embodiment mode in this specification as appropriate.

Embodiment Mode 3

In this embodiment mode, an example of manufacturing a semiconductor device by a manufacturing method that is different from that of foregoing Embodiment Mode 1 is described with reference to FIGS. 5A to 5E.

Figure 5A:
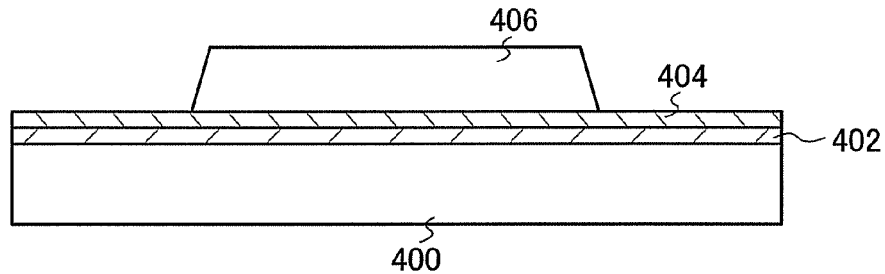
FIGS. 5A to 5E show an example of a manufacturing method of a semiconductor device according to the present invention.

First, a first semiconductor layer 406 is formed over a substrate 400 with an insulating layer 402 and an insulating layer 404 that function as a base insulating layer interposed therebetween (see FIG. 5A). Next, a first insulating layer 408 is formed to cover the first semiconductor layer 406 (see FIG. 5B). Up to and including the formation of the first insulating layer 408, the description made on the substrate 100, the insulating layer 102, the insulating layer 104, the semiconductor layer 106, and the insulating layer 107 in Embodiment Mode 1 can be referred to, and therefore, the description thereof is roughly made below.

As the substrate 400, a substrate having an insulating surface such as a glass substrate or a quartz substrate can be used. Each of the insulating layers 402 and 404 is formed by a CVD method or a sputtering method, using silicon oxide, silicon nitride, silicon oxynitride, silicon nitride oxide, or the like. The first semiconductor layer 406 is formed by a CVD method or a sputtering method, using a semiconductor material such as silicon, germanium, or silicon germanium. Here, the semiconductor layer 406 that is island-shaped is formed by forming an amorphous semiconductor layer using a material mainly containing silicon, crystallizing the amorphous semiconductor layer, and then performing selective etching. The thickness of the first semiconductor layer 406 may be within the range of 10 nm to 150 nm, and preferably within the range of 30 nm to 100 nm. Further, the first semiconductor layer 406 may be formed such that the end portion has a vertical shape or a tapered shape. In this embodiment mode, the first semiconductor layer 406 is formed such that the end portion may be tapered at a taper angle of 30° or more and less than 85° or may be gently tapered at a taper angle of 45° or more and less than 60°. By making the end portion of the first semiconductor layer 406 a tapered shape such that the corner portion becomes gentle, concentration of electric field at the corner portion can be relaxed. Note that the present invention is not particularly limited, and as described in the above embodiment mode, the end portion of the first semiconductor layer 406 may also be tapered at a taper angle of 45° or more and less than 95°, and more preferably at a taper angle of 60° or more and less than 95° which is almost vertical.

The first insulating layer 408 is formed by a CVD method or a sputtering method, using a material such as silicon oxide, silicon nitride, silicon oxynitride, silicon nitride oxide, SiOF, SiOC, DLC, porous silica, or the like. Further, the first insulating layer 408 is formed to have a thickness that can sufficiently cover at least the end portion of the first semiconductor layer 406. The first insulating layer 408 is preferably formed to have a thickness that is 1.5 to 3 times thicker than that of the first semiconductor layer 406 thereunder. Note that the first insulating layer 408 is preferably formed of a material having the dielectric constant which is lower than that of an insulating layer 416 formed later over one surface of the semiconductor layer. The first insulating layer 408 forms a part of a gate insulating layer in a semiconductor device, and specifically, a part of a gate insulating layer in the region which is in contact with the side surface of the semiconductor layer. With an island-shaped semiconductor layer, concentration of electric field tends to occur at the end portion, in particular, the corner portion of the semiconductor layer. If the concentration of electric field occurs, insufficient insulation such as dielectric breakdown further tends to occur in the gate insulating layer. Therefore, by forming the first insulating layer 408 which is in contact with the side surface of the semiconductor layer with the use of a low-dielectric constant material as compared to the insulating layer formed over the one surface of the semiconductor layer, an electric field applied to the end portion of the semiconductor layer can be relaxed, which is preferable.

Next, the first insulating layer 408 is selectively etched by anisotropic etching mainly in a vertical direction to form the second insulating layer 410 which is in contact with the side surface of the first semiconductor layer 406. At this time, the top-layer portion of the first semiconductor layer 406 is made amorphous to form the amorphous region 412 (see FIG. 5C).

For example, a silicon oxynitride layer is formed as the insulating layer 404, a crystalline silicon layer is formed as the first semiconductor layer 406, and a silicon nitride oxide layer is formed as the first insulating layer 408. Then, the first insulating layer 408 is etched by anisotropic dry-etching mainly in a vertical direction. The etching progresses from the first insulating layer 408 formed over the one surface of the first semiconductor layer 406 and one surface of the insulating layer 404. Note that the thickness of the first insulating layer 408 is almost the same over the one surface of the first semiconductor layer 406 and the one surface of the insulating layer 404. Thus, by stopping etching when the one surface of the first semiconductor layer 406 is exposed, the first insulating layer 408 can be left only in the region which is in contact with the side surface of the first semiconductor layer 406 and the periphery thereof. The left first insulating layer 408 corresponds to the second insulating layer 410.

The etching method of the first insulating layer 408 is not particularly limited as long as anisotropic etching mainly in a vertical direction can be performed. For example, reactive ion etching of a parallel-plate type, a magnetron type, a dual-frequency type, an ECR type, a helicon type, an ICP type, or the like can be used. As an etching gas, a gas which can provide high etching selection ratio of the first insulating layer 408 with respect to another layer (the first semiconductor layer 406) is preferably selected. For example, by using a fluorine-based gas such as $CHF_3$, $CF_4$, $C_4F_8$, $C_2F_6$, $NF_3$, or the like, the insulating layer can be selectively etched. Further, an inert gas such as He, Ar, or Xe, an $O_2$ gas, or an $H_2$ gas may be added as needed. In this embodiment mode, etching of the first insulating layer 408 is performed by ICP reactive ion etching using a $CHF_3$ gas and a He gas as an etching gas. Note that by changing the etching condition as appropriate, the shape of the second insulating layer 410 can be controlled. In this embodiment mode, the second insulating layer 410 is formed such that the vertical height from the bottom surface (the surface which is in contact with the insulating layer 404) is almost the same as that of the first semiconductor layer 406. Further, the second insulating layer 410 is formed such that the surface thereof on the side which is not in contact with the side surface of the semiconductor layer is curved. Specifically, it is formed such that an appropriate curvature is provided and the surface is curved convexly with respect to the side surface of the semiconductor layer it is in contact with. It is needless to say that the present invention is not limited particularly thereto, and the second insulating layer 410 may have a shape having a corner instead of a rounded shape. Preferably, the corner portion of the second insulating layer 410 is made a gentle shape so that the coverage with a layer formed thereover (here, the insulating layer 416) can be improved.

An amorphous region 412 is formed by making the top-layer portion of the first semiconductor layer 406 amorphous due to energy of plasma or the like at the time of etching of the first insulating layer 408. The amorphous region 412 can be formed by appropriately controlling the thickness of the first semiconductor layer 406, the material of the first insulating layer 408, the etching condition of the first insulating layer 408, or the like. The amorphous region 412 is formed to have a thickness that is 0.2 to 0.6 times, and preferably about 0.3 to 0.5 times thicker than that of the first semiconductor layer 406. Note that the amorphous region 412 is formed from the top surface of the first semiconductor layer 406 (the surface which is opposite to the surface which is in contact with the insulating layer 404) in a vertical direction. Further, the first semiconductor layer 406 is also preferably formed to be thick in advance in consideration of the region to be made amorphous at the time of etching for forming the second insulating layer 410.

Next, the amorphous region 412 formed in the top-layer portion of the first semiconductor layer 406 is selectively etched, whereby a second semiconductor layer 414 is formed. Note that the amorphous region 412 has a low etching selection ratio when the first semiconductor layer 406 is made from crystalline silicon; therefore, the thickness of the amorphous region 412 is controlled to some extent in advance, and the first semiconductor layer 406 is etched in a vertical direction to the depth which is assumed as the depth where the amorphous region 412 is formed. Next, the third insulating layer 416 is formed so as to cover the second insulating layer 410 and the second semiconductor layer 414 (see FIG. 5D).

The second semiconductor layer 414 is formed by selectively etching the amorphous region 412 formed in the top layer portion of the first semiconductor layer 406. For example, a crystalline silicon layer is formed as the first semiconductor layer 406. A top layer portion of the first semiconductor layer 406 formed of a crystalline silicon layer is made amorphous to form an amorphous silicon layer when the second insulating layer 410, which is in contact with a side surface of the first semiconductor layer 406, is formed by etching. The amorphous silicon layer formed at this time corresponds to the amorphous region 412 in this embodiment mode. Therefore, by selectively etching the amorphous silicon layer that is the amorphous region 412, a crystalline silicon layer is left as the second semiconductor layer 414. Here, the second semiconductor layer 414 is formed such that the end portion is gently tapered at a taper angle of 30° or more and less than 85°, and more preferably 45° or more and less than 60°. Note that the present invention is not particularly limited, and as described in the above embodiment mode, the second semiconductor layer 414 may also be formed such that the end portion has a taper angle of 45° or more and less than 95°, and more preferably 60° or more and less than 95° which is almost vertical. The second insulating layer 410 which is in contact with the side surface of the first semiconductor layer 406 is left as it is even after etching of the amorphous region 412, and it is stuck up convexly with respect to the second semiconductor layer 414.

In this embodiment mode, an amorphous silicon layer is formed with a thickness of 66 nm and then crystallized by a laser crystallization method to obtain the first semiconductor layer 406. After a silicon oxynitride layer with a thickness of 200 nm is formed as the first insulating layer 408, the second insulating layer 410 is formed by etching mainly in a vertical direction. The etching is performed by ICP reactive ion etching. The amorphous region 412 formed at this time is selectively etched, whereby a crystalline silicon layer is formed as the second semiconductor layer 414 to have a thickness of 25 nm.

The third insulating layer 416 is formed by a CVD method or a sputtering method, using oxide silicon, nitride silicon, oxynitride silicon, nitride oxide silicon, nitride aluminum, or the like. The third insulating layer 416 is formed to have a single layer structure or a stacked-layer structure of at least one of the above materials. Further, the third insulating layer 416 can also be formed by solid phase oxidation or solid phase nitridation with a plasma treatment. For example, the second semiconductor layer 414 and the second insulating layer 410 are oxidized or nitrided by a high-density plasma treatment to form the third insulating layer 416. The third insulating layer 416 is formed to have a thickness in the range of 1 nm to 50 nm, preferably 1 nm to 20 nm, and more preferably 1 nm to 10 nm.

The second insulating layer 410 and the third insulating layer 416 formed as above function as a gate insulating layer. That is, the gate insulating layer of the present invention is formed of not a single body but a compound body including a plurality of insulating layers. By forming the second insulating layer 410 which is in contact with the side surface of the semiconductor layer and further forming the third insulating layer 416 over the one surface of the semiconductor layer, coverage with the gate insulating layer at the end portion of the semiconductor layer can be improved. Accordingly, short-circuiting between the semiconductor layer and the gate electrode, occurrence of a leakage current, or the like due to insufficient coverage with the gate insulating layer can be prevented. Furthermore, by improving the coverage with the gate insulating layer, electrostatic discharge of an element such as a transistor can be prevented.

Note that, as for the gate insulating layer formed of the second insulating layer 410 and the third insulating layer 416, the thickness in the region which is in contact with the side surface of the second semiconductor layer 414 is preferably thicker than that over the one surface of the second semiconductor layer 414. At this time, the thickness in the region which is in contact with the side surface of the second semiconductor layer 414 is preferably more than equal to 1 times and less than or equal to 3 times the thickness of the one surface of the second semiconductor layer 414. For example, given that a perpendicular distance between the one surface of the second semiconductor layer 414 and the top surface of the gate insulating layer is a thickness t1, and a perpendicular distance between the side surface of the second semiconductor layer 414 and the top surface of the gate insulating layer is a thickness t2, it is preferable for the gate insulating layer to satisfy t1<t2. Note that the thickness of the gate insulating layer in the region which is in contact with the side surface of the second semiconductor layer 414 is not necessarily a constant value. In this case, the minimum value of the thickness t2 is preferably equal to or larger than the thickness t1. By thus covering the end portion of the second semiconductor layer 414 with the gate insulating layer enough, and preferably, by increasing the thickness of the gate insulating layer in the region which is in contact with the side surface of the second semiconductor layer 414, an electric field applied to the end portion of the second semiconductor layer 414 can be relaxed, and occurrence of a leakage current, or the like can be prevented.

Further, as for the gate insulating layer formed of the second insulating layer 410 and the third insulating layer 416, the dielectric constant in the region which is in contact with the side surface of the second semiconductor layer 414 is preferably lower than that in the region over the one surface of the second semiconductor layer 414. For example, by decreasing the dielectric constant of the second insulating layer 410 as compared to that of the third insulating layer 416, the dielectric constant of the gate insulating layer in the region which is in contact with the side surface of the second semiconductor layer 414 can be low. Preferably, a low-dielectric constant material in which the dielectric constant is 4 or less is used for forming the second insulating layer 410. In the gate insulating layer, by decreasing the dielectric constant in the region which is in contact with the side surface of the semiconductor layer as compared to that over the one surface of the semiconductor layer, concentration of electric field at the end portion of the semiconductor layer can be relaxed and insufficient insulation of the gate insulating layer can be prevented.

Next, a stack of the conductive layer 417 and the conductive layer 418 that function as a gate electrode is formed over the second semiconductor layer 414 with the third insulating layer 416 interposed therebetween. Then, an impurity element which imparts one conductivity type is added into the second semiconductor layer 414 with the conductive layers 417 and 418 as a mask, whereby the channel formation region 420, the pair of low-concentration impurity regions 421 which function as LDD regions, and the pair of high-concentration impurity regions 422 which function as source and drain regions are formed (see FIG. 5E).

Each of the conductive layers 417 and 418 can be formed using a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer that functions as a gate electrode can be formed of at least one of the above materials to have either a single layer structure or a stacked-layer structure. The conductive layer is formed to have a thickness in the range of 100 nm to 1000 nm, preferably 200 nm to 800 nm, and more preferably 300 nm to 500 nm. Further, the conductive layer that functions as a gate electrode can be processed into a desired shape by selective etching after being formed over the entire surface by a CVD method or a sputtering method using any of the above-described materials.

The example in which a two-layer stack of the conductive layers 417 and 418 is formed as a gate electrode, the side surface of each layer is tapered, and the taper angle is different in the layers is described in this embodiment mode. By making the side surface of the conductive layer for forming the gate electrode a tapered shape, coverage with a layer formed thereover can be improved.

Further, in this embodiment mode, the conductive layers 417 and 418 are formed to have different widths (lengths in a direction almost parallel to a direction in which carriers flow in a channel forming region, i.e., a direction for connecting a source region and a drain region with each other). Specifically, the gate electrode is formed such that the width of the conductive layer 417 is larger than that of the conductive layer 418, that is, the width of the lower conductive layer is larger in the case where the gate electrode is formed of a two-layer structure. In this manner, by forming such that the width of the conductive layers is different, the low-concentration impurity regions 421 and the high-concentration impurity regions 422 are easily formed in the second semiconductor layer 414.

In this embodiment mode, the conductive layer 417 can function as a doping mask for forming the low-concentration impurity regions 421 when the impurity element which imparts one conductivity type is added into the second semiconductor layer 414. The conductive layer 418 functions as a doping mask for forming the channel formation region 420. Therefore, the channel formation region 420 is formed in the region which almost agrees with the conductive layer 418 with the third insulating layer 416 interposed therebetween, and the low-concentration impurity regions 421 are formed in the region which overlaps with the conductive layer 417 and does not overlap with the conductive layer 418. The high-concentration impurity regions 422 are formed in the region which does not overlap with the conductive layers 417 and 418. Note that the low-concentration impurity regions are not necessarily provided.

As compared to the low-concentration impurity region 421, the concentration of the impurity element in the high-concentration impurity region 422 is high. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 424 to which the present invention is applied can be formed.

Note that after the impurity element which imparts one conductivity type is added into the second semiconductor layer 414, a heat treatment may be performed to activate the impurity element added. The heat treatment can be performed by laser beam irradiation, RTA, or using an annealing furnace. Specifically, the heat treatment may be performed at a temperature of 400° C. to 700° C., and preferably 500° C. to 550° C. Further, the heat treatment is preferably performed in a nitrogen atmosphere. For example, activation can be performed by heating at 550° C. for 4 hours. Further, when the second semiconductor layer 414 includes an amorphous region, recrystallization of the semiconductor layer can also be performed together with the activation of the impurity element by performing heat treatment.

Figure 5B:
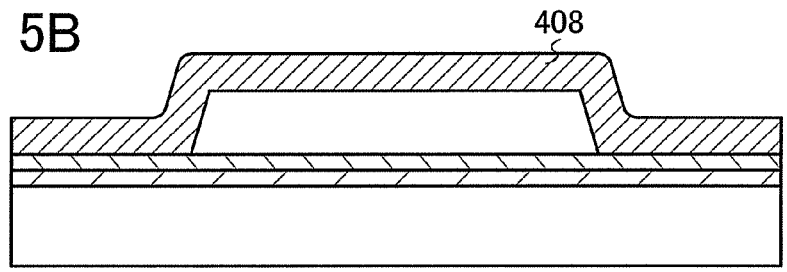
Figure 5C:
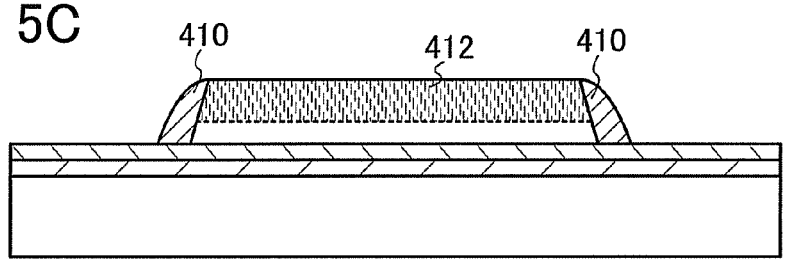
Figure 5D:
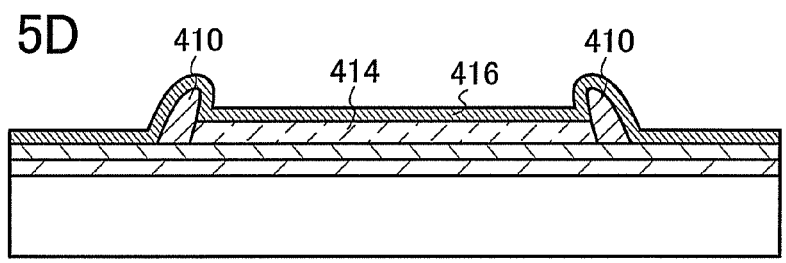
Figure 5E:
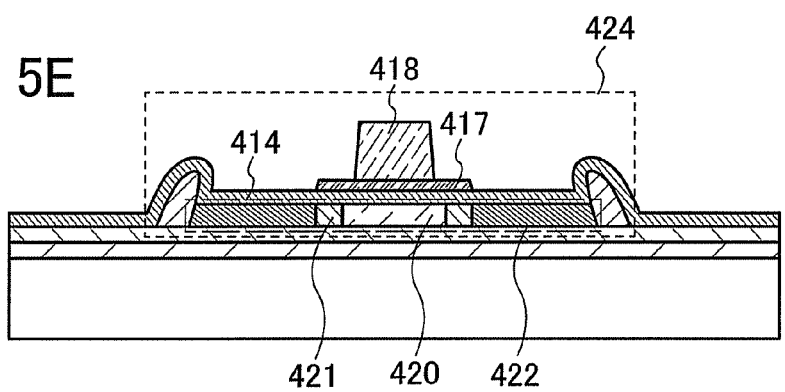

Further, a TFT can also be manufactured by using a manufacturing method shown in FIGS. 6A to 6C or FIGS. 6D to 6E Each method is the same as that shown in FIGS. 5A and 5B up to and including forming the first semiconductor layer 406 over the substrate 400 with the insulating layers 402 and 404 that function as a base insulating layer interposed therebetween, and then forming the first insulating layer 408 over the first semiconductor layer 406; therefore, the description thereof is omitted.

Figure 6D:
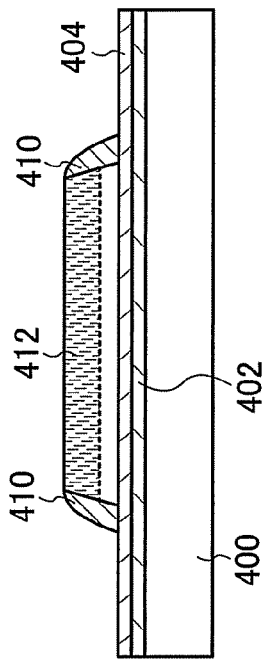
FIGS. 6A to 6F show an example of a manufacturing method of a semiconductor device according to the present invention.
Figure 6E:
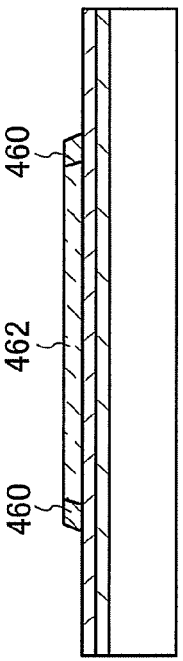
Figure 6F:
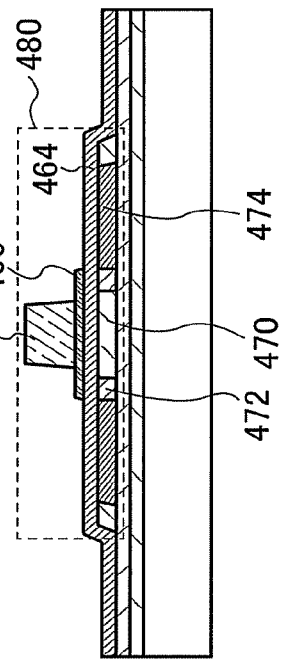
Figure 6A:
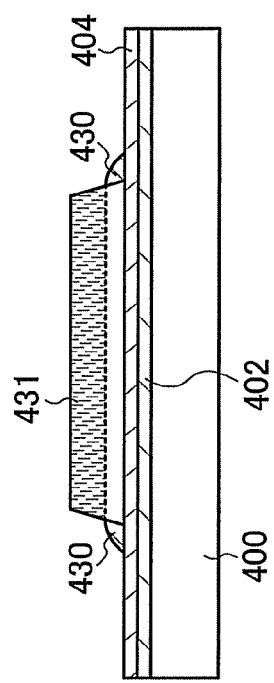
Figure 6B:
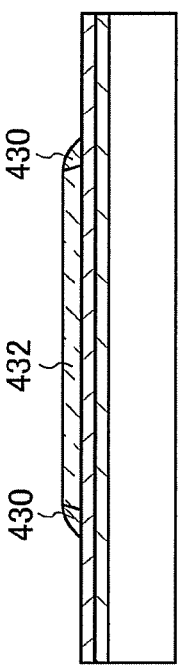
Figure 6C:
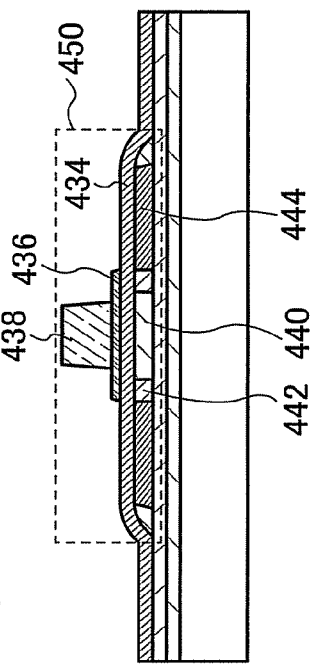

First, the manufacturing method shown in FIGS. 6A to 6C is described. After the first insulating layer 408 is formed over the first semiconductor layer 406 (see FIG. 5B), the first insulating layer 408 is selectively etched by anisotropic etching mainly in a vertical direction to form a second insulating layer 430 which is in contact with the side surface of the semiconductor layer 406. A region in a vertical direction from the top surface of the first semiconductor layer 406 is made amorphous to form an amorphous region 431 (see FIG. 6A). At this time, the etching condition is controlled such that the second insulating layer 430 which is in contact with the side surface of the first semiconductor layer 406 has a vertical height from the bottom surface (the surface which is in contact with the insulating layer 404), which is lower than that of the first semiconductor layer 406. Preferably, the vertical height from the bottom surface of the second insulating layer 430 is almost equal to the height from the bottom surface to the amorphous region 431 in the first semiconductor layer 406. That is, the etching condition is preferably controlled such that the amorphous region 431 and the second insulating layer 430 are not in contact with each other.

Next, the amorphous region 431 formed in the top-layer portion of the first semiconductor layer 406 is selectively etched, whereby a second semiconductor layer 432 is formed (see FIG. 6B). The second insulating layer 430 is formed so as not to be in contact with the amorphous region 431. Therefore, after etching of the amorphous region 431, the second insulating layer 430 is not stuck up convexly.

Next, a third insulating layer 434 is formed over the second semiconductor layer 432 and the second insulating layer 430. The second insulating layer 430 and the third insulating layer 434 function as a gate insulating layer. Next, a stack of a conductive layer 436 and a conductive layer 438 that function as a gate electrode is formed over the second semiconductor layer 432 with the third insulating layer 434 interposed therebetween. An impurity element which imparts one conductivity type is added into the second semiconductor layer 432 with the conductive layers 436 and 438 as a mask, whereby a channel formation region 440, low-concentration impurity regions 442 which function as LDD regions, and high-concentration impurity regions 444 which function as source and drain regions are formed. Through the above, a TFT 450 can be formed (see FIG. 6C). Note that the method from the formation of the third insulating layer 434, through the formation of the conductive layers 436 and 438, up to and including the formation of the channel formation region 440, the low-concentration impurity regions 442, and the high-concentration impurity regions 444 in the second semiconductor layer 432 is similar to that shown in FIGS. 5D and 5E, and therefore, the description thereof is omitted.

Next, the manufacturing method shown in FIGS. 6D to 6F is described. After the first insulating layer 408 is formed over the first semiconductor layer 406 (see FIG. SB), the first insulating layer 408 is selectively etched by anisotropic etching mainly in a vertical direction to form the second insulating layer 410 which is in contact with the side surface of the first semiconductor layer 406. A region in a vertical direction from the top surface of the first semiconductor layer 406 is made amorphous to form the amorphous region 412 (see FIGS. 5C and 6D).

Next, the amorphous region 412 formed in the top-layer portion of the first semiconductor layer 406 and the second insulating layer 410 are selectively etched by anisotropic etching mainly in a vertical direction, whereby a second semiconductor layer 462 and a third insulating layer 460 are formed (see FIG. 6E). The amorphous region 412 and the second insulating layer 410 are etched under an etching condition in which the etching selection ratio is extremely small, or the etching selection ratio is near 1. That is, the amorphous region 412 and the second insulating layer 410 are etched at almost the same etching rate. By thus doing, the vertical height from the bottom surface (the surface which is in contact with the insulating layer 404) can be almost the same in the second semiconductor layer 462 and the third insulating layer 460 formed by the etching.

Next, a fourth insulating layer 464 is formed over the second semiconductor layer 462 and the third insulating layer 460. The third insulating layer 460 and the fourth insulating layer 464 function as a gate insulating layer. Next, conductive layers 466 and 468 which function as a gate electrode are formed over the second semiconductor layer 462 with the fourth insulating layer 464 interposed therebetween. An impurity element which imparts one conductivity type is added into the second semiconductor layer 462 with the conductive layers 466 and 468 as a mask, whereby a channel formation region 470, low-concentration impurity regions 472 which function as LDD regions, and high-concentration impurity regions 474 which function as source and drain regions are formed. Through the above, a TFT 480 can be formed (see FIG. 6F). The method from the formation of the fourth insulating layer 464, through the formation of the conductive layers 466 and 468, up to and including the formation of the channel formation region 470, the low-concentration impurity regions 472, and the high-concentration impurity regions 474 in the second semiconductor layer 462 is similar to that shown in FIGS. 5D and 5E, and therefore, the description thereof is omitted. Note that the fourth insulating layer 464 corresponds to the third insulating layer 416.

Through the above, the thin film transistors 424, 450, and 480 to which the present invention is applied can be formed. Note that each structure of the TFT described in this embodiment mode is just an example, and the present invention is not limited to the structures shown. For example, a multi-gate structure, which includes a semiconductor layer including two or more channel formation regions connected in series and two or more gate electrode layers by which an electric field is applied to the channel formation regions, may be employed. Further, an LDD region may be formed in the semiconductor layer of the TFT.

Although the example in which a stack of two conductive layers in which the taper angle is different in the layers is formed as a gate electrode is described in this embodiment mode, the present invention is not particularly limited. The gate electrode may also be formed of a single layer of a conductive layer, and the side surface of the conductive layer may be tapered. Further, an insulating layer which is also called a sidewall may also be formed so as to be in contact with the side surface of the conductive layer.

In a thin film transistor manufactured by applying the present invention, defects due to an end portion of a semiconductor layer can be reduced. In particular, insufficient coverage with the gate insulating layer at the end portion of the semiconductor layer can be prevented. Further, concentration of electric field at the end portion of the semiconductor layer can be relaxed. Accordingly, short-circuiting between the semiconductor layer and the gate electrode, dielectric breakdown or electrostatic discharge of the gate insulating layer, and a leakage current due to such a defect can be prevented or reduced. Therefore, a highly reliable semiconductor device can be manufactured. Further, high-yield manufacturing of semiconductor devices can also be realized.

Further, by applying the present invention, thinning of the semiconductor layer can also be realized in addition to reducing the above-described defect due to the end portion of the semiconductor layer. Further, a defect near the end portion of the semiconductor layer due to thinning of the semiconductor layer can also be prevented.

This embodiment mode can be combined with any other embodiment mode in this specification as appropriate.

Embodiment Mode 4

In this embodiment mode, an example of manufacturing a semiconductor device by a manufacturing method which is different from those in above Embodiment Modes 1 to 3 is described with reference to FIGS. 7A to 7E.

Figure 7A:
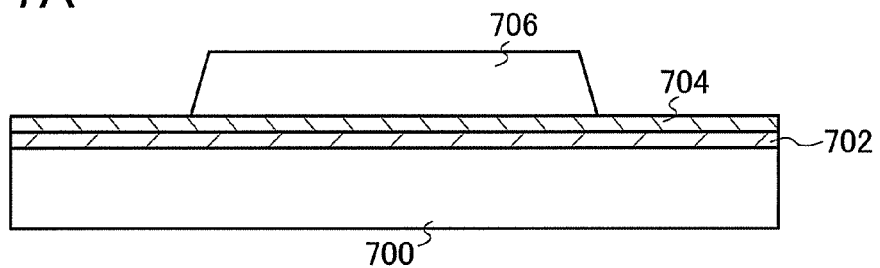
FIGS. 7A to 7E show an example of a manufacturing method of a semiconductor device according to the present invention.
Figure 7B:
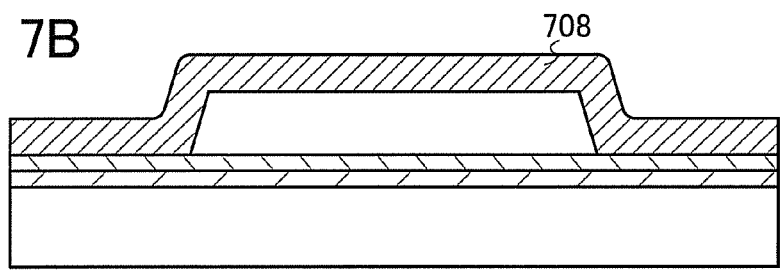

First, a first semiconductor layer 706 is formed over a substrate 700 with an insulating layer 702 and an insulating layer 704 that function as a base insulating layer interposed therebetween (see FIG. 7A). Next, a first insulating layer 708 is formed to cover the first semiconductor layer 706 (see FIG. 7B). Up to and including the formation of the first insulating layer 708, the description made on the substrate 400, the insulating layer 402, the insulating layer 404, the semiconductor layer 406, and the first insulating layer 408 in Embodiment Mode 3 can be referred to, and therefore, the description thereof is roughly made below.

As the substrate 700, a substrate with an insulating surface such as a glass substrate or a quartz substrate can be used. Each of the insulating layers 702 and 704 is formed by a CVD method or a sputtering method, using silicon oxide, silicon nitride, silicon oxynitride, silicon nitride oxide, or the like. The first semiconductor layer 706 is formed by a CVD method or a sputtering method, using a semiconductor material such as silicon, germanium, or silicon germanium. Here, the first semiconductor layer 706 that is island-shaped is formed by forming an amorphous semiconductor layer using a material mainly containing silicon, crystallizing the amorphous semiconductor layer, and then performing selective etching. The thickness of the first semiconductor layer 706 may be 10 nm to 150 nm, preferably 30 nm to 100 nm, and more preferably 60 nm to 70 nm. Further, the first semiconductor layer 706 may be formed such that the end portion has a vertical shape or a tapered shape. In this embodiment mode, the first semiconductor layer 706 is formed such that the end portion may be tapered at a taper angle of 30° or more and less than 85° or may be gently tapered at a taper angle of 45° or more and less than 60°. By making the end portion of the first semiconductor layer 706 a tapered shape such that the corner portion becomes gentle, concentration of electric field at the corner portion can be relaxed. Note that the present invention is not particularly limited, and as described in the above embodiment mode, the end portion of the first semiconductor layer 706 may also be tapered at a taper angle of 45° or more and less than 95°, and more preferably at a taper angle of 60° or more and less than 95° which is almost vertical.

The first insulating layer 708 is formed using a material such as silicon oxide, silicon nitride, silicon oxynitride, silicon nitride oxide, SiOF, SiOC, DLC, porous silica, or the like by a CVD method or a sputtering method. Further, the first insulating layer 708 is formed to have a thickness that can sufficiently cover at least the end portion of the first semiconductor layer 706. The first insulating layer 708 is preferably formed to have a thickness that is 1.5 to 3 times thicker than that of the first semiconductor layer 706 thereunder. Note that the first insulating layer 708 is preferably formed of a material having a lower dielectric constant than an insulating layer 716 formed later over one surface of the semiconductor layer. The first insulating layer 708 forms a part of a gate insulating layer in a semiconductor device to be completed later, and specifically, a part of a gate insulating layer in the region which is in contact with the side surface of the semiconductor layer. By forming the first insulating layer 708 using a material with a small dielectric constant, concentration of an electric field or static electricity at an end portion, in particular, a corner portion of the semiconductor layer, can be relaxed. As a result, a defect of the gate insulating layer such as dielectric breakdown or electrostatic discharge can be prevented, as well as a leakage current due to such a defect.

Figure 7C:
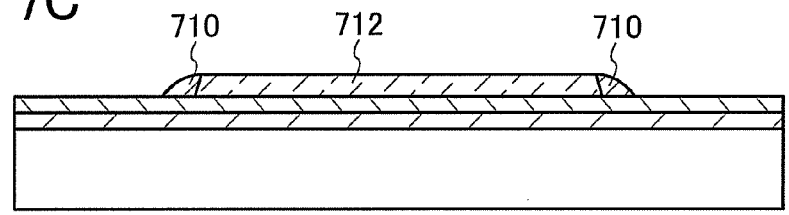

Next, the first insulating layer 708 and the first semiconductor layer 706 are etched overall and thinned by anisotropic etching mainly in a vertical direction, to form a second insulating layer 710 that is in contact with a side surface of the second semiconductor layer 712 (see FIG. 7C).

The first insulating layer 708 and the first semiconductor layer 706 are etched under a condition in which the etching selection ratio is extremely small (a condition in which the etching selection ratio is near 1). That is, the first insulating layer 708 and the first semiconductor layer 706 are etched at almost the same etching rate. By thus doing, the vertical height from the bottom surface (the surface which is in contact with the insulating layer 704) can be almost the same in the second semiconductor layer 712 and the second insulating layer 710 that are formed by etching.

The etching method of the first insulating layer 708 and the first semiconductor layer 706 is not particularly limited as long as anisotropic etching mainly in a vertical direction can be performed. For example, reactive ion etching of a parallel-plate type, a magnetron type, a dual-frequency type, an ECR type, a helicon type, an ICP type, or the like can be used.

As an etching gas, a gas that can provide an extremely small etching selection ratio between the first insulating layer 708 and the first semiconductor layer 706, that is, a gas that can provide an etching selection ratio that is near 1, may be appropriately selected. For example, by appropriately adding $O_2$ gas to a fluorine-based gas such as $CHF_3$, $CF_4$, $C_4F_8$, $C_2F_6$, or $NF_3$, the etching selection ratio between the two layers can be made to be low. Further, an inert gas of He, Ar, Xe or the like may be added as appropriate. Furthermore, instead of the fluorine-based gas, HBr gas or a mixed gas of HBr and $Cl_2$ may be used as the etching gas. In the case of using HBr gas, an inert gas of He, Ar, or the like may also be appropriately added.

Note that the first insulating layer 708 and the first semiconductor layer 706 are etched and thinned so that the thickness of the second semiconductor layer 712 after etching is about 0.2 to 0.8 times, preferably 0.4 times to 0.6 times the thickness of the first semiconductor layer 706. In this embodiment mode, after forming the first semiconductor layer to have a thickness in the range of 60 nm to 70 nm, overall etching is performed to form the second semiconductor layer 712 to have a thickness in the range of 20 nm to 30 nm. Further, the second semiconductor layer 712 is formed such that the end portion is gently tapered at a taper angle of 30° or more and less than 85°, and more preferably 45° or more and less than 60°. Note that the present invention is not particularly limited, and as described in the above embodiment mode, the second semiconductor layer 712 may also be formed such that the end portion has a taper angle of 45° or more and less than 95°, and more preferably 60° or more and less than 95° which is almost vertical.

Figure 7D:
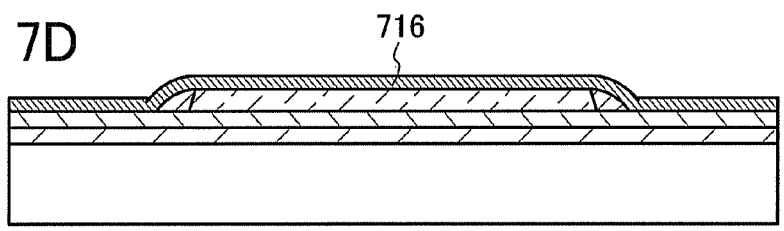
Figure 7E:
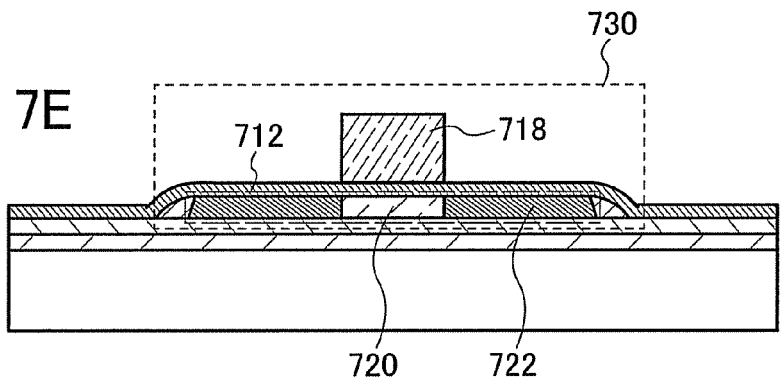

Next, the third insulating layer 716 is formed to cover the second semiconductor layer 712 and the second insulating layer 710 (see FIG. 7D).

The third insulating layer 716 is formed by a CVD method or a sputtering method, using a material such as silicon oxide, silicon nitride, silicon oxynitride, silicon nitride oxide, or aluminum nitride. The third insulating layer 716 is formed to have a single layer structure or a stacked-layer structure of at least one of the above materials. Further, the third insulating layer 716 can also be formed by solid phase oxidation or solid phase nitridation with a plasma treatment. For example, the second semiconductor layer 712 and the second insulating layer 710 are oxidized or nitrided by a high-density plasma treatment to form the third insulating layer 716. The third insulating layer 716 is formed to have a thickness in the range of 1 nm to 50 nm, preferably 1 nm to 20 nm, and more preferably 1 nm to 10 nm.

The second insulating layer 710 and the third insulating layer 716 formed as above function as a gate insulating layer. That is, the gate insulating layer of the present invention is formed of not a single body but a compound body including a plurality of insulating layers. By forming the second insulating layer 710 which is in contact with the side surface of the semiconductor layer and further forming the third insulating layer 716 over the one surface of the semiconductor layer, coverage with the gate insulating layer at the end portion of the semiconductor layer can be improved. Accordingly, short-circuiting between the semiconductor layer and a conductive layer forming the gate electrode due to insufficient coverage with the gate insulating layer, or electrostatic discharge can be prevented.

Note that, as for the gate insulating layer formed of the second insulating layer 710 and the third insulating layer 716, the thickness in the region which is in contact with the side surface of the second semiconductor layer 712 is preferably larger than that over the one surface of the second semiconductor layer 712. At this time, the thickness in the region which is in contact with the side surface of the second semiconductor layer 712 is preferably more than or equal to 1 times and less than or equal to 3 times the thickness of the one surface of the second semiconductor layer 712. For example, given that a perpendicular distance between the one surface of the second semiconductor layer 712 and the top surface of the gate insulating layer is a thickness t1, and a perpendicular distance between the side surface of the second semiconductor layer 712 and the top surface of the gate insulating layer is a thickness t2, it is preferable for the gate insulating layer to satisfy t1<t2. Note that the thickness of the gate insulating layer in the region which is in contact with the side surface of the second semiconductor layer 712 is not necessarily a constant value. In this case, the minimum value of the thickness t2 is preferably equal to or larger than the thickness t1. Accordingly, the end portion of the semiconductor layer can be sufficiently covered with the gate insulating layer. Preferably, by increasing the thickness of the gate insulating layer in the region which is in contact with the side surface of the second semiconductor layer 712, an electric field applied to the end portion of the second semiconductor layer 712 can be relaxed, and occurrence of a leakage current, or the like can be prevented.

Further, as for the gate insulating layer formed of the second insulating layer 710 and the third insulating layer 716, the dielectric constant in the region which is in contact with the side surface of the second semiconductor layer 712 is preferably lower than that in the region over the one surface of the second semiconductor layer 712. For example, by decreasing the dielectric constant of the second insulating layer 710 as compared to that of the third insulating layer 716, the dielectric constant of the gate insulating layer in the region which is in contact with the side surface of the second semiconductor layer 712 can be low. Preferably, a low-dielectric constant material in which the dielectric constant is 4 or less is used for forming the second insulating layer 710. In the gate insulating layer, by decreasing the dielectric constant in the region which is in contact with the side surface of the semiconductor layer as compared to that over the one surface of the semiconductor layer, it is preferable because stress such as excessive electric field being applied to the gate insulating layer locally can be prevented.

Next, a conductive layer 718 that functions as a gate electrode is formed over the second semiconductor layer 712 with the third insulating layer 716 interposed therebetween. Then, an impurity element which imparts one conductivity type is added into the second semiconductor layer 712 with the conductive layer 718 as a mask, whereby a channel formation region 720, and impurity regions 722 that function as a source region and a drain region are formed (see FIG. 7E).

The conductive layer 718 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer that functions as a gate electrode can be formed of at least one of the above materials to have either a single layer structure or a stacked-layer structure, and a thickness in the range of 100 nm to 1000 nm, preferably 200 nm to 800 nm, and more preferably 300 nm to 500 nm. Further, the conductive layer that functions as a gate electrode can be processed into a desired shape by selective etching after being formed over the entire surface by a CVD method or a sputtering method using any of the above-described materials.

As the impurity element which imparts one conductivity type, an impurity element which imparts an n-type conductivity such as phosphorus (P) or arsenic (As), or an impurity element which imparts a p-type conductivity such as boron (B), aluminum (Al), or gallium (Ga), can be used.

Accordingly, a thin film transistor 730 to which the present invention is applied can be formed.

Note that after the impurity element which imparts one conductivity type is added into the second semiconductor layer 712, a heat treatment may be performed to activate the impurity element added. The heat treatment can be performed by laser beam irradiation, RTA, or using an annealing furnace. Specifically, the heat treatment may be performed at a temperature of 400° C. to 700° C., and preferably 500° C. to 550° C. Further, the heat treatment is preferably performed in a nitrogen atmosphere. For example, activation can be performed by heating at 550° C. for 4 hours. Further, when the second semiconductor layer 712 includes an amorphous region, recrystallization of the semiconductor layer can also be performed together with the activation of the impurity element by performing heat treatment.

Note that each structure of the TFT described in this embodiment mode is an example, and the present invention is not limited to the structures shown. For example, a multi-gate structure, which includes a semiconductor layer including two or more channel formation regions connected in series and two or more gate electrode layers by which an electric field is applied to the channel formation regions, may be employed. Further, an LDD region may be formed in the semiconductor layer of the TFT.

In addition, the conductive layer that functions as a gate electrode may have side surface that has a tapered shape, or the conductive layer may have a stacked-layer structure in which each layer has a different taper angle. Further, an insulating layer which is called a sidewall may also be formed so as to be in contact with the side surface of the conductive layer.

In a thin film transistor manufactured by applying the present invention, defects due to an end portion of a semiconductor layer can be reduced. In particular, coverage at the end portion of the semiconductor layer with the gate insulating layer becomes favorable; therefore, short-circuiting between the semiconductor layer and the conductive layer forming the gate electrode, electrostatic discharge, or the like can be prevented. Further, since concentration of an electric field at the end portion of the semiconductor layer can be relaxed, insulation defect of the gate insulating layer such as dielectric breakdown or electrostatic discharge can be reduced. Accordingly, a semiconductor device with high reliability can be manufactured. In addition, high-yield manufacturing of semiconductor devices can also be realized.

Further, by applying the present invention, thinning of the semiconductor layer can be realized, as well as reducing the above-described defect due to the end portion of the semiconductor layer.

This embodiment mode can be combined with any other embodiment mode in this specification as appropriate.

Embodiment Mode 5

In this embodiment, an example of manufacturing a semiconductor device by a manufacturing method that is different from those of above Embodiment Modes 1 to 4 is described with reference to FIGS. 10A to 11C.

Figure 10A:
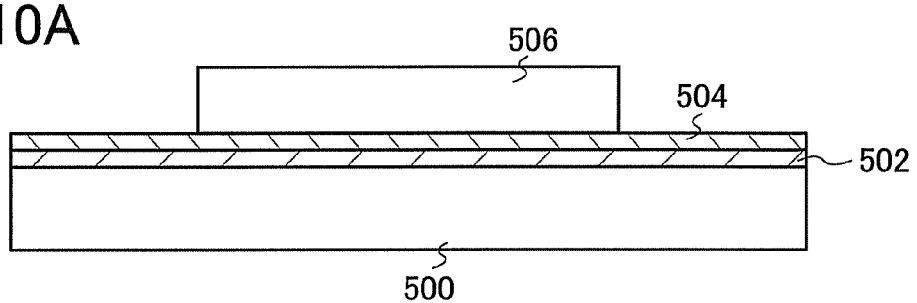
FIGS. 10A to 10D show an example of a manufacturing method of a semiconductor device according to the present invention.

First, a first semiconductor layer 506 is formed over a substrate 500 with an insulating layer 502 and an insulating layer 504 that function as a base insulating layer interposed therebetween (see FIG. 10A).

Up to and including the formation of the first semiconductor layer 506, the description made on the substrate 700, the insulating layer 702, the insulating layer 704, and the first semiconductor layer 706 in Embodiment Mode 4 can be referred to, and therefore, the description thereof is roughly made below.

As the substrate 500, a substrate having an insulating surface such as a glass substrate or a quartz substrate is used. Each of the insulating layers 502 and 504 is formed by a CVD method or a sputtering method, using silicon oxide, silicon nitride, silicon oxynitride, silicon nitride oxide, or the like. Note that the insulating layer that functions as a base insulating layer may have a single-layer structure or a stacked-layer structure. In this embodiment mode, a glass substrate is used as the substrate 500, and as the insulating layers 502 and 504, a silicon nitride oxide layer with a thickness of 50 nm and a silicon oxynitride layer with a thickness of 100 nm is stacked in this order.

The first semiconductor layer 506 is formed by a CVD method or a sputtering method, using a semiconductor material such as silicon, germanium, or silicon germanium. The semiconductor layer 506 is formed with a thickness in the range of 10 nm to 150 nm, preferably 40 nm to 80 nm. In this embodiment mode, an amorphous semiconductor layer is formed using a material mainly containing silicon, crystallizing the amorphous semiconductor layer, and then etching is performed selectively to form the first semiconductor layer 506 in an island shape. In addition, the first semiconductor layer 506 is formed with a thickness of 50 nm.

Further, the first semiconductor layer 506 may be formed such that the end portion has a vertical shape or a tapered shape. In this embodiment mode, the end portion of the first semiconductor layer 506 is formed to be tapered at a taper angle of 45° or more and less than 95°, and more preferably at a taper angle of 60° or more and less than 95° which is almost vertical. By making the taper shape of the end portion of the first semiconductor layer 506 steep, parasitic channel of a semiconductor device that is completed layer can be reduced. Note that that present invention is not particularly limited, and the first semiconductor layer 506 is formed such that the end portion may be tapered at a taper angle of 30° or more and less than 85° or may be gently tapered at a taper angle of 45° or more and less than 60°.

Figure 10B:
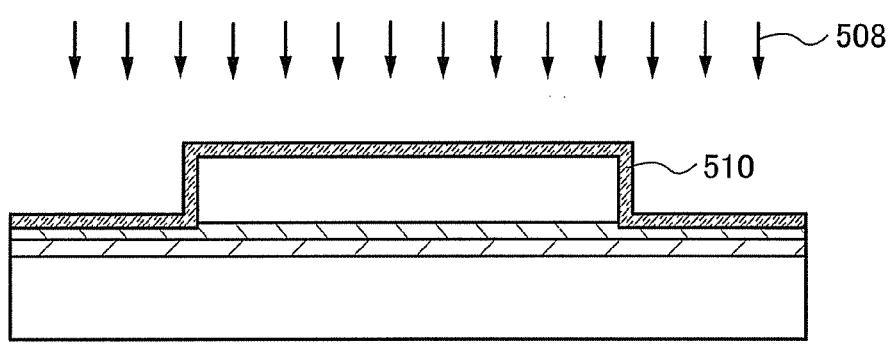

Next, surfaces of the first semiconductor layer 506 and the insulating layer 504 are nitrided by a high-density plasma treatment to form a first insulating layer 510 (see FIG. 10B). In the plasma treatment performed here, a plasma 508 which is excited by high-frequency waves such as microwaves (typically, 2.45 GHz) and has an electron density of $1\times10^{11}$ cm$^{-3}$ and more and $1\times10^{13}$ cm$^{-3}$ or less and an electron temperature of 0.5 eV or more and 1.5 eV or less is preferably used. Also, to perform solid phase nitridation, a plasma treatment is performed under an atmosphere containing nitrogen. The atmosphere containing nitrogen is, for example, an atmosphere containing nitrogen and a rare gas, or an atmosphere containing NH$_3$ and a rare gas. As the rare gas, Ar, or a mixture of Ar and Kr is preferably used. Specifically, the high-density plasma treatment described in Embodiment Mode 1 may be utilized. By forming the first insulating layer 510 using the high-density plasma treatment, an insulating layer that is denser than an insulating layer formed using a CVD method or a sputtering method can be formed. A portion of the first insulating layer 510 functions as a gate insulating layer of a thin film transistor to be completed later. Accordingly, by forming a denser insulating layer, withstand voltage can be improved. In particular, because the portion of the first insulating layer 510 forms the gate insulating layer that is in contact with a side surface of the semiconductor layer, a semiconductor device with high reliability can be manufactured. The first insulating layer 510 is formed to have a thickness within the rage of 1 nm to 10 nm, preferably, 1 nm to 5 nm. In this embodiment mode, a silicon nitride layer as the insulating layer 510 is formed over a surface of the first semiconductor layer 506 or surfaces of the first semiconductor layer 506 and an insulating layer 504.

Figure 10C:
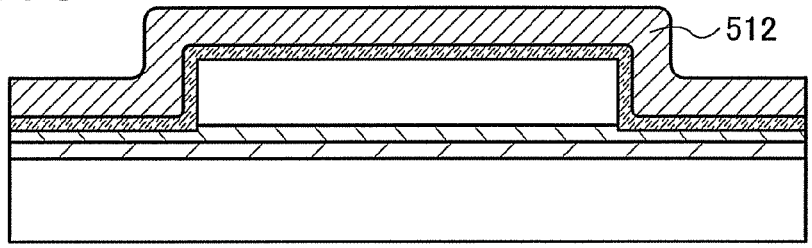

Next, a second insulating layer 512 is formed over the first insulating layer 510 (see FIG. 10C). The second insulating layer 512 is formed using a material such as silicon oxide, silicon nitride, silicon oxynitride, silicon nitride oxide, SiOF, SiOC, DLC, or porous silica, by a CVD method or a sputtering method. Further, the second insulating layer 512 is formed to have a thickness that can sufficiently cover at least the end portion of the first semiconductor layer 506. Preferably, the second insulating layer 512 may be formed with a thickness that is 1.5 to 3 times the thicknesses of the first semiconductor layer 506 and the first insulating layer 510. In this embodiment mode, a silicon oxynitride film with a thickness of 150 nm is formed as the second insulating layer 512.

Note that the second insulating layer 512 is preferably formed of a material having a dielectric constant that is lower than that of an insulating layer 522 formed later over one surface of the semiconductor layer. The second insulating layer 512 forms a part of a gate insulating layer in a semiconductor device that is completed layer, specifically, a gate insulating layer in a periphery of an end portion of the semiconductor layer. Therefore, by forming the second insulating layer 512 that forms the gate insulating layer in the periphery of the end portion of the semiconductor layer by using a low-dielectric constant material as compared to the gate insulating layer formed over the one surface of the semiconductor layer, concentration of an electric field or static electricity in the end portion of the semiconductor layer, particularly a corner portion, can be relaxed and insulation defect of the gate insulating layer can be reduced, which is preferable.

Figure 10D:
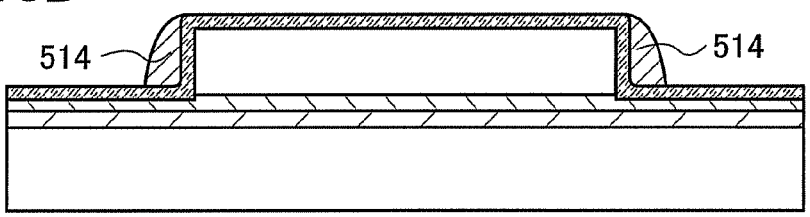

Next, the second insulating layer 512 is selectively etched by anisotropic etching mainly in a vertical direction to form a third insulating layer 514 over a side surface of the first semiconductor layer 506 with the first insulating layer 510 interposed therebetween (see FIG. 10D).

The third insulating layer 514 is formed by selectively etching the second insulating layer 512 by anisotropic dry-etching mainly in a vertical direction. The etching progresses from the second insulating layer 512 formed over one surface of the first semiconductor layer 506 with the first insulating layer 510 interposed therebetween, and the second insulating layer 512 formed over the insulating layer 504 with the first insulating layer 510 interposed therebetween. Thus, by stopping etching when the first insulating layer 510 formed over the one surface of the first semiconductor layer 506 is exposed, the second insulating layer 512 is left in a region at a side surface of the first semiconductor layer 506 to form the third insulating layer 514. By the end portion of the first semiconductor layer 506 having a shape close to a vertical shape, the third insulating layer 514 can be easily formed just in the region which is adjacent to the side surface of the first semiconductor layer 506.

The shape of the third insulating layer 514 can be controlled by appropriately selecting a material for forming a thin film, an etching condition, or the like. The etching method for forming the third insulating layer 514 is not particularly limited as long as anisotropic etching mainly in a vertical direction can be performed. For example, reactive ion etching of a parallel-plate type, a magnetron type, a dual-frequency type, an ECR type, a helicon type, an ICP type, or the like can be used. As a gas used for etching (an etching gas), a gas which can secure at least an etching selection ratio between the second insulating layer 512 and the first semiconductor layer 506 may be selected. For example, a fluorine-based gas such as CHF$_3$, CF$_4$, C$_4$F$_8$, C$_2$F$_6$, NF$_3$, or the like can be used. Further, an inert gas such as He, Ar, or Xe, an O$_2$ gas, or an H$_2$ gas may be added as needed. In this embodiment mode, etching of the second insulating layer 512 is performed by ICP reactive ion etching using a CHF$_3$ gas and a He gas as an etching gas.

Figure 11A:
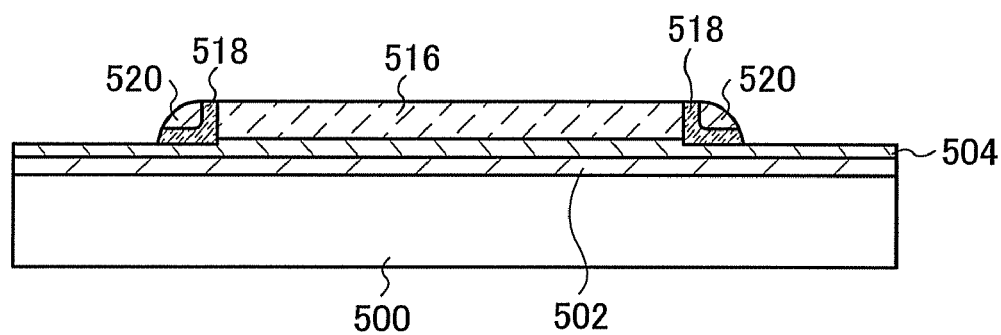
FIGS. 11A to 11C show an example of a manufacturing method of a semiconductor device according to the present invention.

Next, the first insulating layer 510, the third insulating layer 514, and the first semiconductor layer 516 are etched overall and thinned by anisotropic etching mainly in a vertical direction, to form a forth insulating layer 518, a fifth insulating layer 520, and a second semiconductor layer 516, respectively (see FIG. 11A).

The first insulating layer 510, the third insulating layer 514, and the first semiconductor layer 516 are etched under a condition in which the etching selection ratio is extremely small (a condition in which the etching selection ratio is near 1). That is, the first insulating layer 510, the third insulating layer 514, and the first semiconductor layer 516 are etched at almost the same etching rate. Accordingly, the fourth insulating layer 518, the fifth insulating layer 520, and the second semiconductor layer 516 formed after the etching are formed so that heights in a vertical direction are almost the same. Preferably, etching is performed so that the thickness of the second semiconductor layer 516 is in the range of 30 nm to 100 nm. In addition, the second semiconductor layer 516 is formed such that the taper angle of the end portion is preferably 45° or more and less than 95°, and more preferably 60° or more and less than 95° which is almost vertical. In this embodiment mode, the first semiconductor layer 506 with a thickness of 50 nm is etched to form the second semiconductor layer 516 with a thickness of 25 nm. At this time, the end portion of the second semiconductor layer 516 is formed so as to have nearly a vertical shape.

The etching method of the first insulating layer 510, the third insulating layer 514, and the first semiconductor layer 516 is not particularly limited as long as anisotropic etching mainly in a vertical direction can be performed. For example, reactive ion etching of a parallel-plate type, a magnetron type, a dual-frequency type, an ECR type, a helicon type, an ICP type, or the like can be used.

As an etching gas, a gas that can provide an extremely small etching selection ratio between the first insulating layer 510, the third insulating layer 514, and the first semiconductor layer 516 may be appropriately selected. For example, the etching ratio therebetween can be made to be small by appropriately adding $O_2$ gas to a fluorine-based gas such as $CHF_3$, $CF_4$, $C_4F_8$, $C_2F_6$, or $NF_3$. Further, an inert gas such as He, Ar, or Xe may be added as needed. In addition, as the etching gas, HBr, or a mixed gas of HBr and Cl2 may be used. In the case of using HBr gas, an inert gas of He, Ar, or the like may be appropriately added.

Note that the fifth insulating layer 520 formed at this time is preferably formed such that a surface thereof which is not in contact with the fourth insulating layer 518 is curved convexly with respect to a side surface of the second semiconductor layer 516. It is needless to say that the present invention is not particularly limited thereto, and the fifth insulating layer 520 may have a shape having a corner instead of a shape having curvature; however, by the corner portion of the fifth insulating layer 520 being made a gentle shape, coverage by a layer formed thereover (here, the sixth insulating layer 522) can be made favorable.

Figure 11B:
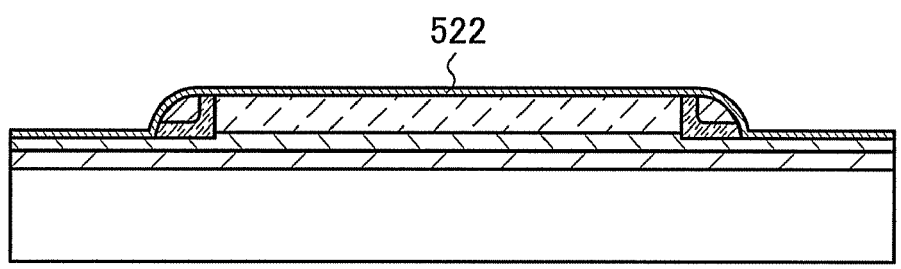
Figure 11C:
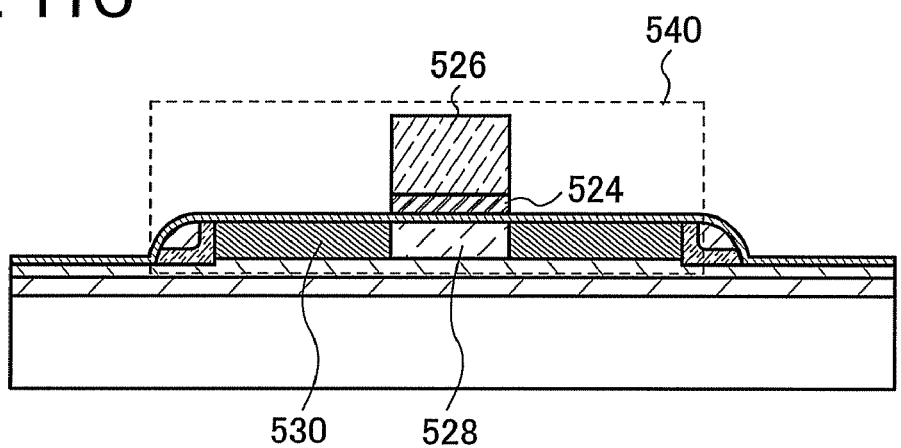
Figure 12A:
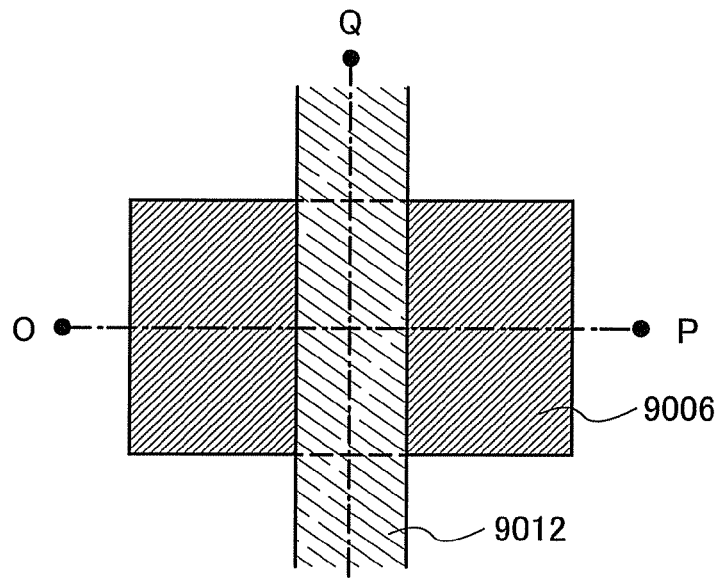
FIGS. 12A to 12C show an example of a structure of a conventional semiconductor device.
Figure 12B:
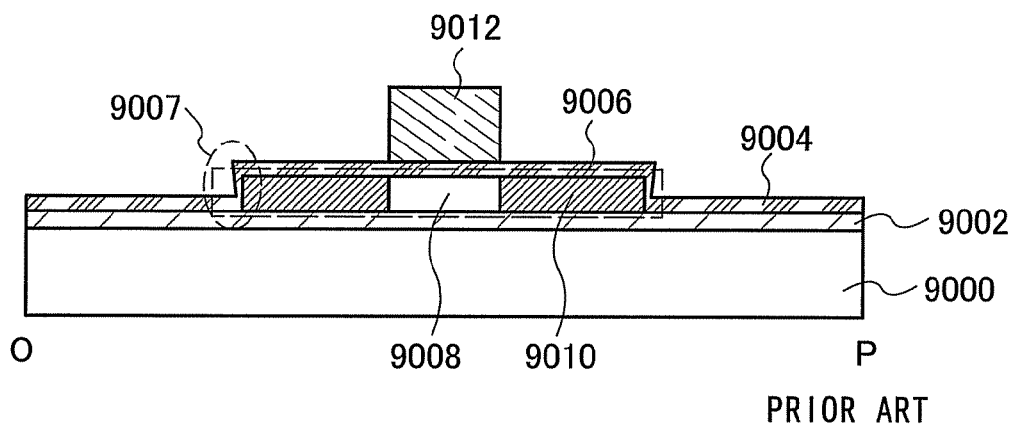
Figure 12C:
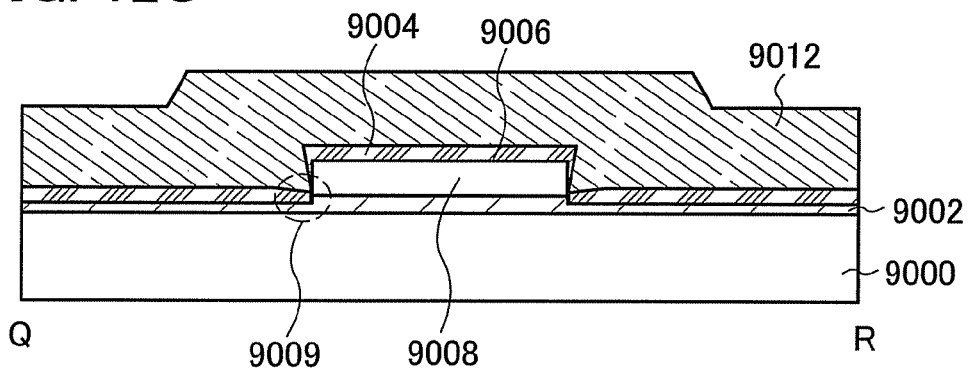

Next, the sixth insulating layer 522 is formed over the second semiconductor layer 516 (see FIG. 11B).

The sixth insulating layer 522 is formed by a CVD method or a sputtering method using a material such as silicon oxide, silicon nitride, silicon oxynitride, silicon nitride oxide, or aluminum nitride. The sixth insulating layer 522 is formed of at least one of the above-described materials to have a single layer structure or a stacked-layer structure. Further, the sixth insulating layer 522 can also be formed by solid phase oxidation or solid phase nitridation with a high-density plasma treatment. For example, surfaces of the second semiconductor layer 516, the fourth insulating layer 518, and the fifth insulating layer 520 may be oxidized or nitrided by a high-density plasma treatment to form the sixth insulating layer 522. The sixth insulating layer 522 is formed so that the thickness over one surface of the second semiconductor layer 516 is 1 nm to 15 nm, preferably 1 nm to 10 nm. Note that it is acceptable as long as the sixth insulating layer 522 is at least formed over the one surface of the second semiconductor layer 516, but can also be formed over the fifth insulating layer 520 and the fourth insulating layer 518. In this embodiment mode, a silicon oxynitride layer with a thickness of 10 nm is formed as the sixth insulating layer 522.

The sixth insulating layer 522, the fifth insulating layer 520, and the fourth insulating layer 518 formed as above function as a gate insulating layer. That is, the gate insulating layer of the present invention is formed of not a single body but a compound body including a plurality of insulating layers. By forming the fourth insulating layer 518 and the fifth insulating layer 520 to be in contact with the side surface of the semiconductor layer, and forming the sixth insulating layer 522 over the one surface of the semiconductor layer, coverage with the gate insulating layer at the end portion of the semiconductor layer can be made favorable. Further, even in the case where the insulating layer under the end portion of the semiconductor layer and in the periphery thereof (the insulating layer over a support substrate) is removed by washing using fluorinated acid or the like accompanied with etching the semiconductor layer into an island shape, the semiconductor layer can be sufficiently covered. Accordingly, short-circuiting between the semiconductor layer and a conductive layer forming the gate electrode, occurrence of a leakage current, electrostatic discharge, or the like due to insufficient coverage with the gate insulating layer can be prevented. In addition, by forming a dense insulating layer in contact with the end portion of the semiconductor layer, utilizing a high-density plasma treatment, a characteristic of the gate insulating layer can be improved.

Note that, as for the gate insulating layer formed of the sixth insulating layer 522, the fifth insulating layer 520, and the fourth insulating layer 518, the thickness in a region which is in contact with the side surface of the second semiconductor layer 516 is preferably thicker than that of a region formed over the one surface of the second semiconductor layer 516. At this time, the thickness of the region which is in contact with the side surface of the second semiconductor layer 516 is preferably 1 times to 3 times thicker than the thickness of the region over the one surface of the second semiconductor layer 516. For example, given that a perpendicular distance between the one surface of the second semiconductor layer 516 and the top surface of the gate insulating layer is a thickness t1, and a perpendicular distance between the side surface of the second semiconductor layer 516 and the top surface of the gate insulating layer is a thickness t2, it is preferable for the gate insulating layer to satisfy t1<t2. Note that the thickness of the gate insulating layer in the region which is in contact with the side surface of the second semiconductor layer 516 is not necessarily a constant value. In this case, the minimum value of the thickness t2 is preferably equal to or larger than the thickness t1. In this manner, by sufficiently covering the end portion of the second semiconductor layer 516 with the gate insulating layer, and preferably making the thickness of the region which is in contact with the side surface of the second semiconductor layer 516 thick, an electric field that is applied to the end portion of the second semiconductor layer 516 can be relaxed to prevent occurrence of a leakage current or the like.

Next, a conductive layer 524 and a conductive layer 526 are formed over the second semiconductor layer 516 in this order with the sixth insulating layer 522 interposed therebetween. Then, an impurity element which imparts one conductivity type is added into the second semiconductor layer 516 with the conductive layers 524 and 526 as masks to form a channel formation region 528 and impurity regions 530 that function as a source region and a drain region (see FIG. 11C).

Each of the conductive layer 524 and 526 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. A conductive layer that functions as a gate electrode may be formed using one or a plurality of these materials to have a single-layer structure or a stacked-layer structure, and the conductive layer preferably has a thickness of 100 nm to 1000 nm, preferably 200 nm to 800 nm, and more preferably 300 nm to 500 nm. Further, the conductive layer that functions as the gate electrode may be processed into a desired shape by selective etching after being formed over the entire surface by a CVD method or a sputtering method using the above-mentioned materials. In addition, in this embodiment mode, a tantalum nitride layer with a thickness of 30 nm and a tungsten layer with a thickness of 370 nm are stacked in this order as the conductive layer 524 and the conductive layer 526, respectively.

As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Accordingly, a thin film transistor 540 to which the present invention is applied can be formed.

Note that after the impurity element which imparts one conductivity type is added into the second semiconductor layer 516, a heat treatment may be performed to activate the impurity element added. The heat treatment can be performed by laser beam irradiation, RTA, or using an annealing furnace. Specifically, the heat treatment may be performed at a temperature of 400° C. to 700° C., and preferably 500° C. to 550° C. Further, the heat treatment is preferably performed in a nitrogen atmosphere. For example, activation can be performed by heating at 550° C. for 4 hours. Further, when the second semiconductor layer 516 includes an amorphous region, recrystallization of the semiconductor layer can also be performed together with the activation of the impurity element by performing heat treatment.

Note that each structure of the TFT described in this embodiment mode is just an example, and the present invention is not limited to the structures shown. For example, a multi-gate structure, which includes a semiconductor layer including two or more channel formation regions connected in series and two or more gate electrode layers by which an electric field is applied to the channel formation regions, may be employed. Further, an LDD region may be formed in the semiconductor layer of the TFT.

Further, the side surface of the conductive layer that functions as a gate electrode may be tapered. The conductive layer that functions as a gate electrode may employ a stacked-layer structure and the taper angle may be different in the layers. Further, an insulating layer which is called a sidewall may also be formed so as to be in contact with the side surface of the conductive layer.

In a thin film transistor manufactured by applying the present invention, defects due to an end portion of a semiconductor layer can be reduced. In particular, insufficient coverage with the gate insulating layer at the end portion of the semiconductor layer can be prevented, and short-circuiting between the semiconductor layer and the conductive layer forming the gate electrode can be prevented. Further, concentration of electric field at the end portion of the semiconductor layer can be relaxed. Accordingly, since a leakage current or electrostatic discharge prevented or reduced, a highly reliable semiconductor device can be manufactured. Further, high-yield manufacturing of semiconductor devices can also be realized.

In addition, as shown in this embodiment mode, by forming a dense insulating layer to be in contact with the side surface of the semiconductor layer, a highly reliable semiconductor device with high withstand voltage in the end portion of the semiconductor layer can be manufactured.

This embodiment mode can be combined with any other embodiment mode in this specification as appropriate.

Embodiment Mode 6

In this embodiment mode, an example of a semiconductor device which is different from those in the above embodiment modes and a manufacturing method thereof is described with reference to FIGS. 13A to 19C. Specifically, an example of a semiconductor device provided with thin film transistors having different conductive types is described.

Figure 13A:
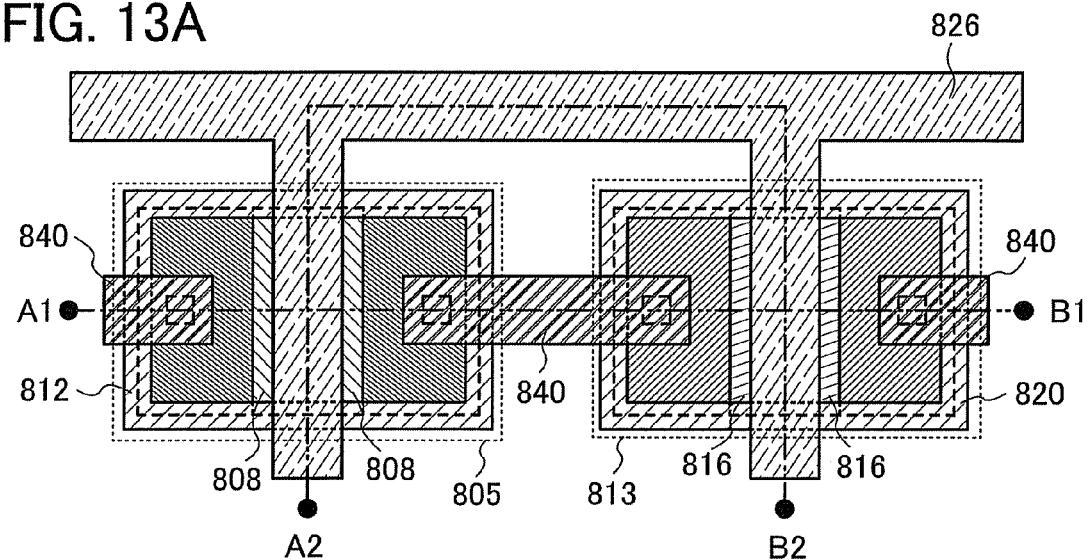
FIGS. 13A to 13C show an example of a main structure of a semiconductor device according to the present invention.
Figure 13B:
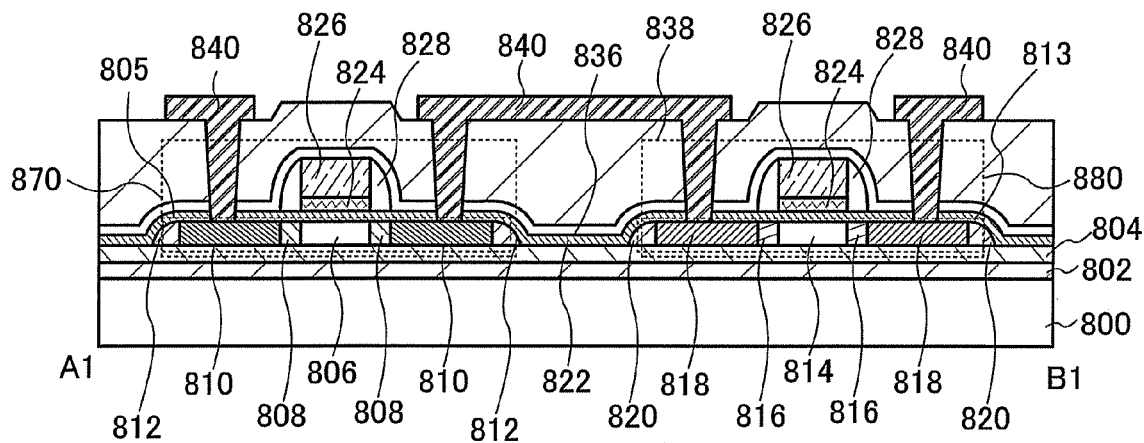
Figure 13C:
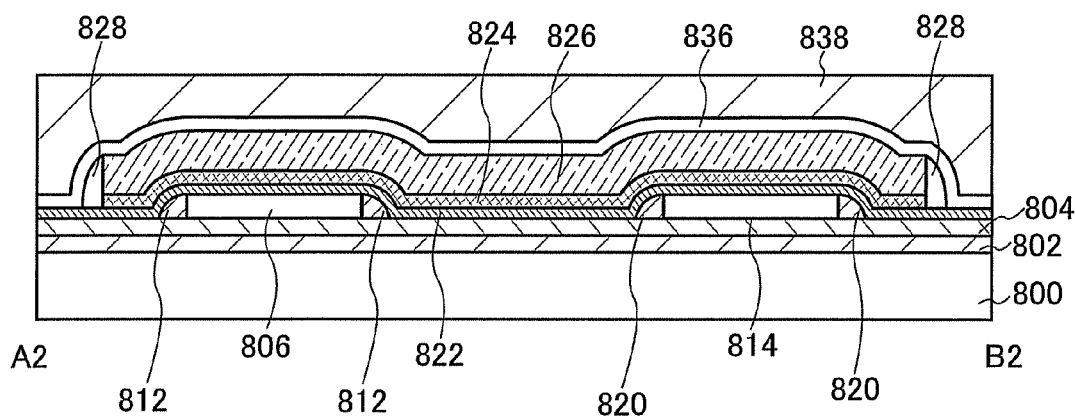

FIGS. 13A to 13C are a top diagram and cross-sectional diagrams of a semiconductor device of this embodiment mode. FIG. 13A is a top diagram of the semiconductor device, FIG. 13B is a cross-sectional diagram along a dashed line A1-B1 in FIG. 13A, and FIG. 13C is a cross-sectional diagram along a dashed line A2-B2 in FIG. 13A. Note that in FIG. 13A, a thin film and the like included in the semiconductor device are partially omitted.

The semiconductor device shown in FIGS. 13A to 13C includes semiconductor layers 805 and 813 which are provided into an island shape over a substrate 800 with an insulating layer 802 and an insulating layer 804 interposed therebetween, conductive layers 824 and 826 which form a gate electrode which are provided over the semiconductor layers 805 and 813 with an insulating layer 822 interposed therebetween, and a conductive layer 840 which forms a source or drain electrode which is provided over the conductive layer 826 with insulating layers 836 and 838 interposed therebetween (see FIGS. 13A to 13C).

A gate electrode is formed of a stacked-layer structure of the conductive layers 824 and 826. The conductive layers 824 and 826 are provided so as to get across the island-shaped semiconductor layers 805 and 813. Further, an insulating layer 828 is provided to be in contact with each side surface of the conductive layers 824 and 826. The insulating layer 828 is also called a sidewall. Although the example in which the gate electrode is formed of the two-layer stacked structure of the conductive layers 824 and 826 is described here, the present invention is not particularly limited; the gate electrode may employ a single layer structure or a stacked-layer structure including three or more layers. The side surface of the conductive layer formed as a gate electrode may be tapered. Further, the gate electrode may employ a stacked-layer structure including two or more conductive layers, and the taper angle may be different in the layers. Further, any structure of the gate electrode described in Embodiment Modes 1 to 5 may be employed.

The island-shaped semiconductor layer 805 includes a channel formation region 806, a pair of low-concentration impurity regions 808 which function as LDD regions, and a pair of high-concentration impurity regions 810 which function as source and drain regions. The channel formation region 806 is formed in the semiconductor layer 805 in the region which overlaps with the conductive layers 824 and 826 with the insulating layer 822 interposed therebetween. Each low-concentration impurity region 808 is formed in the semiconductor layer 805 in the region which overlaps with the insulating layer 828 with the insulating layer 822 interposed therebetween. Each high-concentration impurity region 810 is formed in the semiconductor layer 805 in the region which does not overlap with the conductive layers 824 and 826 and the insulating layer 828 with the insulating layer 822 interposed therebetween. The channel formation region 806 is positioned between the pair of high-concentration impurity regions 810 and each low-concentration impurity region 808 is positioned between the channel formation region 806 and each high-concentration impurity region 810. That is, the channel formation region 806 is positioned between the pair of high-concentration impurity regions 810 and between the pair of low-concentration impurity regions 808, and formed so as to be in contact with the pair of low-concentration impurity regions 808. As compared to each low-concentration impurity region 808, the concentration of an impurity element which imparts one conductivity type added into each high-concentration impurity region 810 is high. Further, an insulating layer 812 is provided so as to be in contact with the side surface of the semiconductor layer 805.

Similarly, the island-shaped semiconductor layer 813 includes a channel formation region 814, low-concentration impurity regions 816 which function as LDD regions, and high-concentration impurity regions 818 which function as source and drain regions. The channel formation region 814 is formed in the semiconductor layer 813 in the region which overlaps with the conductive layers 824 and 826 with the insulating layer 822 interposed therebetween. Each low-concentration impurity region 816 is formed in the semiconductor layer 813 in the region which overlaps with the insulating layer 828 with the insulating layer 822 interposed therebetween. Each high-concentration impurity region 818 is formed in the semiconductor layer 813 in the region which does not overlap with the conductive layers 824 and 826 and the insulating layer 828 with the insulating layer 822 interposed therebetween. The channel formation region 814 is positioned between the pair of high-concentration impurity regions 818, and each low-concentration impurity region 816 is positioned between the channel formation region 814 and each high-concentration impurity region 818. That is, the channel formation region 814 is positioned between the pair of high-concentration impurity regions 818 and between the pair of low-concentration impurity regions 816, and formed so as to be in contact with the pair of low-concentration impurity regions 816. As compared to each low-concentration impurity region 816, the concentration of an impurity element which imparts one conductivity type added into each high-concentration impurity region 818 is high. Further, an insulating layer 820 is provided so as to be in contact with the side surface of the semiconductor layer 813.

In this embodiment mode, impurity elements which impart different conductivity types are added into the semiconductor layers 805 and 813. That is, into the low-concentration impurity regions 808 and the high-concentration impurity regions 810, an impurity element which imparts a conductivity type which is different from that of the low-concentration impurity regions 816 and the high-concentration impurity regions 810 is added.

The insulating layer 822 is provided between the semiconductor layers 805 and 813 and the conductive layers 824 and 826 which form a gate electrode. Further, the insulating layer 822 is also provided over the insulating layer 812 provided so as to be in contact with the side surface of the semiconductor layer 805 and over the insulating layer 820 provided so as to be in contact with the side surface of the semiconductor layer 813. The insulating layers 812, 820, and 822 function as a gate insulating layer.

Figure 19A:
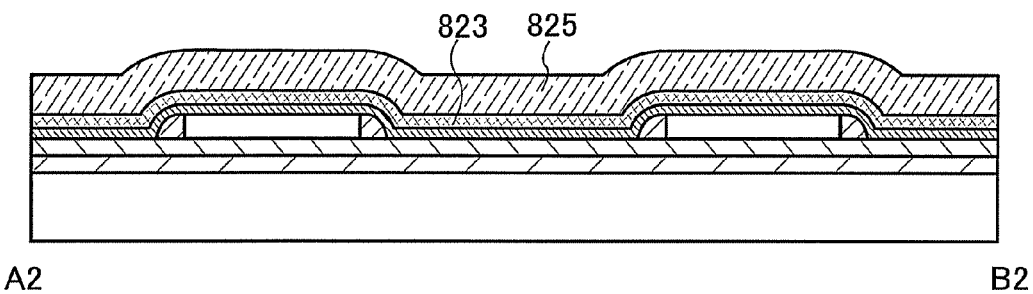
FIGS. 19A to 19C show an example of a manufacturing method of a semiconductor device according to the present invention.
Figure 19B:
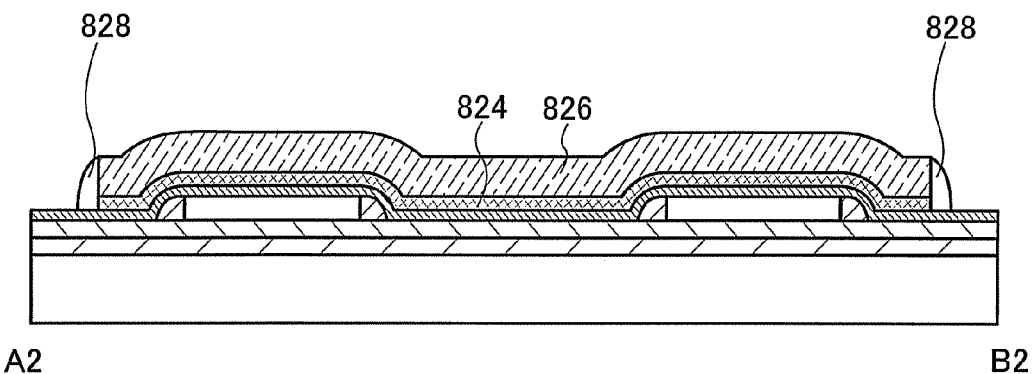
Figure 19C:
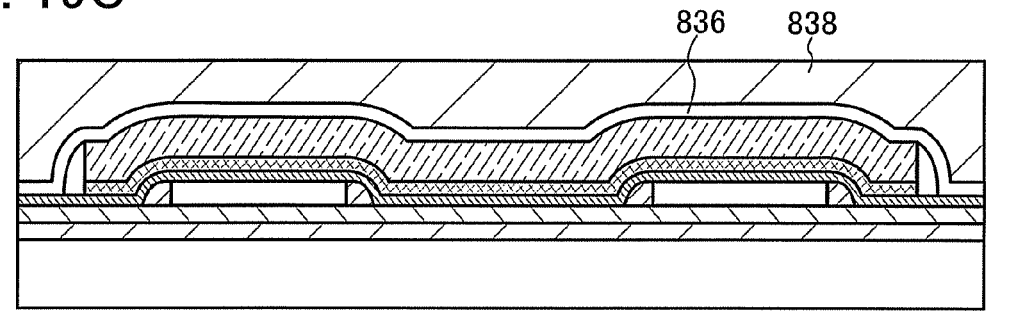

The conductive layer 840 which forms a source or drain electrode is provided so as to be electrically connected to the high-concentration impurity regions 810 formed in the semiconductor layer 805 and the high-concentration impurity regions 818 formed in the semiconductor layer 813 through openings formed in the insulating layers 836 and 838. Further, as shown in FIGS. 19A to 19C, the high-concentration impurity regions 810 formed in the semiconductor layer 805 and the high-concentration impurity regions 818 which are formed in the semiconductor layer 813 and with the higher concentration having the conductivity type which is different from that of the high-concentration impurity regions 810 may be connected to each other so that a CMOS circuit is formed.

Next, an example of a manufacturing method of the semiconductor device shown in FIGS. 13A to 13C is described with reference to drawings.

Figure 14A:
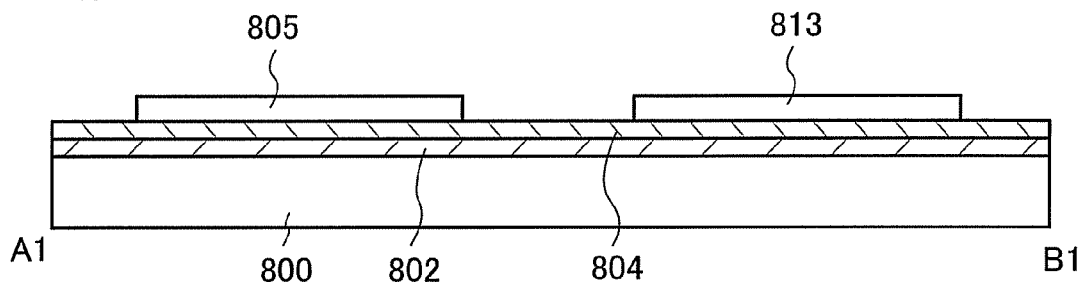
FIGS. 14A to 14D show an example of a manufacturing method of a semiconductor device according to the present invention.
Figure 17A:
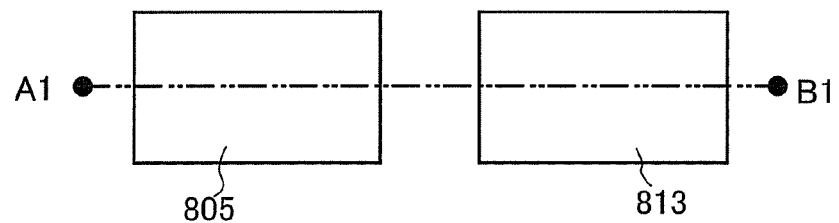
FIGS. 17A to 17D show an example of a manufacturing method of a semiconductor device according to the present invention.
Figure 18A:
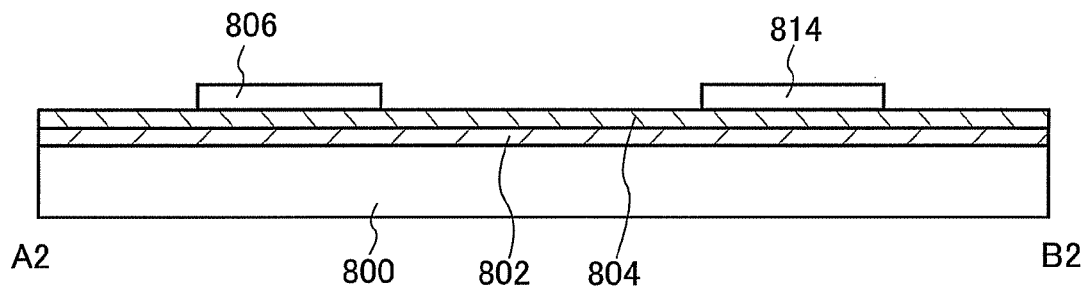
FIGS. 18A to 18C show an example of a manufacturing method of a semiconductor device according to the present invention.

First, the island-shaped semiconductor layer 805 and the island-shaped semiconductor layer 813 are formed over the substrate 800 with the insulating layers 802 and 804 interposed therebetween (see FIGS. 14A, 17A, and 18A).

For the substrate 800, a substrate having an insulating surface may be used. For example, a glass substrate, a quartz substrate, a sapphire substrate, a ceramic substrate, a metal substrate with an insulating layer formed over a surface, or the like can be used.

Each of the insulating layers 802 and 804 is formed by a CVD method or a sputtering method, using a material such as silicon oxide, silicon nitride, silicon oxynitride, or silicon nitride oxide. The insulating layers 802 and 804 function as a blocking layer that prevents contamination of the semiconductor layers 805 and 813 due to diffusion of an alkali metal or the like from the substrate 800 to the semiconductor layers 805 and 813. In addition, when a surface of the substrate 800 is uneven, the insulating layers 802 and 804 can function as a layer for planarization. Note that the insulating layers 802 and 804 are not necessary to be formed if impurity diffusion from the substrate 800 or unevenness of the surface of the substrate 800 is not a problem. Further, although the base insulating layer is a stacked-layer structure with two layers, it may have a single-layer structure or a stacked-layer structure of three or more layers.

Each of the semiconductor layers 805 and 813 is preferably formed by a CVD method or a sputtering method, using a material mainly containing silicon such as silicon, germanium, or silicon germanium. For example, for each of the semiconductor layers 805 and 813, an island-shaped semiconductor layer can be formed by forming an amorphous semiconductor layer using a material mainly containing silicon, crystallizing the amorphous semiconductor layer, and then performing selective etching. In a case of crystallizing the amorphous semiconductor layer, crystallization can be performed by a laser crystallization method, a thermal crystallization method using RTA or an annealing furnace, a thermal crystallization method using a metal element that promotes crystallization, a method combining these methods, or the like. Each of the semiconductor layers 805 and 813 is formed with a thickness in the range of 10 nm to 150 nm, preferably 30 nm to 100 nm, and more preferably 10 nm to 70 nm.

Note that each of the semiconductor layers 805 and 813 may be formed such that the end portion has a tapered shape or a vertical shape. The shape of the end portion of the semiconductor layer can be controlled by selecting the etching condition of isotropic etching, anisotropic etching, or the like as appropriate.

Figure 14B:
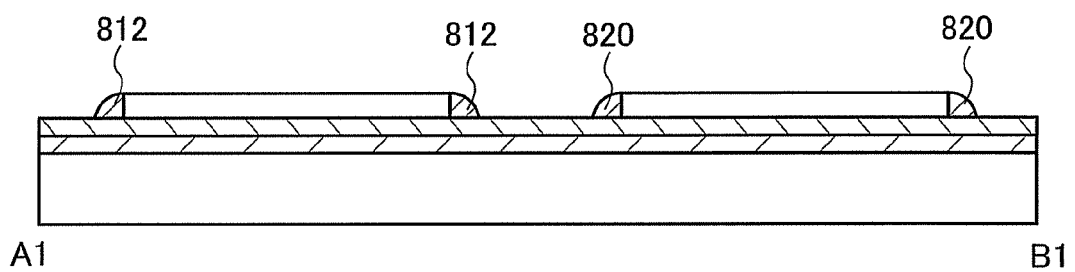
Figure 17B:
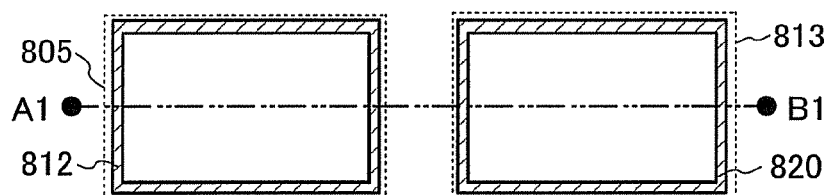
Figure 18B:
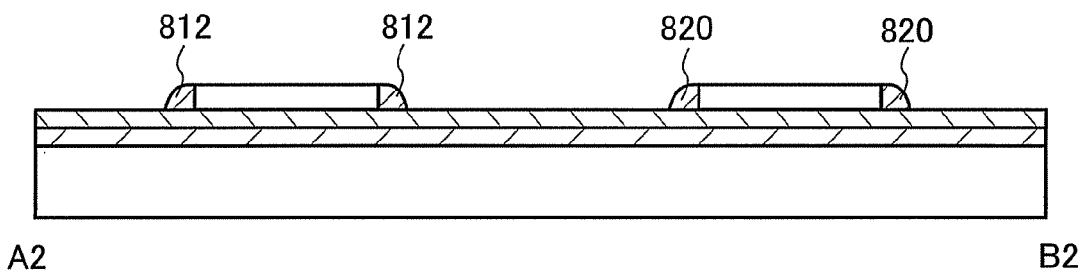

Next, the insulating layer 812 which is in contact with the side surface of the semiconductor layer 805 and the insulating layer 820 which is in contact with the side surface of the semiconductor layer 813 are formed (see FIGS. 14B, 17B, and 18B).

Each of the insulating layers 812 and 820 can be formed as follows: an insulating layer is formed so as to cover the island-shaped semiconductor layers 805 and 813, and the insulating layer is selectively etched by anisotropic etching mainly in a vertical direction, so that the insulating layer is left only in regions which overlap with the side surfaces of the semiconductor layers 805 and 813.

Specifically, an insulating layer is formed so as to cover the semiconductor layers 805 and 813, first. The insulating layer is formed of a material such as silicon oxide, silicon nitride, silicon oxynitride, silicon nitride oxide, SiOF, SiOC, DLC, porous silica, or the like by a CVD method or a sputtering method. Preferably, the insulating layer is formed of a layer having the dielectric constant which is lower than that of the insulating layer 822 formed later over one surfaces of the semiconductor layers 805 and 813. Further, the insulating layer which is formed so as to cover the semiconductor layers 805 and 813 is formed to have a thickness enough to cover at least the end portions of the semiconductor layers 805 and 813. The insulating layer is preferably formed to have a thickness that is 1.5 to 3 times thicker than that of each of the semiconductor layers 805 and 813.

Next, the insulating layer which is formed so as to cover the semiconductor layers 805 and 813 is selectively etched by anisotropic etching mainly in a vertical direction. The etching progresses from the insulating layer formed over the one surface of the semiconductor layer 805 and the one surface of the semiconductor layer 813. Note that the thickness of the insulating layer is almost the same over the one surface of the semiconductor layer 804, over the one surface of the semiconductor layer 813, and over the insulating layer 805. Thus, by stopping etching when the one surfaces of the semiconductor layers 805 and 813 are exposed, the insulating layer can be left selectively in regions which are in contact with the side surfaces of the semiconductor layers 805 and 813. The left insulating layers correspond to the insulating layers 812 and 820. Here, the insulating layers 812 and 820 are formed such that they are curved convexly with respect to the side surfaces of the semiconductor layers 805 and 813 which are in contact with them. It is needless to say that the present invention is not limited particularly thereto, and the insulating layers 812 and 820 may have a shape having a corner instead of a rounded shape. Preferably, the corner portion of each of the insulating layers 812 and 820 is made a gentle shape so that the coverage with a layer formed thereover (here, the insulating layer 822) can be improved.

Note that due to the etching for forming the insulating layers 812 and 820, the top-layer portions of the semiconductor layers 805 and 813 may be made amorphous. In this case, regions of the semiconductor layers 805 and 813 that are made amorphous may be selectively etched. In addition, the semiconductor layers 805 and 813 may be recrystallized by performing heat treatment with laser beam irradiation, RTA, or an annealing furnace. Alternatively, after the impurity regions are formed by adding the impurity elements which impart conductivity types into the semiconductor layers, recrystallization may be performed together with heat treatment for activating the impurity regions. Specifically, any forming method of a semiconductor layer and an insulating layer which is in contact with the side surface of the semiconductor layer, described in Embodiment Modes 2 and 3 can be applied.

Further, the semiconductor layer may be formed to be thicker in advance than a semiconductor layer of a thin film transistor to be completed, and then the semiconductor layer may be thinned in a later step. For example, the semiconductor layer is formed to be 2 to 3 times thicker than the semiconductor layer of the thin film transistor to be completed. Next, an insulating layer is formed over the semiconductor layer that is formed thicker. The insulating layer and the semiconductor layer may be etched overall by anisotropic etching mainly in a vertical direction with the etching condition in which there is no etching selection ratio therebetween or is as small as possible (the etching selection ratio is near 1) so that the semiconductor layer and the insulating layer which is in contact with the side surface of the semiconductor layer which are thinned films are formed. Specifically, any forming method of a semiconductor layer and an insulating layer which is in contact with the side surface of the semiconductor layer, described in Embodiment Modes 4 and 5 can be applied.

Further, as described in Embodiment Mode 5, a dense insulating layer (e.g., an insulating layer containing nitrogen such as a silicon nitride layer or a silicon nitride oxide layer) which is in contact with the side surface of the semiconductor layer may also be formed by using a high-density plasma treatment.

The semiconductor layer 805, the insulating layer 812 which is in contact with the side surface of the semiconductor layer 805, the semiconductor layer 813, and the insulating layer 820 which is in contact with the side surface of the semiconductor layer 813 may be formed by using any method described in Embodiment Modes 1 to 5. Here, the method described in Embodiment Mode 1 is used.

Further, in order to control the threshold voltage of the thin film transistor, an impurity element which imparts one conductivity type may be added into the semiconductor layers 805 and 813 at a low concentration, which results in that the impurity element is also added into the channel formation region of the thin film transistor. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used. For example, boron can be used as the impurity element and added so as to be contained in the semiconductor layers 805 and 813 at concentrations of $5\times10^{15}$ cm$^{-3}$ to $5\times10^{17}$ cm$^{-3}$. Note that impurity elements may be added at different concentrations or impurity elements which impart different conductivity types may be added into the semiconductor layers 805 and 813.

Figure 14C:
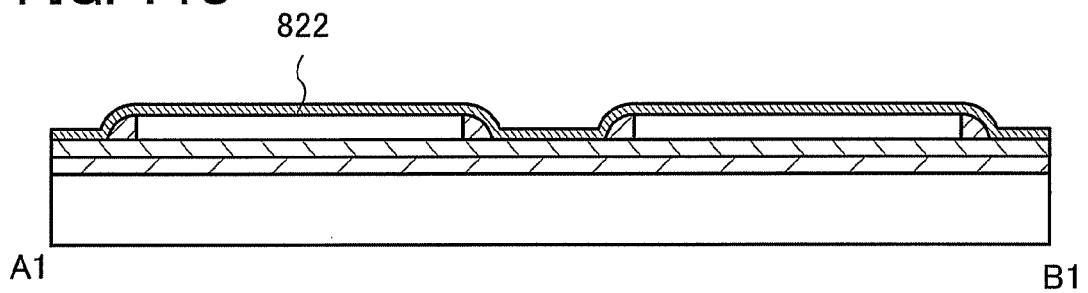
Figure 18C:
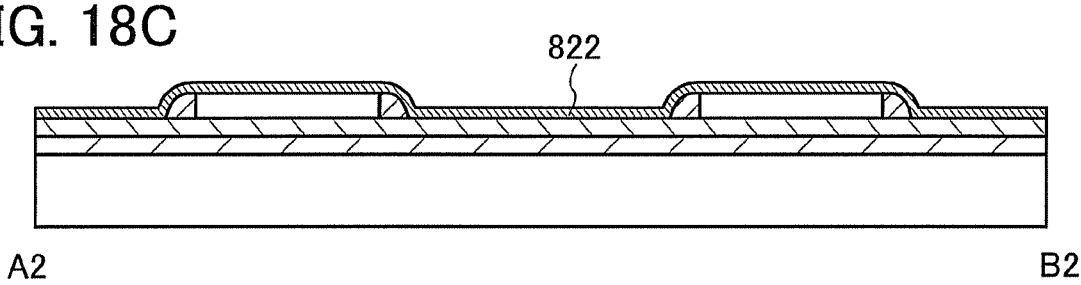

Next, the insulating layer 822 is formed over the semiconductor layer 805, the insulating layer 812 which is in contact with the side surface of the semiconductor layer 805, the semiconductor layer 813, and the insulating layer 820 which is in contact with the side surface of the semiconductor layer 813 (see FIGS. 14C and 18C).

The insulating layer 822 is formed by a CVD method or a sputtering method, using oxide silicon, nitride silicon, oxynitride silicon, nitride oxide silicon, nitride aluminum, or the like. The insulating layer 822 is preferably formed of a material of which dielectric constant is higher than that of the insulating layer 812 which is in contact with the side surface of the semiconductor layer 805 and the insulating layer 820 which is in contact with the side surface of the semiconductor layer 813. The insulating layer 822 is formed to have a single layer structure or a stacked-layer structure of at least one of the above materials. Further, the insulating layer 822 can also be formed by solid phase oxidation or solid phase nitridation of the semiconductor layers 805 and 813 with a high-density plasma treatment.

The insulating layers 812, 820, and 822 form a gate insulating layer. The insulating layer 822 is formed at least over the one surfaces of the semiconductor layers 805 and 813. In this embodiment mode, the insulating layer 822 is formed so as to cover the semiconductor layer 805, the insulating layer 812 which is in contact with the side surface of the semiconductor layer 805, the semiconductor layer 813, and the insulating layer 820 which is in contact with the side surface of the semiconductor layer 813. That is, the gate insulating layer of this embodiment mode is formed of not a single body but a compound body including a plurality of insulating layers. Note that each boundary in the plurality of insulating layers is not necessarily clear. By thus forming the insulating layer which is in contact with the side surface of the semiconductor layer, separately from the insulating layer formed over the one surface of the semiconductor layer, coverage with the gate insulating layer at the end portion of the semiconductor layer can be improved. Further, in the case where the semiconductor layer is made to be a thin film, a problem of unintended etching of an insulating layer under the semiconductor layer caused by a washing process using fluorinated acid or the like becomes notable; however, by forming the insulating layer which is in contact with the side surface of the semiconductor layer by applying the present invention, the semiconductor layer can be covered enough with the gate insulating layer. Consequently, short-circuiting between the semiconductor layer and the gate electrode layer, occurrence of a leakage current, electrostatic discharge, or the like due to insufficient coverage with the gate insulating layer at the end portion of the semiconductor layer can be prevented.

Note that, as for the gate insulating layer, the thickness in the region which is in contact with the side surface of the semiconductor layer is preferably larger than that over the one surface of the semiconductor layer. By thus covering the end portion of the semiconductor layer with the gate insulating layer enough, and preferably, by increasing the thickness of the gate insulating layer in the region which is in contact with the side surface of the semiconductor layer, an electric field applied to the end portion of the semiconductor layer can be relaxed, and occurrence of a leakage current, or the like can be prevented.

Further, as for the gate insulating layer, the dielectric constant in the region which is in contact with the side surface of the semiconductor layer is preferably lower than that in the region over the one surface of the semiconductor layer. By thus doing, an electric field at the end portion of the semiconductor layer can be relaxed and insufficient insulation of the gate insulating layer can be prevented.

Figure 14D:
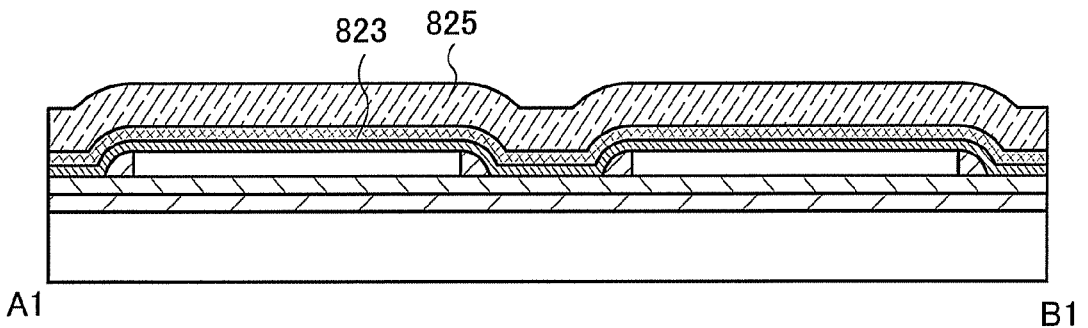

Next, conductive layers 823 and 825 are stacked in order over the insulating layer 822 (see FIGS. 14D and 19A).

Each of the conductive layers 823 and 825 can be formed by a CVD method or a sputtering method, using a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used.

Figure 15A:
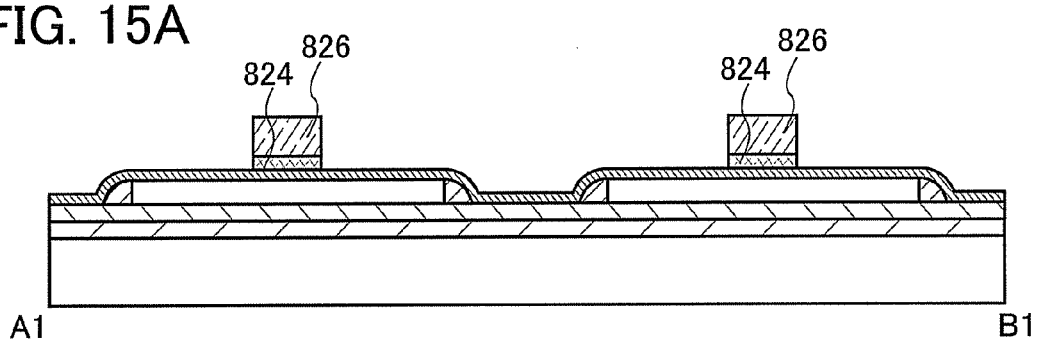
FIGS. 15A to 15D show an example of a manufacturing method of a semiconductor device according to the present invention.
Figure 17C:
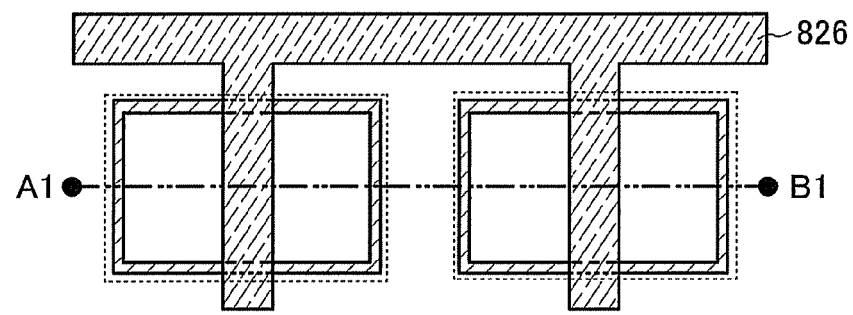

Next, the conductive layers 823 and 825 are selectively etched, whereby the conductive layers 824 and 826 which function as a gate electrode are formed (see FIGS. 15A and 17C).

In this embodiment mode, the conductive layers 823 and 825 are formed over an entire surface of the substrate and then selectively etched to be processed into a desired shape. Here, the etching process is performed such that each separated conductive layer gets across each of the island-shaped semiconductor layers 805 and 813. At this time, the conductive layers 823 and 825 are processed such that the separated conductive layers come together in the region which does not overlap with the island-shaped semiconductor layers 805 and 813. That is, two conductive layers branching from a continuous conductive layer are formed so as to get across the island-shaped semiconductor layers 805 and 813.

Figure 15B:
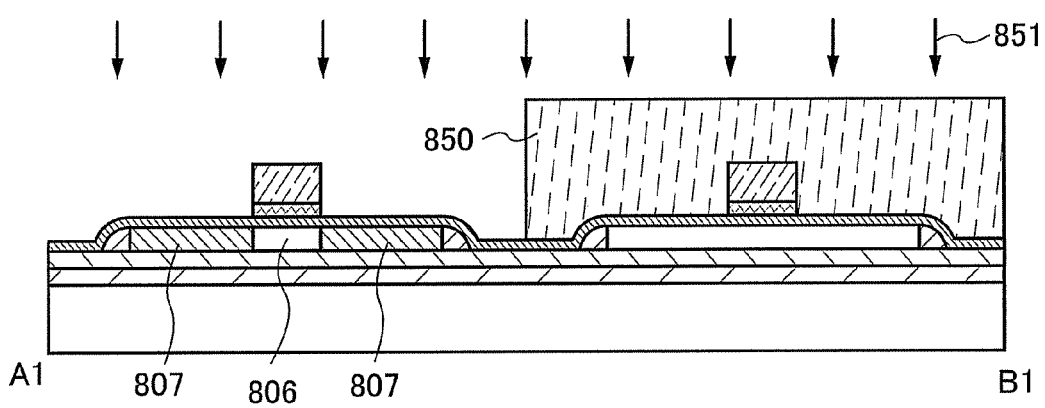

Next, a resist mask 850 is selectively formed so as to cover the semiconductor layer 813, and an impurity element 851 which imparts one conductivity type is added into the semiconductor layer 805 at a low concentration with the resist mask 850 and the conductive layers 824 and 826 as a mask, whereby impurity regions 807 are formed (see FIG. 15B). As the impurity element 851, an impurity element which imparts an n-type conductivity such as phosphorus (P) or arsenic (As) or an impurity element which imparts a p-type conductivity such as boron (B), aluminum (Al), or gallium (Ga) can be used. In this embodiment mode, phosphorus (P) is added as the impurity element 851. Note that the impurity regions 807 form part of low-concentration impurity regions which function as LDD regions. Further, the channel formation region 806 is formed in the semiconductor layer 805 under the conductive layers 824 and 826.

Figure 15C:
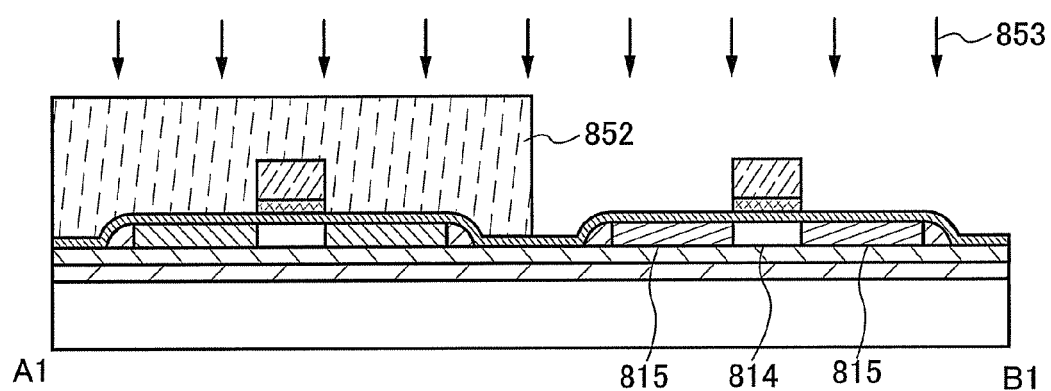

Next, a resist mask 852 is selectively formed so as to cover the semiconductor layer 805, and an impurity element 853 which imparts one conductivity type is added into the semiconductor layer 813 at a low concentration with the resist mask 852 and the conductive layers 824 and 826 as a mask, whereby impurity regions 815 are formed (see FIG. 15C). As the impurity element 853, an element which is similar to the impurity element 851 can be used. In this embodiment mode, an element which imparts a conductivity type which is different from that of the impurity element 851 is added; boron (B) is added. Note that the impurity regions 815 form part of low-concentration impurity regions which function as LDD regions. Further, the channel formation region 814 is formed in the semiconductor layer 813 under the conductive layers 824 and 826.

Figure 15D:
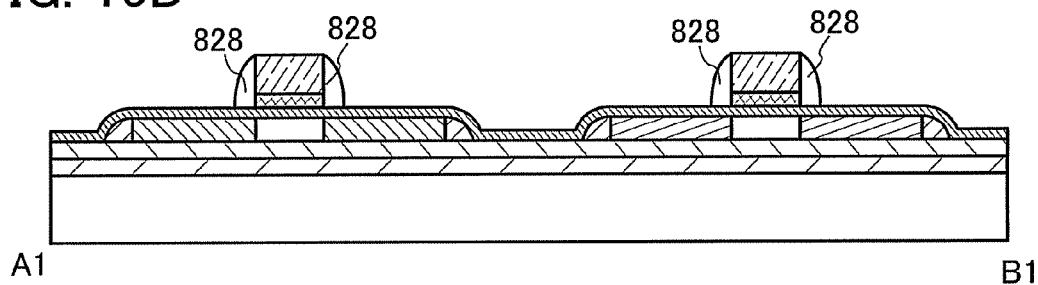

Next, the insulating layer 828 which is in contact with each side surface of the conductive layers 824 and 826 is formed (see FIGS. 15D and 19B). The insulating layer 828 which is in contact with each side surface of the conductive layers 824 and 826 is formed as follows; an insulating layer having a single layer structure or a stacked-layer structure is formed by a CVD method or a sputtering method using an inorganic material such as silicon oxide, silicon nitride, silicon oxynitride, or silicon nitride oxide, or an organic material such as an organic resin, and the insulating layer is selectively etched by anisotropic etching mainly in a vertical direction. The insulating layer 828 is also called a sidewall. Here, the surface of the insulating layer 828, on the side which is not in contact with the side surfaces of the conductive layers 824 and 826 is curved. Specifically, the insulating layer 828 is formed such that an appropriate curvature is provided to curve convexly with respect to the side surfaces of the conductive layers 824 and 826 which are in contact with the insulating layer 828. It is needless to say that the present invention is not limited particularly thereto, and the insulating layer 828 may have a shape having a corner instead of a rounded shape. Note that the insulating layer 828 can be also used as a doping mask for forming the low-concentration impurity regions which function as LDD regions.

Next, a resist mask 854 is selectively formed so as to cover the semiconductor layer 813. An impurity element 855 which imparts one conductivity type is added into the semiconductor layer 805 at a high concentration with the resist mask 854, the conductive layers 824 and 826, and the insulating layer 828 provided so as to be in contact with each side surface of the conductive layers 824 and 826, as a mask. As a result, the high-concentration impurity regions 810 which function as source and drain regions, the low-concentration impurity regions 808 which function as LDD regions, and the channel formation region 806 are formed in the semiconductor layer 805. As the impurity element 855, an element which is similar to the impurity element 851 can be used. Here, the element which imparts the same conductivity type as the impurity element 851, that is, phosphorus (P) is added as the impurity element 855. Note that the concentration of the impurity element 855 added into the semiconductor layer 805 is higher than that of the impurity element 851 added into the semiconductor layer 805.

Next, a resist mask 856 is selectively formed so as to cover the semiconductor layer 805. An impurity element 857 which imparts one conductivity type is added into the semiconductor layer 813 at a high concentration with the resist mask 856, the conductive layers 824 and 826, and the insulating layer 828 provided so as to be in contact with each side surface of the conductive layers 824 and 826, as a mask. As a result, the high-concentration impurity regions 818 which function as source and drain regions, the low-concentration impurity regions 816 which function as LDD regions, and the channel formation region 814 are formed in the semiconductor layer 813. As the impurity element 857, an element which is similar to the impurity element 851 can be used. Here, the element which imparts the same conductivity type as the impurity element 853, that is, boron (B) is added as the impurity element 857. Note that the concentration of the impurity element 857 added into the semiconductor layer 813 is higher than that of the impurity element 853 added into the semiconductor layer 813.

Through the above, the high-concentration impurity regions 810 which function as source and drain regions, the low-concentration impurity regions 808 which function as LDD regions, and the channel formation region 806 are formed in the semiconductor layer 805, and the high-concentration impurity regions 818 which function as source and drain regions, the low-concentration impurity regions 816 which function as LDD regions, and the channel formation region 814 are formed in the semiconductor layer 813. In this embodiment mode, the channel formation regions 806 and 814 can be formed in a self-aligned manner by using the conductive layers 824 and 826. Further, the low-concentration impurity regions 808 and 816 can be formed in a self-aligned manner by using the conductive layers 824 and 826 and the insulating layers 828 which are in contact with the side surfaces of the conductive layers 824 and 826.

Figure 16A:
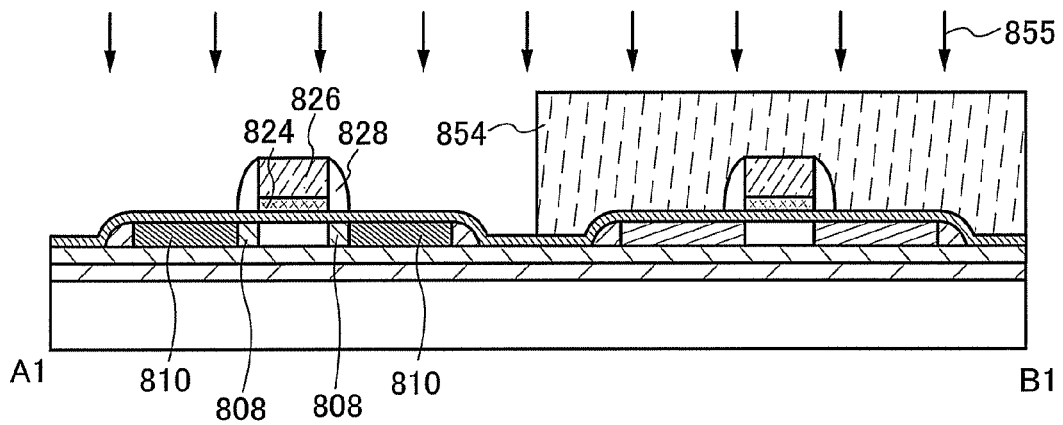
FIGS. 16A to 16C show an example of a manufacturing method of a semiconductor device according to the present invention.
Figure 16B:
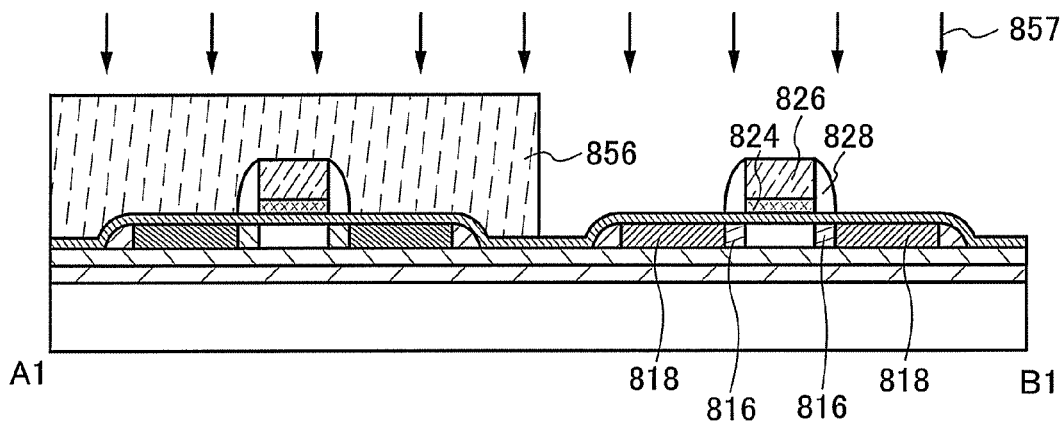
Figure 16C:
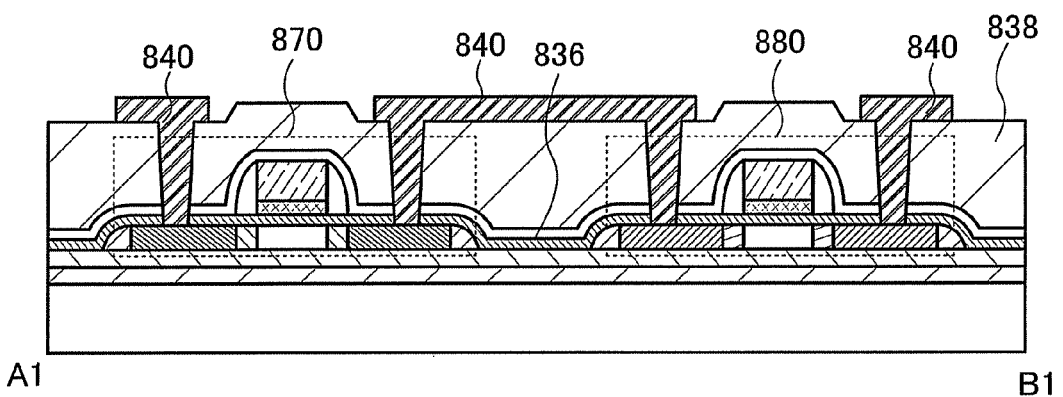
Figure 17D:
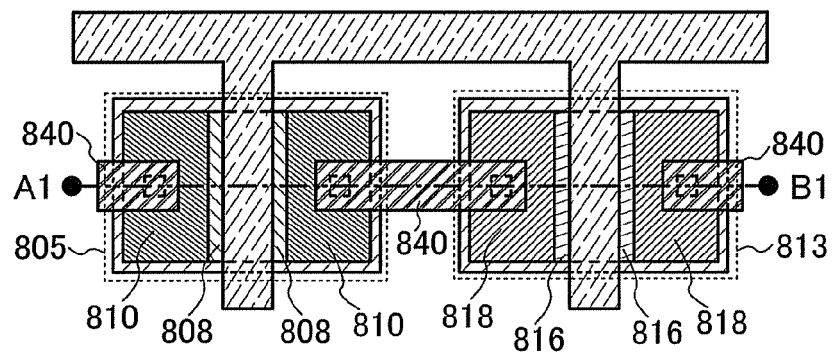

Next, the insulating layers 836 and 838 are formed so as to cover the insulating layer, the conductive layers, and the like provided over the support substrate 800, and the conductive layer 840 which is electrically connected to the high-concentration impurity regions 810 formed in the semiconductor layer 805 and the high-concentration impurity regions 818 formed in the semiconductor layer 813 is formed over the insulating layer 838 (see FIGS. 16C, 17D, and 19C). The conductive layer 840 functions as a source or drain electrode.

Each of the insulating layers 836 and 838 is formed by a CVD method, a sputtering method, a coating method, or the like, using an inorganic insulating material containing oxygen or nitrogen such as silicon oxide, silicon nitride, silicon oxynitride, silicon nitride oxide, or the like; an insulating material containing carbon such as DLC (Diamond-Like Carbon); an organic insulating material such as epoxy, polyimide, polyamide, polyvinyl phenol, benzocyclobutene, acrylic, or the like; or a siloxane material such as a siloxane resin. Note that the siloxane resin corresponds to a resin having Si—O—Si bonds. Siloxane includes a skeleton structure of a bond of silicon (Si) and oxygen (O). As a substituent, an organic group containing at least hydrogen (such as an alkyl group or an aryl group) is used. Alternatively, a fluoro group, or a fluoro group and an organic group containing at least hydrogen can be used as a substituent. Further, the insulating layers 836 and 838 may also be formed by forming an insulating layer with a CVD method or a sputtering method and then performing a high-density plasma treatment thereto in an oxygen atmosphere or a nitrogen atmosphere. Although a two-layer stacked structure of the insulating layers 836 and 838 is formed over the conductive layer 826 and the like here, the present invention may also employ a single layer structure or a stacked-layer structure including three or more layers.

The conductive layer 840 can be formed by a CVD method or a sputtering method, using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mg), neodymium (Nd), carbon (C), or silicon (Si), or an alloy material or a compound material containing the metal element, to have a single layer structure or a stacked-layer structure. As examples of an alloy material containing aluminum, an alloy material mainly containing aluminum and nickel and an alloy material mainly containing aluminum, nickel, and at least one of carbon and silicon can be given. The conductive layer 840 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum. Aluminum and aluminum silicon which have low resistance and are inexpensive are suitable for forming the conductive layer 840. Further, generation of a hillock of aluminum or aluminum silicon can be prevented when upper and lower barrier layers are provided.

Through the above, a semiconductor device including an N-channel transistor 870 formed using the semiconductor layer 805 and a P-channel transistor 880 formed using the semiconductor layer 813 can be manufactured. In this embodiment mode, the conductive layer 840 which is electrically connected to the high-concentration impurity regions 810 formed in the semiconductor layer 805 and the conductive layer 840 which is electrically connected to the high-concentration impurity regions 818 which are formed in the semiconductor layer 813 are electrically connected to each other so that a CMOS circuit including the N-channel transistor and the P-channel transistor is formed.

Note that although the example of manufacturing the CMOS circuit including two thin film transistors having different conductivity types is described in this embodiment mode, the present invention is not particularly limited. For example, an NMOS circuit including a plurality of N-channel thin film transistors, a PMOS circuit including a plurality of P-channel thin film transistors, or the like can also be manufactured. For forming such an NMOS circuit, a PMOS circuit, or the like, an impurity element to be added into a semiconductor layer may be selected as appropriate.

In a semiconductor device manufactured by applying the present invention, defects due to shape, characteristics, or the like of an end portion of a semiconductor layer can be prevented or reduced. Therefore, a highly reliable semiconductor device can be manufactured. Further, high-yield manufacturing of semiconductor devices can also be realized.

This embodiment mode can be combined with any other embodiment mode in this specification as appropriate.

Embodiment Mode 7

The semiconductor device according to the present invention can be applied to an integrated circuit such as a CPU (Central Processing Unit). In this embodiment mode, an example of a CPU to which the semiconductor device shown in FIGS. 13A to 13C is described below with reference to a drawing.

Figure 20:
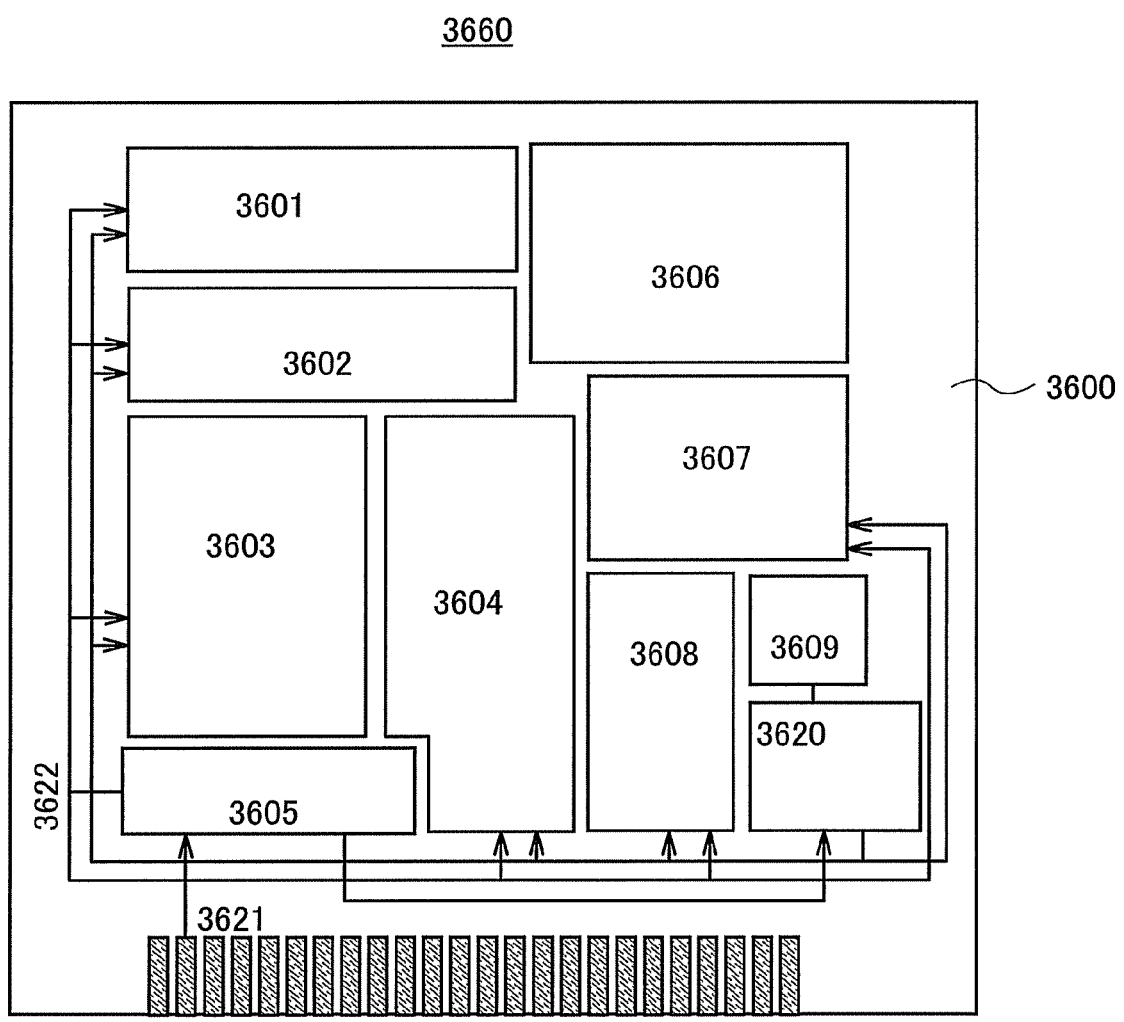
FIG. 20 is a block diagram showing an example of a semiconductor device according to the present invention.

A CPU 3660 shown in FIG. 20 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, an erasable programmable ROM 3609, and a ROM interface (ROM I/F) 3620, over a substrate 3600. The ROM 3609 and the ROM interface 3620 may also be provided over a different chip. Such various circuits for forming the CPU 3660 can be formed by using the thin film transistor formed by any manufacturing method described in Embodiment Modes 1 to 6, a CMOS circuit, an NMOS circuit, a PMOS circuit, or the like formed by combining the thin film transistors.

Note that the CPU 3660 shown in FIG. 20 is only an example where the structure is simplified, and an actual CPU may have various structures depending on the uses. Therefore, the structure of the CPU to which the present invention is applied is not limited to FIG. 20.

An instruction input to the CPU 3660 through the bus interface 3608 is input to the instruction decoder 3603 and decoded therein, and then, input to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Specifically, the ALU controller 3602 generates a signal for controlling the drive of the ALU 3601. While the CPU 3660 is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates a signal for controlling a timing of drive of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the clock signal CLK2 to the above various circuits.

Figure 21:
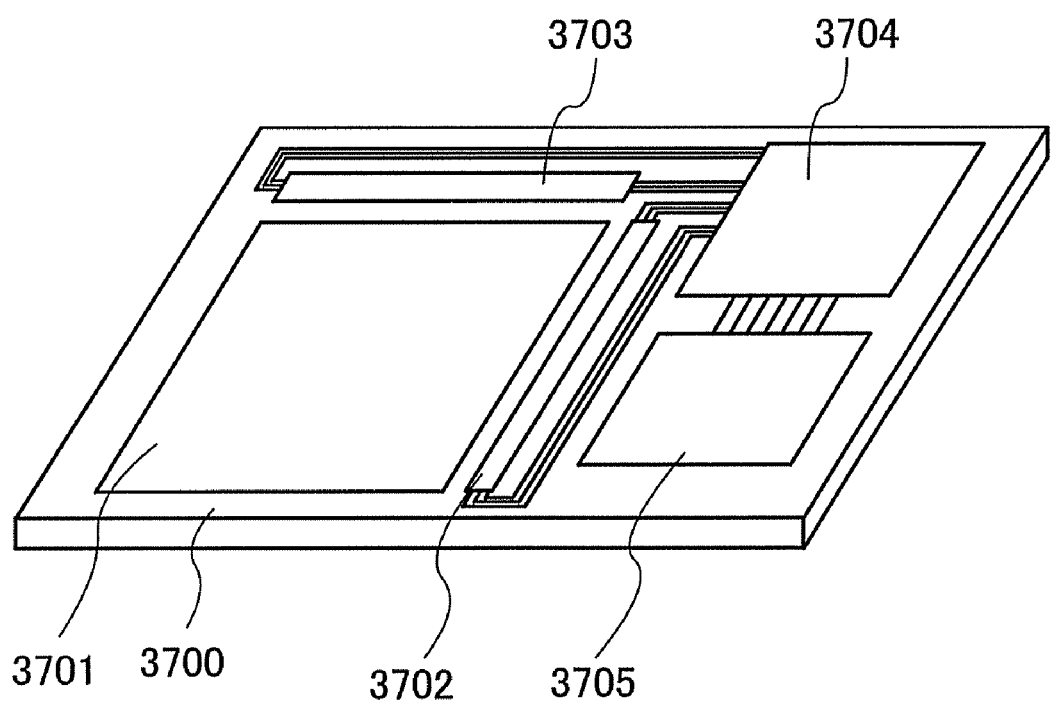
FIG. 21 is a perspective diagram showing an example of a semiconductor device according to the present invention.

FIG. 21 shows a display device, a so-called system-on-panel in which a pixel portion, a CPU and other circuits are formed over the same substrate. Over a substrate 3700, a pixel portion 3701, a scan line driver circuit 3702 for selecting a pixel included in the pixel portion 3701, and a signal line driver circuit 3703 for supplying a video signal to the selected pixel are provided. A CPU 3704 is connected to other circuits, for example, a control circuit 3705 by wirings which are led from the scan line driver circuit 3702 and the signal line driver circuit 3703. It is to be noted that the control circuit includes an interface. A connecting portion with an FPC terminal is provided at an end portion of the substrate so as to interact with external signals.

As additional circuits, a video signal processing circuit, a power source circuit, a gray scale power source circuit, a video RAM, a memory (DRAM, SRAM, PROM) and the like can be provided over the substrate in addition to the control circuit 3705. Alternatively, these circuits may be formed of an IC chip and mounted over the substrate. Further, the scan line driver circuit 3702 and the signal line driver circuit 3703 are not necessarily required to be formed over the same substrate. For example, only the scan line driver circuit 3702 may be formed over the same substrate as the pixel portion 3701 while the signal line driver circuit 3703 may be formed of an IC chip and mounted.

Note that although the example in which the semiconductor device according to the present invention is applied to a CPU is described in this embodiment mode, the present invention is not particularly limited. For example, the semiconductor according to the present invention can be applied to a pixel portion, a driver controlling portion, or and the like of a display device provided with an organic light emitting element, an inorganic light emitting element, a liquid crystal element, or the like. In addition, by applying the present invention, the following can also be manufactured; a camera such as a digital camera, an audio reproducing device such as a car audio system, a laptop computer, a game machine, a portable information terminal (e.g., a cellular phone or a mobile game machine), an image reproducing device provided with a recording medium such as a home-use game machine, and the like.

Further, in the semiconductor device to which the present invention is applied, a defect due to shape, characteristics, or the like of an end portion of a semiconductor layer can be reduced. In particular, when the semiconductor device according to the present invention is applied to a CPU or the like, low power consumption can be realized. In addition, high-yield manufacturing of highly reliable semiconductor devices can be realized.

Embodiment Mode 8

In this embodiment mode, one example of a usage mode of the semiconductor device described in the above embodiment modes is described. Specifically, an application example of a semiconductor device to/from which data can be input/output without contact is described with reference to drawings. The semiconductor device to/from which data can be input/output without contact is also called an RFID tag, an ID tag, an IC tag, an IC chip, an RF tag, a wireless tag, an electronic tag, or a wireless chip.

One example of an upper-surface structure of a semiconductor device described in this embodiment mode is described with reference to FIG. 22A. A semiconductor device 2180 shown in FIGS. 22A to 22C includes a thin film integrated circuit 2131 including a plurality of elements such as thin film transistors for forming a memory portion and a logic portion, and a conductive layer 2132 that functions as an antenna. The conductive layer 2132 that functions as an antenna is electrically connected to the thin film integrated circuit 2131. The thin film transistor according to the present invention described in Embodiment Modes 1 to 6 can be applied to the thin film integrated circuit 2131.

Figure 22A:
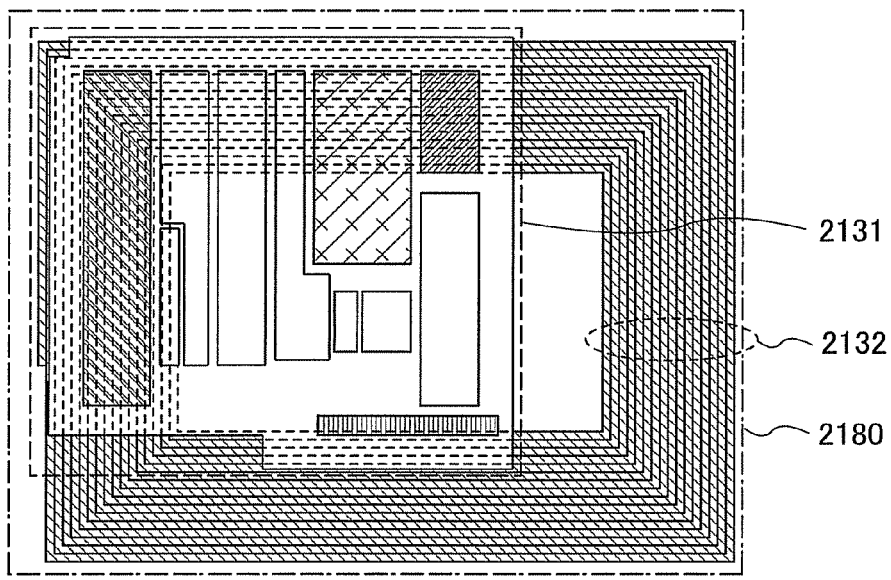
FIGS. 22A to 22C are a top view diagram and cross-sectional diagrams showing an example of a semiconductor device according to the present invention.
Figure 22B:
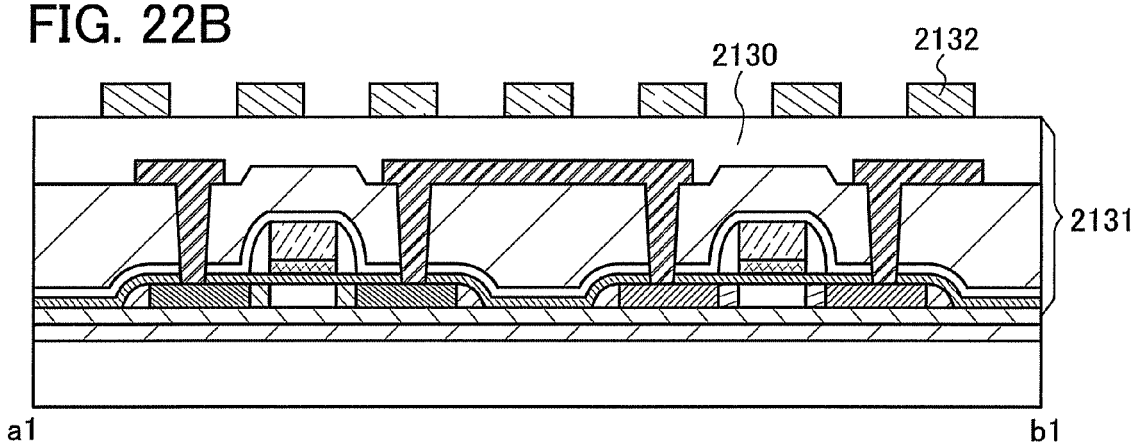
Figure 22C:
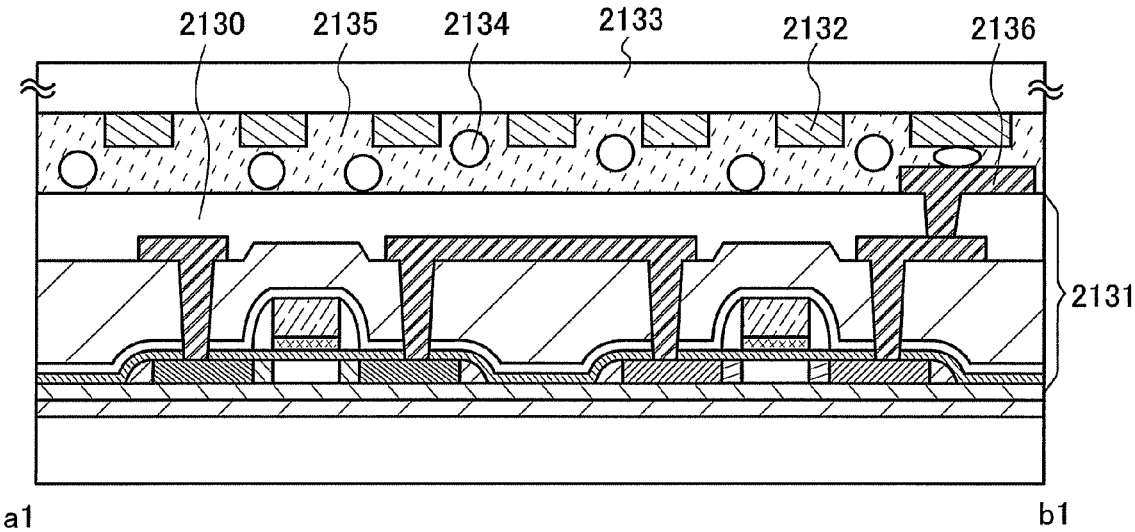

Pattern diagrams of a cross-sectional surface of FIG. 22A are FIGS. 22B and 22C. The conductive layer 2132 that functions as an antenna is provided above the elements for forming the memory portion and the logic portion; for example, the conductive layer 2132 that functions as an antenna can be provided above the structure described in Embodiment Mode 6 with an insulating layer 2130 interposed therebetween (see FIG. 22B). Alternatively, the conductive layer 2132 that functions as an antenna may be provided using a substrate 2133 and then the substrate 2133 and the thin film integrated circuit 2131 may be attached to each other so as to interpose the conductive layer 2132 (see FIG. 22C). Here, a conductive layer 2136 provided over the insulating layer 2130 and the conductive layer 2132 that functions as an antenna are electrically connected to each other with a conducting particle 2134 contained in an adhesive resin 2135.

Note that although the example in which the conductive layer 2132 that functions as an antenna is provided in the shape of a coil and either an electromagnetic induction method or an electromagnetic coupling method is employed is described in this embodiment mode, the semiconductor device of the present invention is not limited thereto, and a microwave method may also be employed. In the case of a microwave method, the shape of the conductive layer 2132 that functions as an antenna may be decided as appropriate depending on the wavelength of an electromagnetic wave.

Figure 23A:
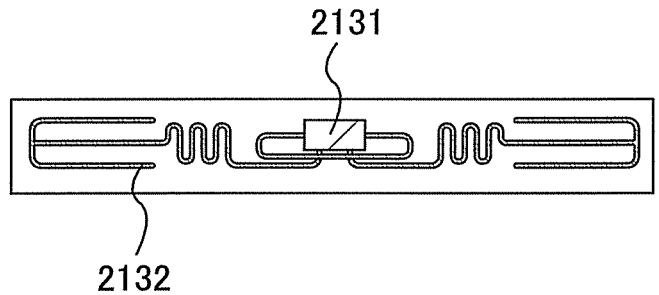
FIGS. 23A to 23D each describe an antenna that can be applied to a semiconductor device according to the present invention.
Figure 23B:
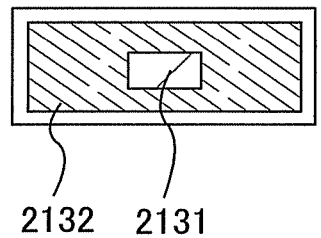
Figure 23C:
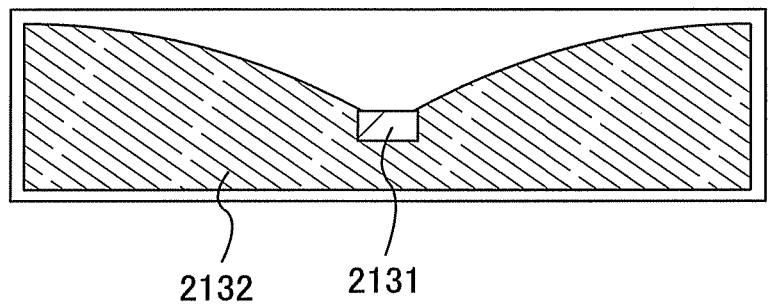
Figure 23D:
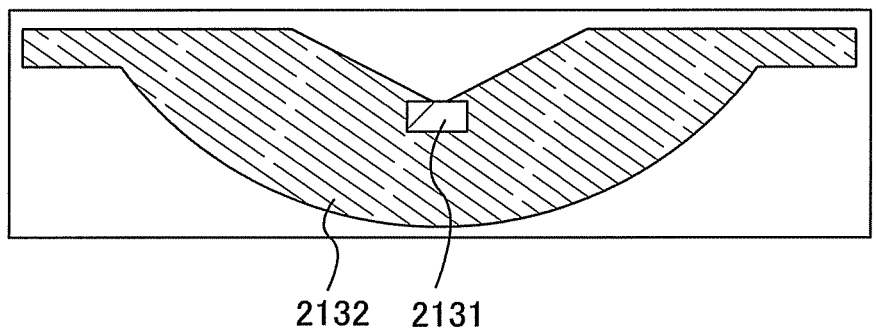

For example, when the microwave method (e.g., with an UHF band (in the range of 860 MHz to 960 MHz), a frequency band of 2.45 GHz, or the like) is employed as the signal transmission method of the semiconductor device 2180, the shape such as length of the conductive layer that functions as an antenna may be set as appropriate in consideration of the wavelength of an electromagnetic wave used in sending a signal. For example, the conductive layer that functions as an antenna can be formed in the shape of a line (e.g., a dipole antenna (see FIG. 23A)), in the flat shape (e.g., a patch antenna (see FIG. 23B)), in the shape of a ribbon (see FIGS. 23C and 23D), or the like. Further, the shape of the conductive layer 2132 that functions as an antenna is not limited to a line, and the conductive layer in the shape of a curved line, in an S-shape, or in a shape combining them may also be provided in consideration of the wavelength of the electromagnetic wave.

The conductive layer 2132 that functions as an antenna is formed of a conductive material by a CVD method, a sputtering method, a printing method such as a screen printing method or a gravure printing method, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material mainly including the element, and a single layer structure or a stacked-layer structure may be employed.

For example, when the conductive layer 2132 that functions as an antenna is formed by a screen printing method, it can be provided by selective printing with a conductive paste in which conductive particles with a grain diameter of several nm to several tens of μm are dissolved or dispersed in an organic resin. As the conductive particle, at least one of metal particles selected from silver (Ag), gold (Ag), copper (Cu), nickel (Ni), platinum (Pt), palladium (Pd), tantalum (Ta), molybdenum (Mo), titanium (Ti), and the like; fine particles of silver halide; or dispersive nanoparticles can be used. In addition, as the organic resin included in the conductive paste, at least one of organic resins which function as a binder, a solvent, a dispersing agent, and a coating material of metal particles can be used. Typically, an organic resin such as an epoxy resin and a silicone resin can be given as examples. Further, in forming the conductive layer, it is preferable to bake the conductive paste after being provided. For example, in the case of using fine particles (e.g., with a grain diameter of 1 nm or more and 100 nm or less) mainly containing silver as a material of the conductive paste, the conductive layer can be formed by baking the conductive paste at a temperature in the range of 150° C. to 300° C. to be hardened. Alternatively, fine particles mainly containing solder or lead-flee solder may be used. In this case, fine particles with a grain diameter of 20 μm or less are preferably used. Solder and lead-free solder have the advantage of low cost.

In this manner, low power consumption can be achieved when the present invention is applied to a semiconductor device to/from which data can be input/output without contact, which is particularly effective in the case of a small semiconductor device.

Next, an operation example of the semiconductor device according to this embodiment mode is described.

Figure 24A:
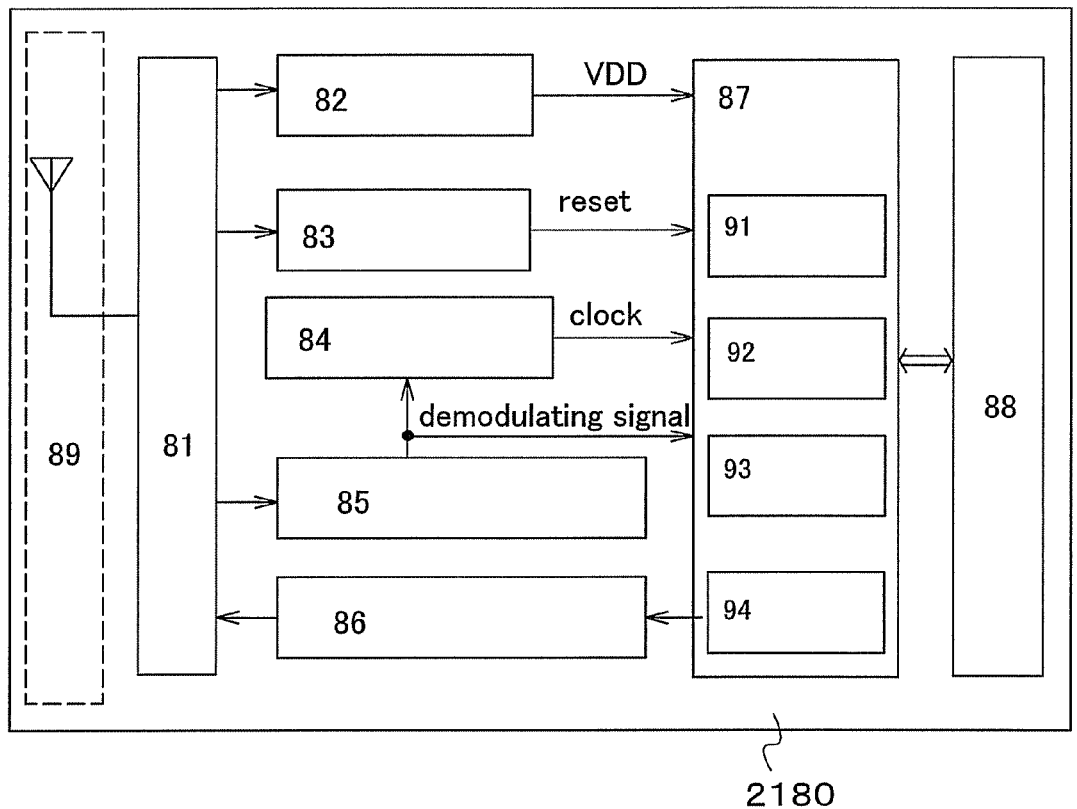
FIGS. 24A to 24C are a block diagram showing an example of a semiconductor device according to the present invention and diagrams showing examples of usage modes thereof.

The semiconductor device 2180 has a function of exchanging data without contact, and includes a high-frequency circuit 81, a power source circuit 82, a reset circuit 83, a clock generating circuit 84, a data demodulating circuit 85, a data modulating circuit 86, a controlling circuit 87 for controlling another circuit, a memory circuit 88, and an antenna 89 (see FIG. 24A). The high-frequency circuit 81 receives a signal from the antenna 89 and then outputs a signal received from the data modulating circuit 86, through the antenna 89. The power source circuit 82 generates a power source potential from a received signal. The reset circuit 83 generates a reset signal. The clock generating circuit 84 generates various clock signals based on a received signal input from the antenna 89. The data demodulating circuit 85 demodulates a received signal and outputs to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code. In FIG. 24A, in addition to the controlling circuit 87, the high-frequency circuit 81 and the power source circuit 82 which are analog circuits are included.

Next, one example of an operation of the aforementioned semiconductor device is described. First, a wireless signal is received by the antenna 89 and then sent to the power source circuit 82 through the high-frequency circuit 81, so that a high power source potential (hereinafter referred to as VDD) is generated. VDD is supplied to each circuit in the semiconductor device 2180. A signal sent to the data demodulating circuit 85 through the high-frequency circuit 81 is demodulated (hereinafter this signal is called a demodulated signal). Moreover, signals passed through the reset circuit 83 and the clock generating circuit 84 from the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is output. The output information of the semiconductor device is encoded through the output unit circuit 94. Further, the encoded information of the semiconductor device 2180 passes through the data modulating circuit 86 and then is sent by the antenna 89 while being superimposed on a wireless signal. Note that a low power source potential (hereinafter called VSS) is common in the plurality of circuits included in the semiconductor device 2180 and GND can be used as VSS.

In this manner, by sending a signal from a reader/writer to the semiconductor device 2180 and receiving a signal sent from the semiconductor device 2180 by the reader/writer, data of the semiconductor device can be read.

Further, in the semiconductor device 2180, power source voltage may be supplied to each circuit by electromagnetic waves without providing a power supply (a battery), or a power supply (battery) may be provided so that power supply voltage is supplied to each circuit by both electromagnetic waves and the power supply (battery).

Figure 24B:
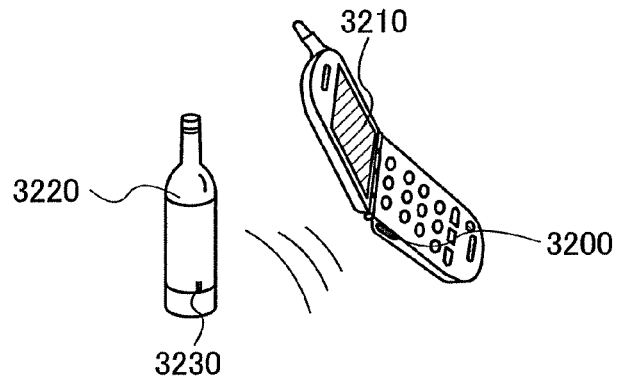
Figure 24C:
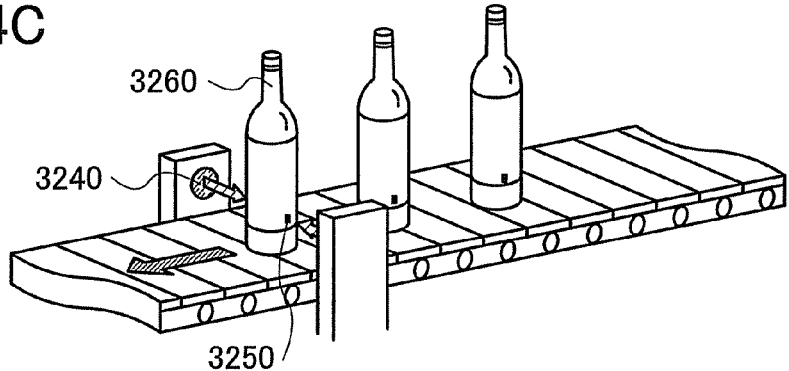
Figure 25A:
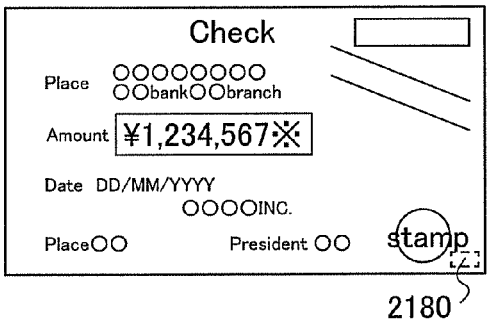
FIGS. 25A to 25H each show an example of a usage mode of a semiconductor device according to the present invention.
Figure 25B:
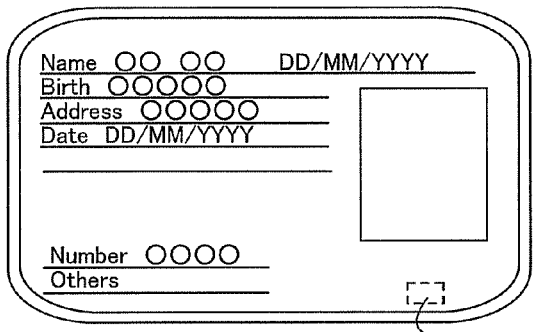
Figure 25C:
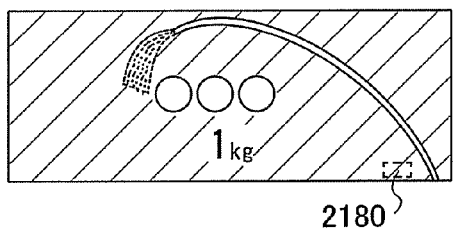
Figure 25D:
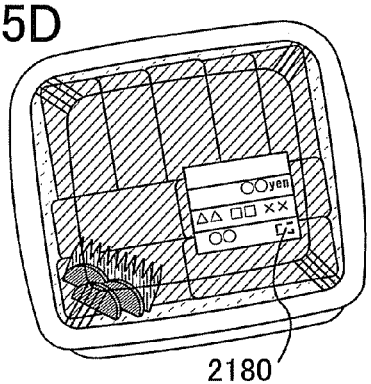
Figure 25E:
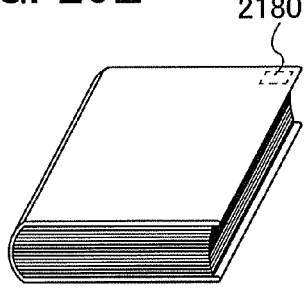
Figure 25F:
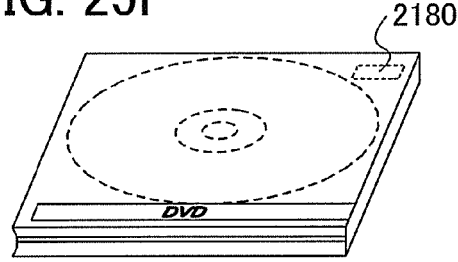
Figure 25G:
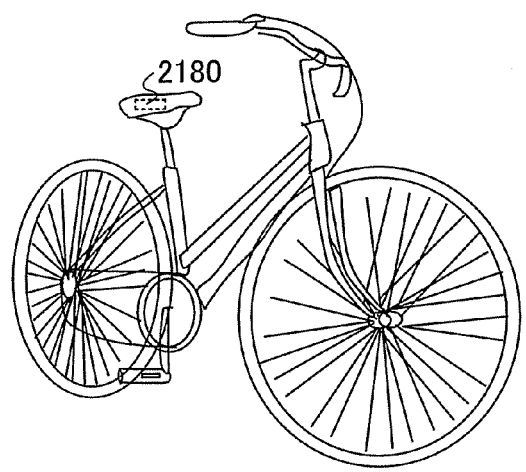
Figure 25H:

Next, one example of usage mode of a semiconductor device to/from which data can be input/output without contact is described. A side surface of a mobile terminal including a display portion 3210 is provided with a reader/writer 3200, and a side surface of a product 3220 is provided with a semiconductor device 3230 (see FIG. 24B). When the reader/writer 3200 is held over the semiconductor device 3230 included in the product 3220, the display portion 3210 displays information on the product, such as a row material, a place of origin, an inspection result for each production step, a history of distribution process, description of the product, or the like. Further, when a product 3260 is transferred by a conveyer belt, the product 3260 can be inspected by using a reader/writer 3240 and a semiconductor device 3250 provided for the product 3260 (see FIG. 24C). As the semiconductor devices 3230 and 3250, the aforementioned semiconductor device 2180 can be applied. In this manner, by using the semiconductor device according to the present invention in the system, information can be obtained easily and high performance and a high added value are achieved. Further, since the semiconductor device according to the present invention can realize low power consumption, a semiconductor device provided for a product can be downsized.

Note that an applicable range of the semiconductor device according to the present invention is wide in addition to the above, and the semiconductor device can be applied to any product as long as it clarifies information of an object, such as the history thereof, without contact and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 25A to 25H.

The bills and coins are money distributed to the market, and include one valid in a certain area (a cash voucher), memorial coins, and the like. The securities refer to checks, certificates, promissory notes, and the like (see FIG. 25A). The certificates refer to driver's licenses, certificates of residence, and the like (see FIG. 25B). The bearer bonds refer to stamps, rice coupons, various gift certificates, and the like (see FIG. 25C). The packing containers refer to wrapping paper for food containers and the like, plastic bottles, and the like (see FIG. 25D). The books refer to hardbacks, paperbacks, and the like (see FIG. 25E). The recording media refer to DVD software, video tapes, and the like (see FIG. 25F). The vehicles refer to wheeled vehicles such as bicycles, ships, and the like (see FIG. 25G). The personal belongings refer to bags, glasses, and the like (see FIG. 25H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by providing the semiconductor device 2180 for the bills, the coins, the securities, the certificates, the bearer bonds, or the like. Further, the efficiency of an inspection system, a system used in a rental shop, or the like can be improved by providing the semiconductor device 2180 for the packing containers, the books, the recording media, the personal belongings, the food, the commodities, the electronic devices, or the like. Forgery or theft can be prevented by providing the semiconductor device 2180 on the vehicles, the health products, the medicine, or the like; in the case of the medicine, medicine can be prevented from being taken mistakenly. The semiconductor device 2180 can be provided by being attached to the surface or being embedded in the object. For example, in the case of a book, the semiconductor device 2180 may be embedded in the paper; and in the case of a package made from an organic resin, the semiconductor device 2180 may be embedded in the organic resin.

As described above, the efficiency of an inspection system, a system used in a rental shop, or the like can be improved by providing the semiconductor device for the packing containers, the recording media, the personal belonging, the food, the clothing, the commodities, the electronic devices, or the like. Further, by providing the semiconductor device for the vehicles, forgery or theft of the vehicles can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Note that this embodiment mode can be freely combined with other embodiment modes.

Embodiment 1

In this embodiment, a characteristic of a semiconductor device manufactured by applying the present invention is described. Here, a TEG of a sample A manufactured by applying the present invention and a TEG of a sample B manufactured as a comparative example are measured and compared.

Figure 26:
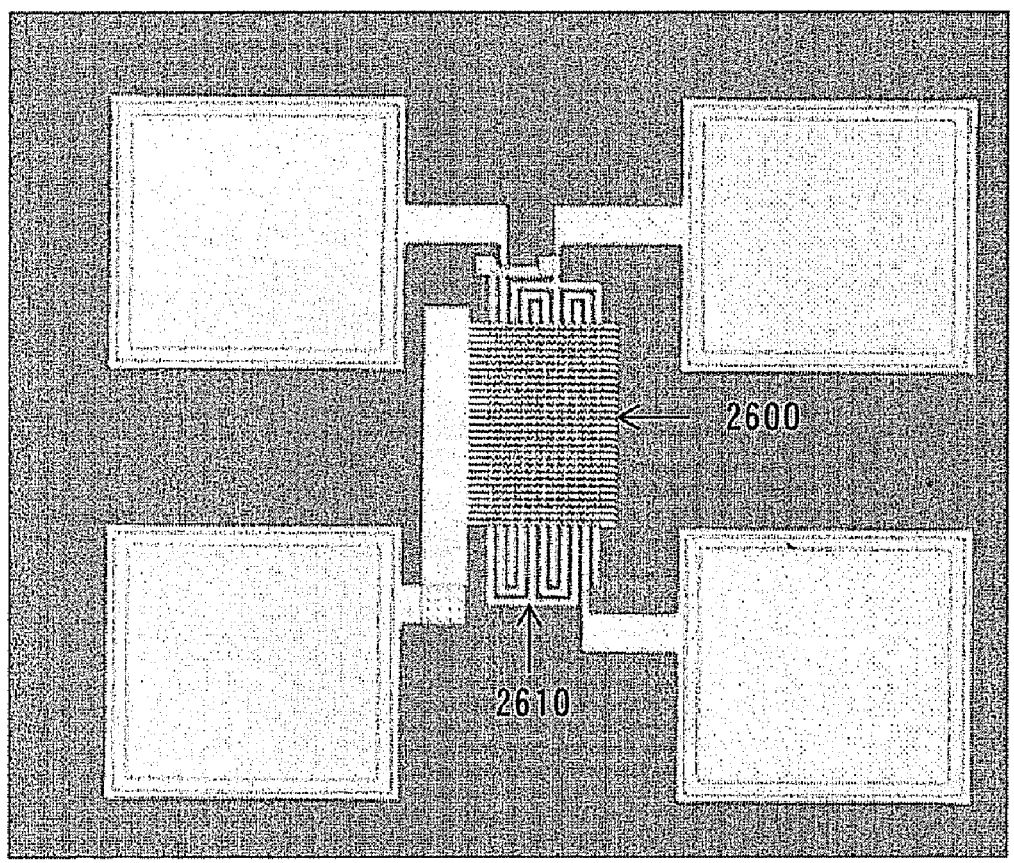
FIG. 26 shows a micrograph and an I-V characteristic of Embodiment 1.

FIG. 26 shows a top micrograph of a TEG used in the measurement. For the TEG shown in FIG. 26, a silicon layer 2600 is provided in a comb shape over a glass substrate, and a conductive layer 2610 is provided in a spiral shape over the silicon layer. An insulating layer is provided between the silicon layer provided in a comb shape and the conductive layer provided in a spiral shape.

For sample A, a silicon nitride oxide layer with a thickness of 50 nm, a silicon oxynitride layer with a thickness of 100 nm, and an amorphous silicon layer were formed successively over a glass substrate by a CVD method. Then, after the amorphous silicon layer was crystallized to obtain a crystalline silicon layer with a thickness of 66 nm, the crystalline silicon layer was selectively etched to have a comb shape. After a silicon oxynitride layer was formed so as to cover over the crystalline silicon layer with a comb shape, etching was performed mainly in a vertical direction to selectively leave the silicon oxynitride layer over a side surface of the crystalline silicon layer, and a silicon oxynitride layer with a thickness of 20 nm was formed as a gate insulating layer over the silicon layer for which the silicon oxynitride layer is formed over the side surface. Subsequently, after forming a stacked-layer structure of a tantalum nitride layer with a thickness of 30 nm and a tungsten layer with a thickness of 370 nm as a conductive layer, the conductive layer was selectively etched to have a spiral shape.

For sample B, a silicon oxynitride layer was formed as a gate insulating layer over an entire surface of a silicon layer without selectively forming a silicon oxynitride layer over a side surface of the silicon layer. The rest of the structure is to be the same as that of sample A.

Figure 27:
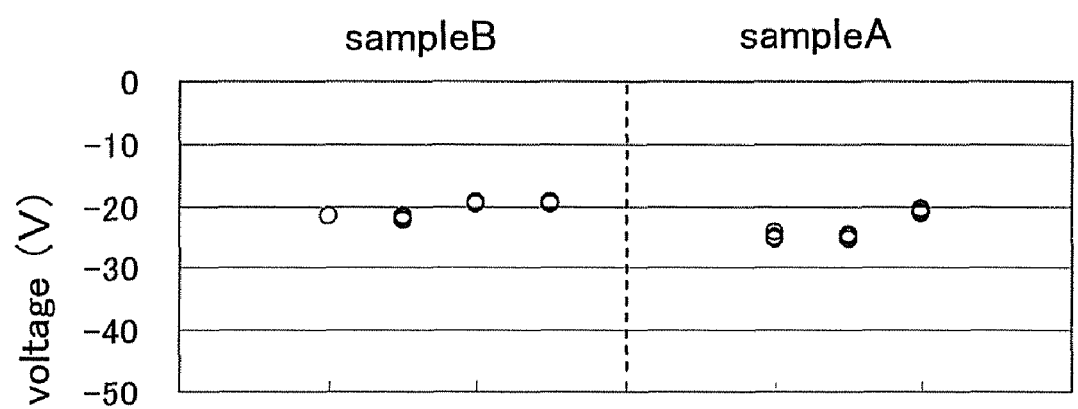
FIG. 27 shows a withstand voltage characteristic of Embodiment 1.

The current-voltage (I-V) characteristics were measured for sample A and sample B. In the measurement, three substrates were used for sample A, four substrates were used for sample B, and the I-V characteristics were measured at four points in each substrate. Next, I-V characteristics with voltage (V) represented by a horizontal axis and current (A) represented by a vertical axis were measured, and a spot where the current value in the I-V characteristic jumped was considered to be the current value at which dielectric breakdown occurred between the silicon layer and the conductive layer. Then, for sample A and sample B, voltage value at which dielectric breakdown occurs at the four points of measurement in each substrate was plotted to confirm the withstand voltage characteristic. Here, FIG. 27 shows a scatter diagram showing the withstand characteristics. From FIG. 27, it can be observed that an absolute value of the voltage values plotted is larger for sample A. Accordingly, it was confirmed that sample A had a higher withstand voltage characteristic, and that the structure of the present invention is effective in preventing a short circuit between a semiconductor layer and a gate electrode layer.

This application is based on Japanese Patent Application serial no. 2006-327833 filed with Japan Patent Office on Dec. 5, 2006, the entire contents of which are hereby incorporated by reference.

What is claimed is:

1. A semiconductor device comprising:
    an island-shaped semiconductor layer provided over a substrate;
    a gate insulating layer including:
    a first insulating layer in direct contact with a top surface of the island-shaped semiconductor layer; and
    a second insulating layer in direct contact with a side surface of the island-shaped semiconductor layer; and
    a gate electrode provided over the island-shaped semiconductor layer with the gate insulating layer interposed therebetween and to cross over the island-shaped semiconductor layer,
    wherein the second insulating layer has a lower dielectric constant than the first insulating layer; and
    wherein the second insulating layer is thicker than the island-shaped semiconductor layer and not in contact with the top surface of the island-shaped semiconductor layer.

2. The semiconductor device according to claim 1, wherein the island-shaped semiconductor layer is a polycrystalline semiconductor layer.

3. The semiconductor device according to claim 1, wherein the gate insulating layer provided in contact with the top surface and the side surface of the island-shaped semiconductor layer includes:
    a first insulating layer provided in contact with the top surface of the island-shaped semiconductor layer; and
    a second insulating layer and a third insulating layer provided in contact with the side surface and another side surface of the island-shaped semiconductor layer, respectively.

4. The semiconductor device according to claim 1, wherein a taper angle of an end portion of the island-shaped semiconductor layer is 45° or more and less than 95°.

5. The semiconductor device according to claim 1, wherein the second insulating layer in direct contact with the side surface of the island-shaped semiconductor layer comprises one of SiOF, SiOC, DLC and porous silica.

6. A semiconductor device comprising:
    an island-shaped semiconductor layer provided over a substrate;
    a gate insulating layer in contact with a top surface and a side surface of the island-shaped semiconductor layer; and
    a gate electrode over the island-shaped semiconductor layer with the gate insulating layer interposed therebetween and crossing over the island-shaped semiconductor layer,
    wherein the gate insulating layer has a lower dielectric constant in a region that is in direct contact with the side surface of the island-shaped semiconductor layer than in a region that is comprised between the island-shaped semiconductor layer and the gate electrode; and
    wherein the gate insulating layer is thicker than the island-shaped semiconductor layer in the region in direct contact with the side surface of the island-shaped semiconductor layer and not in contact with the top surface of the island-shaped semiconductor layer.

7. The semiconductor device according to claim 6, wherein the island-shaped semiconductor layer is a polycrystalline semiconductor layer.

8. The semiconductor device according to claim 6,
    wherein the gate insulating layer provided in contact with the top surface and the side surface of the island-shaped semiconductor layer includes:
    a first insulating layer provided to be in contact with the top surface of the island-shaped semiconductor layer; and
    a second insulating layer provided to be in contact with the side surface of the island-shaped semiconductor layer.

9. The semiconductor device according to claim 6, wherein the gate insulating layer provided in contact with the top surface and the side surface of the island-shaped semiconductor layer includes:
    a first insulating layer provided in contact with the top surface of the island-shaped semiconductor layer; and
    a second insulating layer and a third insulating layer provided in contact with the side surface and another side surface of the island-shaped semiconductor layer, respectively.

10. The semiconductor device according to claim 6, wherein a taper angle of an end portion of the island-shaped semiconductor layer is 45° or more and less than 95°.

11. The semiconductor device according to claim 6,
    wherein the region of the gate insulating layer in direct contact with the side surface of the island-shaped semiconductor layer comprises one of SiOF, SiOC, DLC and porous silica.

12. A semiconductor device comprising:
    an island-shaped semiconductor layer provided over a substrate;
    a gate insulating layer including:
    a first insulating layer in direct contact with a top surface of the island-shaped semiconductor layer; and
    a second insulating layer in direct contact with a side surface of the island-shaped semiconductor layer; and
    a gate electrode provided over the island-shaped semiconductor layer with the gate insulating layer interposed therebetween and to cross over the island-shaped semiconductor layer,
    wherein the second insulating layer is thicker and has a lower dielectric constant than the first insulating layer; and
    wherein the second insulating layer is thicker than the island-shaped semiconductor layer and not in contact with the top surface of the island-shaped semiconductor layer.

13. The semiconductor device according to claim 12, wherein the island-shaped semiconductor layer is a polycrystalline semiconductor layer.

14. The semiconductor device according to claim 12, wherein in the gate insulating layer, given that a thickness in contact with the top surface of the island-shaped semiconductor layer is t1 and a thickness in the region which is in contact with the side surface of the island-shaped semiconductor layer is t2, t1<t2≦3t1 is satisfied.

15. The semiconductor device according to claim 12, wherein the gate insulating layer provided in contact with the top surface and the side surface of the island-shaped semiconductor layer includes:
   a first insulating layer provided in contact with the top surface of the island-shaped semiconductor layer; and
   a second insulating layer and a third insulating layer provided in contact with the side surface and another side surface of the island-shaped semiconductor layer, respectively.

16. The semiconductor device according to claim 12, wherein a taper angle of an end portion of the island-shaped semiconductor layer is 45° or more and less than 95°.

17. The semiconductor device according to claim 12, wherein the second insulating layer in direct contact with the side surface of the island-shaped semiconductor layer comprises one of SiOF, SiOC, DLC and porous silica.

18. A semiconductor device comprising:
   an island-shaped semiconductor layer provided over a substrate;
   a gate insulating layer in contact with a top surface and a side surface of the island-shaped semiconductor layer; and
   a gate electrode over the island-shaped semiconductor layer with the gate insulating layer interposed therebetween and crossing over the island-shaped semiconductor layer,
   wherein the gate insulating layer is thicker and has a lower dielectric constant in a region that is in direct contact with the side surface of the island-shaped semiconductor layer than in a region that is comprised between the island-shaped semiconductor layer and the gate electrode; and
   wherein the gate insulating layer is thicker than the island-shaped semiconductor layer in the region in direct contact with the side surface of the island-shaped semiconductor layer and not in contact with the top surface of the island-shaped semiconductor layer.

19. The semiconductor device according to claim 18, wherein the island-shaped semiconductor layer is a polycrystalline semiconductor layer.

20. The semiconductor device according to claim 18, wherein in the gate insulating layer, given that a thickness in contact with the top surface of the island-shaped semiconductor layer is t1 and a thickness in the region which is in contact with the side surface of the island-shaped semiconductor layer is t2, t1<t2≦3t1 is satisfied.

21. The semiconductor device according to claim 18, wherein the gate insulating layer provided in contact with the top surface and the side surface of the island-shaped semiconductor layer includes:
   a first insulating layer provided to be in contact with the top surface of the island-shaped semiconductor layer; and
   a second insulating layer provided to be in contact with the side surface of the island-shaped semiconductor layer.

22. The semiconductor device according to claim 18, wherein the gate insulating layer provided in contact with the top surface and the side surface of the island-shaped semiconductor layer includes:
   a first insulating layer provided in contact with the top surface of the island-shaped semiconductor layer; and
   a second insulating layer and a third insulating layer provided in contact with the side surface and another side surface of the island-shaped semiconductor layer, respectively.

23. The semiconductor device according to claim 18, wherein a taper angle of an end portion of the island-shaped semiconductor layer is 45° or more and less than 95°.

24. The semiconductor device according to claim 18, wherein the region of the gate insulating layer in direct contact with the side surface of the island-shaped semiconductor layer comprises one of SiOF, SiOC, DLC and porous silica.

* * * * *